US012329027B2

(12) United States Patent
Han et al.

(10) Patent No.: US 12,329,027 B2
(45) Date of Patent: Jun. 10, 2025

(54) LIGHT-EMITTING ELEMENT, AND AMINE COMPOUND FOR THE SAME

(71) Applicant: Samsung Display Co., Ltd., Yongin-si (KR)

(72) Inventors: Sanghyun Han, Hwaseong-si (KR); Dongjun Kim, Suwon-si (KR); Minji Kim, Hwaseong-si (KR); Hankyu Pak, Suwon-si (KR); Eunjae Jeong, Hwaseong-si (KR); Sohee Jo, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 641 days.

(21) Appl. No.: 17/537,787

(22) Filed: Nov. 30, 2021

(65) Prior Publication Data

US 2022/0302390 A1 Sep. 22, 2022

(30) Foreign Application Priority Data

Mar. 11, 2021 (KR) ........................ 10-2021-0031826

(51) Int. Cl.
*H10K 50/15* (2023.01)
*H10K 50/17* (2023.01)
(Continued)

(52) U.S. Cl.
CPC ....... *H10K 85/6572* (2023.02); *H10K 85/633* (2023.02); *H10K 50/15* (2023.02); *H10K 50/17* (2023.02); *H10K 50/18* (2023.02)

(58) Field of Classification Search
CPC ............. H10K 85/636; H10K 85/6572; H10K 85/633; H10K 85/615; H10K 85/6574;
(Continued)

(56) References Cited

U.S. PATENT DOCUMENTS

| | | | |
|---|---|---|---|
| 4,720,432 | A | 1/1988 | VanSlyke et al. |
| 5,061,569 | A | 10/1991 | VanSlyke et al. |

(Continued)

FOREIGN PATENT DOCUMENTS

| | | |
|---|---|---|
| JP | 11-144873 | 5/1999 |
| JP | 2000-302756 | 10/2000 |

(Continued)

*Primary Examiner* — Moazzam Hossain
(74) *Attorney, Agent, or Firm* — KILE PARK REED & HOUTTEMAN PLLC

(57) ABSTRACT

Provided is a light-emitting element including a first electrode, a second electrode facing the first electrode, and at least one functional layer disposed between the first electrode and the second electrode and including an amine compound represented by Formula 1. The light-emitting element may exhibit excellent light-emitting efficiency and improved service life characteristics.

[Formula 1]

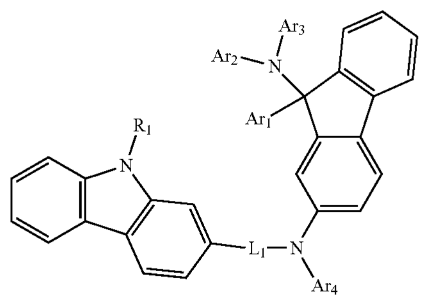

11 Claims, 6 Drawing Sheets

(51) Int. Cl.
*H10K 50/18* (2023.01)
*H10K 85/60* (2023.01)

(58) Field of Classification Search
CPC .... H10K 85/6576; H10K 50/15; H10K 50/17; H10K 50/18; H10K 50/181; C07D 209/88; C07D 401/04; C07D 405/12; C07D 409/12
See application file for complete search history.

(56) References Cited

U.S. PATENT DOCUMENTS

| | | | | |
|---|---|---|---|---|
| 6,242,115 | B1 | 6/2001 | Thomson et al. | |
| 8,021,764 | B2 | 9/2011 | Hwang et al. | |
| 10,505,121 | B2 | 12/2019 | Song et al. | |
| 2014/0256888 | A1* | 9/2014 | Ishikawa | C08G 64/186 525/464 |
| 2017/0244048 | A1* | 8/2017 | Kim | H10K 85/30 |
| 2019/0334096 | A1 | 10/2019 | Kim et al. | |

FOREIGN PATENT DOCUMENTS

| | | | |
|---|---|---|---|
| JP | 2003-133075 | 5/2003 | |
| JP | 2004-79265 | 3/2004 | |
| JP | 2006-151979 | 6/2006 | |
| KR | 2018008833 A * | 1/2018 | C07D 209/82 |
| KR | 10-1857632 | 5/2018 | |
| KR | 10-2019-0105836 | 9/2019 | |
| KR | 10-2019-0125560 | 11/2019 | |
| KR | 10-2020-0043947 | 4/2020 | |

* cited by examiner

LIGHT-EMITTING ELEMENT, AND AMINE COMPOUND FOR THE SAME

CROSS-REFERENCE TO RELATED APPLICATION(S)

This application claims priority to and benefits of Korean Patent Application No. 10-2021-0031826 under 35 U.S.C. § 119, filed on Mar. 11, 2021 in the Korean Intellectual Property Office, the entire contents of which are incorporated herein by reference.

BACKGROUND

1. Technical Field

The disclosure herein relates to an amine compound used as a hole transport material, and a light-emitting element including the same.

2. Description of the Related Art

Active development continues for an organic electroluminescence display device as an image display device. The organic electroluminescence display device is a so-called self-luminescent light-emitting element in which holes and electrons respectively injected from a first electrode and a second electrode recombine in an emission layer so that a light-emitting material in the emission layer emits light, thereby implementing display.

In the application of a light-emitting element to a display device, the light-emitting element requires a high light-emitting efficiency and a long service life, and continuous development is needed for a material for a light-emitting element which is capable of stably achieving such requirements.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light-emitting element exhibiting excellent light-emitting efficiency and long service life characteristics.

The disclosure also provides an amine compound which is a material for a light-emitting element having a high efficiency and a long service life characteristics.

An embodiment provides a light-emitting element which may include a first electrode, a second electrode facing the first electrode, and at least one functional layer disposed between the first electrode and the second electrode, the at least one functional layer including an amine compound represented by Formula 1.

[Formula 1]

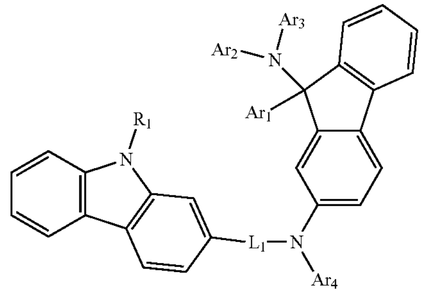

In Formula 1, $L_1$ may be a direct linkage, a substituted or unsubstituted arylene group having 6 to 30 ring-forming carbon atoms, or a substituted or unsubstituted heteroarylene group having 2 to 30 ring-forming carbon atoms, $R_1$ may be a substituted or unsubstituted aryl group having 6 to 30 ring-forming carbon atoms, and $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In an embodiment, $Ar_2$ and $Ar_3$ may each independently be an unsubstituted phenyl group, an unsubstituted naphthyl group, an unsubstituted biphenyl group, an unsubstituted dibenzofuran group, or an unsubstituted dibenzothiophene group.

In an embodiment, the amine compound represented by Formula 1 may be represented by one be Formula 1-1 to Formula 1-4.

[Formula 1-1]

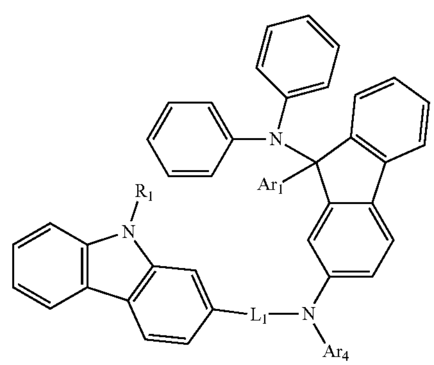

[Formula 1-2]

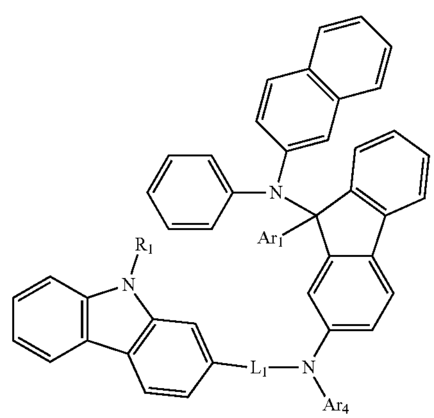

-continued

[Formula 1-3]

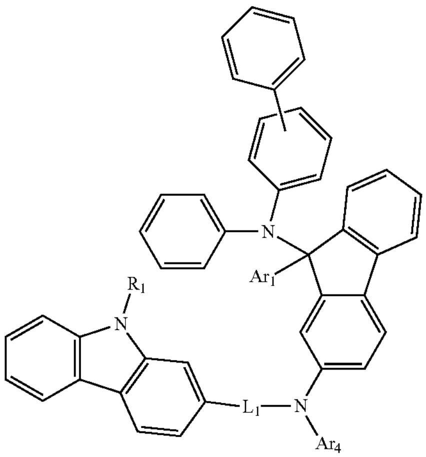

[Formula 1-4]

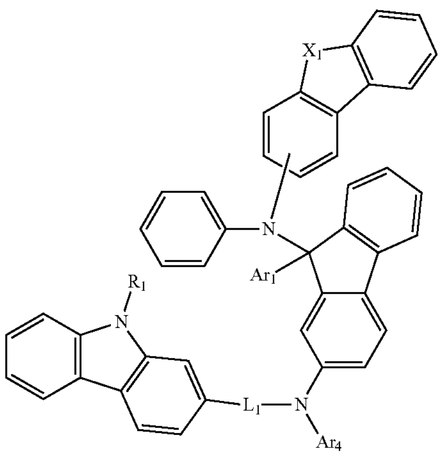

In Formula 1-4, $X_1$ may be O or S. In Formula 1-1 to Formula 1-4, $L_1$, $R_1$, $Ar_1$, and $Ar_4$ may each be the same as defined in Formula 1.

In an embodiment, the amine compound represented by Formula 1-4 may be represented by Formula 1-4A or Formula 1-4B.

[Formula 1-4A]

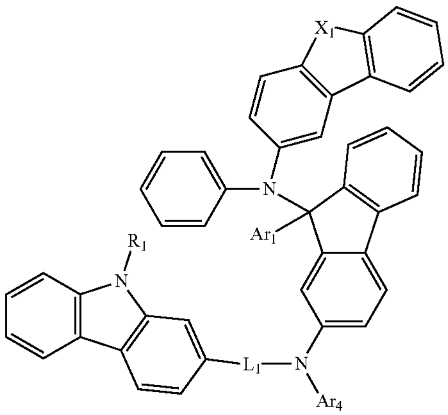

-continued

[Formula 1-4B]

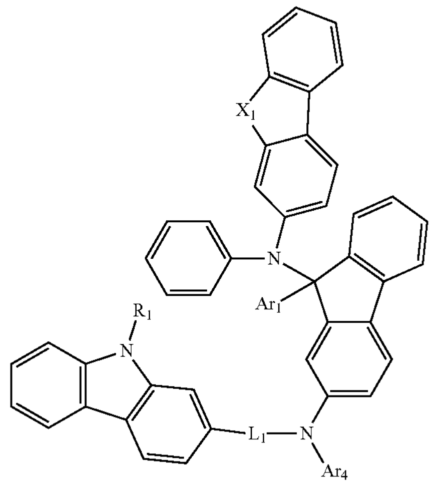

In Formula 1-4A and Formula 1-4B, $L_1$, $R_1$, $Ar_1$, $Ar_4$, and $X_1$ may each be the same as defined in Formula 1-4.

In an embodiment, one of $Ar_2$ to $Ar_4$ may be a carbazole group substituted with a phenyl group, an unsubstituted dibenzofuran group, or an unsubstituted dibenzothiophene group, and the remainder of $Ar_2$ to $Ar_4$ may each be a substituted or unsubstituted aryl group having 6 to 30 ring-forming carbon atoms.

In an embodiment, $Ar_4$ may be a group represented by one of $Ar_4$-1 to $Ar_4$-6.

Ar4-1

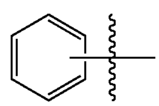

Ar4-2

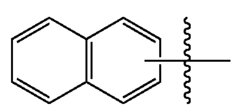

Ar4-3

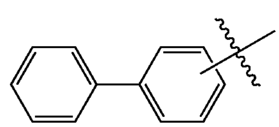

Ar4-4

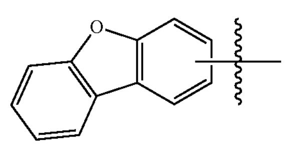

Ar4-5

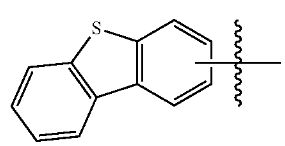

-continued

Ar4-6

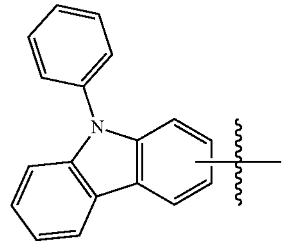

In an embodiment, $R_1$ may be a group represented by one of R1-1 to R1-4.

R1-1

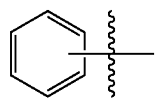

R1-2

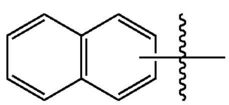

R1-3

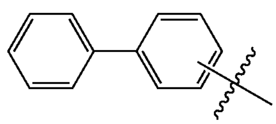

R1-4

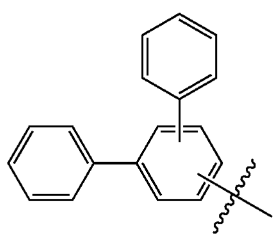

In an embodiment, $L_1$ may be a direct linkage, an unsubstituted phenylene group, an unsubstituted pyridylene group, or a fluorenylene group substituted with a methyl group.

In an embodiment, the least one functional layer may include an emission layer, a hole transport region disposed between the first electrode and the emission layer, and an electron transport region disposed between the emission layer and the second electrode; and the hole transport region may include the amine compound.

In an embodiment, the hole transport region may include at least one of a hole injection layer, a hole transport layer, or an electron blocking layer, and at least one of the hole injection layer, the hole transport layer, or the electron blocking layer may include the amine compound.

In an embodiment, the amine compound may be one selected from Compound Group 1, which is explained below.

An embodiment provides an amine compound which may be represented by Formula 1.

In an embodiment, in Formula 1, $L_1$ may be a direct linkage, and $Ar_1$ may be an unsubstituted phenyl group.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
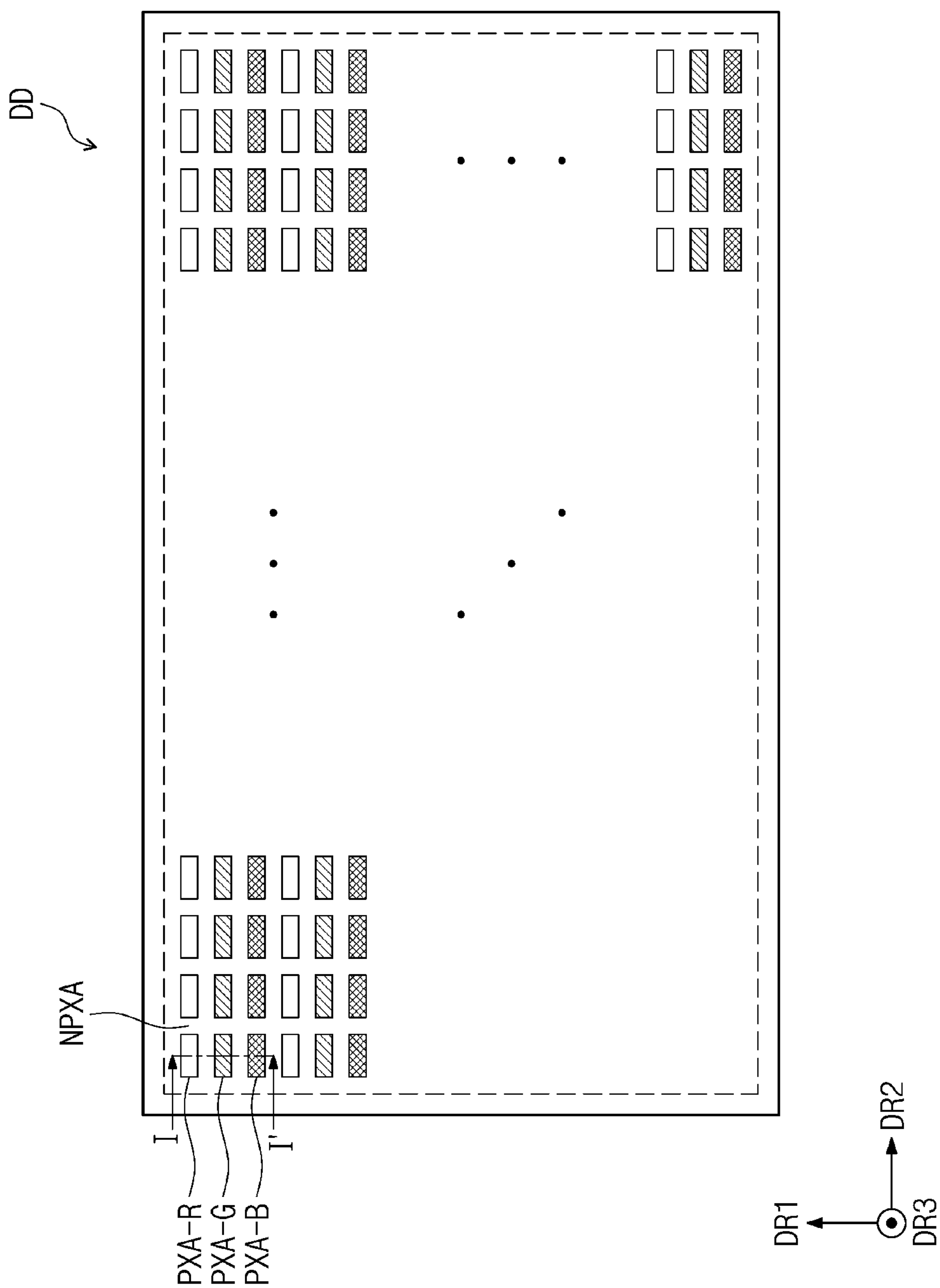
FIG. 1 is a plan view illustrating a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described with reference to the accompanying drawings.

Figure 2:
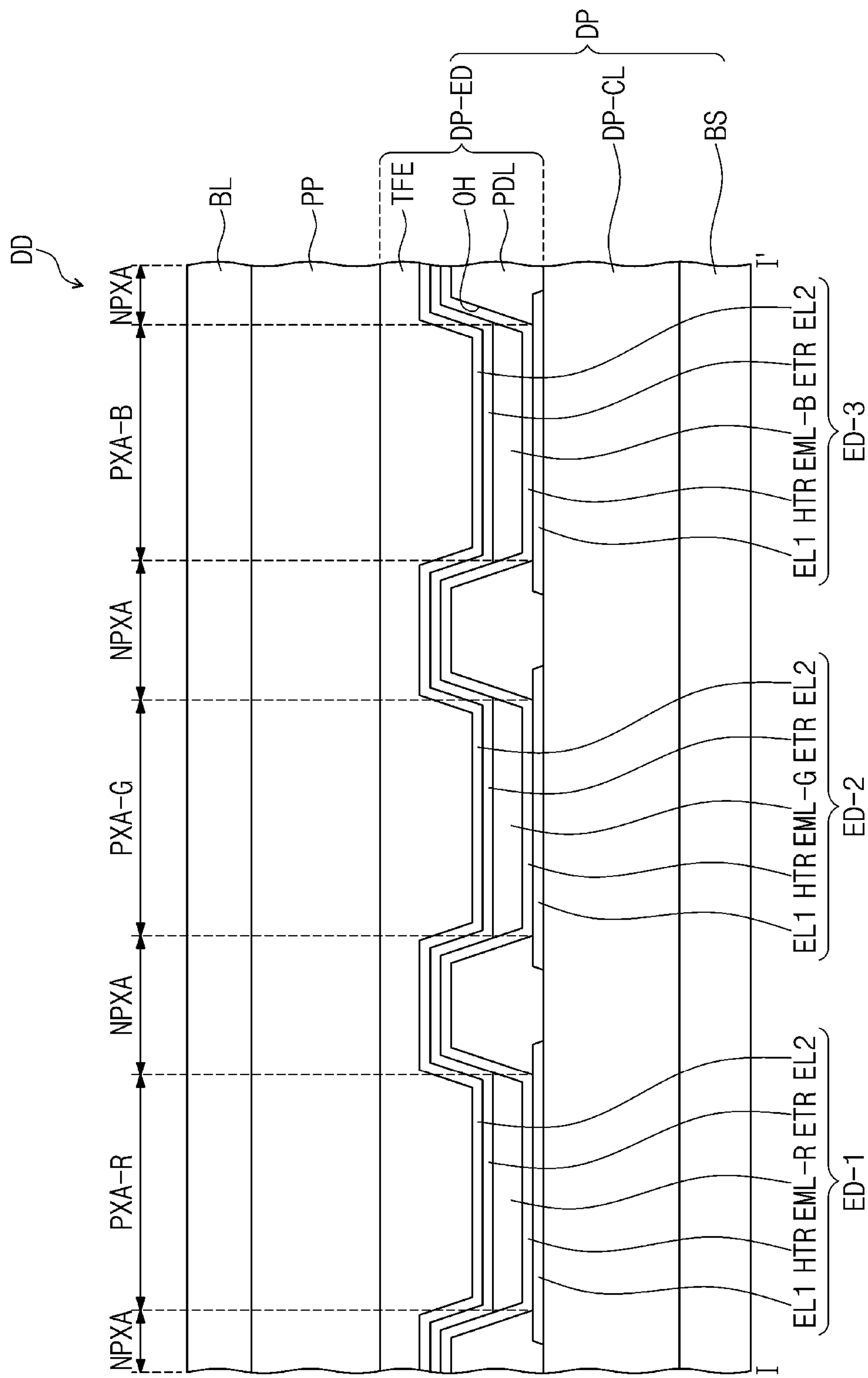
FIG. 2 is a schematic cross-sectional view illustrating a display device according to an embodiment.

FIG. 1 is a plan view illustrating an embodiment of a display device DD. FIG. 2 is a schematic cross-sectional view of the display device DD of an embodiment. FIG. 2 is a schematic cross-sectional view illustrating a portion taken along line I-I' of FIG. 1.

The display device DD may include a display panel DP and an optical layer PP disposed on the display panel DP. The display panel DP may include light-emitting elements ED-1, ED-2, and ED-3. The display device DD may include multiples of each of the light-emitting elements ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawing, in an embodiment, the optical layer PP may be omitted from the display device DD.

A base substrate BL may be disposed on the optical layer PP. The base substrate BL may provide a base surface on which the optical layer PP is disposed. The base substrate BL may be a glass substrate, a metal substrate, a plastic substrate, or the like. However, embodiments are not limited thereto, and the base substrate BL may include an inorganic layer, an organic layer, or a composite material layer. Although not shown in the drawing, in an embodiment, the base substrate BL may be omitted.

The display device DD according to an embodiment may further include a filling layer (not shown). The filling layer (not shown) may be disposed between a display element layer DP-ED and the base substrate BL. The filling layer (not shown) may be an organic material layer. The filling layer (not shown) may include at least one of an acrylic resin, a silicone-based resin, or an epoxy-based resin.

The display panel DP may include a base layer BS, a circuit layer DP-CL provided on the base layer BS, and a display element layer DP-ED. The display element layer DP-ED may include a pixel defining film PDL, the light-emitting elements ED-1, ED-2, and ED-3 disposed in the pixel defining film PDL, and an encapsulation layer TFE disposed on the light-emitting elements ED-1, ED-2, and ED-3.

The base layer BS may provide a base surface on which the display element layer DP-ED is disposed. The base layer BS may be a glass substrate, a metal substrate, a plastic substrate, or the like. However, embodiments are not limited thereto, and the base layer BS may include an inorganic layer, an organic layer, or a composite material layer.

In an embodiment, the circuit layer DP-CL may be disposed on the base layer BS, and the circuit layer DP-CL may include transistors (not shown). The transistors (not shown) may each include a control electrode, an input electrode, and an output electrode. For example, the circuit layer DP-CL may include a switching transistor and a driving transistor for driving the light-emitting elements ED-1, ED-2, and ED-3 of the display element layer DP-ED.

Each of the light-emitting elements ED-1, ED-2, and ED-3 may have a structure of a light-emitting element ED of an embodiment according to FIG. 3 to FIG. 6, which will be described later. Each of the light-emitting elements ED-1, ED-2, and ED-3 may include a first electrode EL1, a hole transport region HTR, emission layers EML-R, EML-G, and EML-B, an electron transport region ETR, and a second electrode EL2.

FIG. 2 illustrates an embodiment in which the emission layers EML-R, EML-G, and EML-B of the light-emitting elements ED-1, ED-2, and ED-3 are disposed in openings OH defined in the pixel defining film PDL, and the hole transport region HTR, the electron transport region ETR, and the second electrode EL2 are each provided as common layers for all the light-emitting elements ED-1, ED-2, and ED-3. However, embodiments are not limited thereto, and although not shown in FIG. 2, in an embodiment, the hole transport region HTR and the electron transport region ETR may each be provided by being patterned inside the openings OH defined in the pixel defining film PDL. For example, in an embodiment, the hole transport region HTR, the emission layers EML-R, EML-G, and EML-B, and the electron transport region ETR of the light-emitting elements ED-1, ED-2, and ED-3 may each be provided by being patterned through an inkjet printing method.

The encapsulation layer TFE may cover the light-emitting elements ED-1, ED-2, and ED-3. The encapsulation layer TFE may seal the display element layer DP-ED. The encapsulation layer TFE may be a thin-film encapsulation layer. The encapsulation layer TFE may be a single layer or a stack of multiple layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film may protect the display element layer DP-ED from moisture and/or oxygen, and the encapsulation-organic film may protect the display element layer DP-ED from foreign substances such as dust particles. The encapsulation-inorganic film may include silicon nitride, silicon oxynitride, silicon oxide, titanium oxide, aluminum oxide, or the like, but embodiments are not limited thereto. The encapsulation-organic film may include an acrylic compound, an epoxy-based compound, or the like. The encapsulation-organic film may include a photo-polymerizable organic material, but embodiments are not limited thereto.

The encapsulation layer TFE may be disposed on the second electrode EL2 and may be disposed to fill the openings OH.

Referring to FIG. 1 and FIG. 2, the display device DD may include a non-light-emitting region NPXA and light-emitting regions PXA-R, PXA-G, and PXA-B. The light-emitting regions PXA-R, PXA-G, and PXA-B may each be a region that emits light generated from each of the light-emitting elements ED-1, ED-2, and ED-3, respectively. The light emitting regions PXA-R, PXA-G, and PXA-B may be spaced apart from each other on a plane.

The light-emitting regions PXA-R, PXA-G, and PXA-B may be separated from each other by the pixel defining film PDL. The non-light-emitting region NPXA may be areas disposed between the neighboring light-emitting regions PXA-R, PXA-G, and PXA-B, and corresponding to the pixel defining film PDL. Each of the light-emitting regions PXA-R, PXA-G, and PXA-B may respectively correspond to pixels. The pixel defining film PDL may separate the light-emitting elements ED-1, ED-2, and ED-3. The emission layers EML-R, EML-G, and EML-B of the light-emitting elements ED-1, ED-2 and ED-3 may be disposed in the openings OH defined in the pixel defining film PDL and separated from each other.

The light-emitting regions PXA-R, PXA-G and PXA-B may be divided into groups according to the color of light generated from each of the light-emitting elements ED-1, ED-2, and ED-3. In the display device DD of an embodiment illustrated in FIG. 1 and FIG. 2, three light-emitting regions PXA-R, PXA-G, and PXA-B respectively emitting red light, green light, and blue light are illustrated. For example, the display device DD of an embodiment may include a red light-emitting region PXA-R, a green light-emitting region PXA-G, and a blue light emitting region PXA-B, which are distinguished from each other.

In the display device DD according to an embodiment, light-emitting elements ED-1, ED-2, and ED-3 may emit light having different wavelength ranges from one another. For example, in an embodiment, the display device DD may include a first light-emitting element ED-1 that emits red light, a second light-emitting element ED-2 that emits green light, and a third light-emitting element ED-3 that emits blue light. For example, the red light-emitting region PXA-R, the green light-emitting region PXA-G, and the blue light-emitting region PXA-B of the display device DD may correspond to the first light-emitting element ED-1, the second light-emitting element ED-2, and the third light-emitting element ED-3, respectively.

However, embodiments are not limited thereto, and the first to third light-emitting elements ED-1, ED-2, and ED-3 may emit light in a same wavelength range, or at least one thereof may emit light in a different wavelength range. For example, all of the first to third light-emitting elements ED-1, ED-2, and ED-3 may emit blue light.

The light emitting regions PXA-R, PXA-G, and PXA-B in the display device DD according to an embodiment may be arranged in a stripe shape. Referring to FIG. 1, red light-emitting regions PXA-R, green light-emitting regions PXA-G, and blue light-emitting regions PXA-B may each be arranged along a second directional axis DR2. In another embodiment, the red light-emitting region PXA-R, the green light-emitting region PXA-G, and the blue light-emitting region PXA-B may be alternately arranged in this order along a first directional axis DR1.

FIG. 1 and FIG. 2 illustrate that all the light-emitting regions PXA-R, PXA-G, and PXA-B have a similar area, but embodiments are not limited thereto, and the areas of the light-emitting regions PXA-R, PXA-G, and PXA-B may be different from each other according to a wavelength range of emitted light. The areas of the light-emitting regions PXA-R, PXA-G, and PXA-B may be areas in a plan view that are defined by the first directional axis DR1 and the second directional axis DR2.

The arrangement type of the light-emitting regions PXA-R, PXA-G, and PXA-B is not limited to the figure illustrated in FIG. 1, and the order in which the red light-emitting region PXA-R, the green light-emitting region PXA-G, and the blue light-emitting region PXA-B are arranged, may be provided in various combinations depending on the display quality characteristics that are required for the display device DD. For example, the arrangement type of the light-emitting regions PXA-R, PXA-G, and PXA-B may be a PENTILE™ arrangement type or a diamond arrangement type.

In an embodiment, the areas of the light-emitting regions PXA-R, PXA-G, and PXA-B may be different from each other. For example, an area of the green light-emitting region PXA-G may be smaller than an area of the blue light-emitting region PXA-B, but embodiments are not limited thereto.

Hereinafter, FIG. 3 to FIG. 6 are each a schematic cross-sectional view illustrating a light-emitting element according to embodiments. As shown in FIG. 2, the light-emitting element ED according to an embodiment may include a first electrode EL1, a hole transport region HTR, an emission layer EML, an electron transport region ETR, and a second electrode EL2 which are sequentially stacked.

Figure 3:
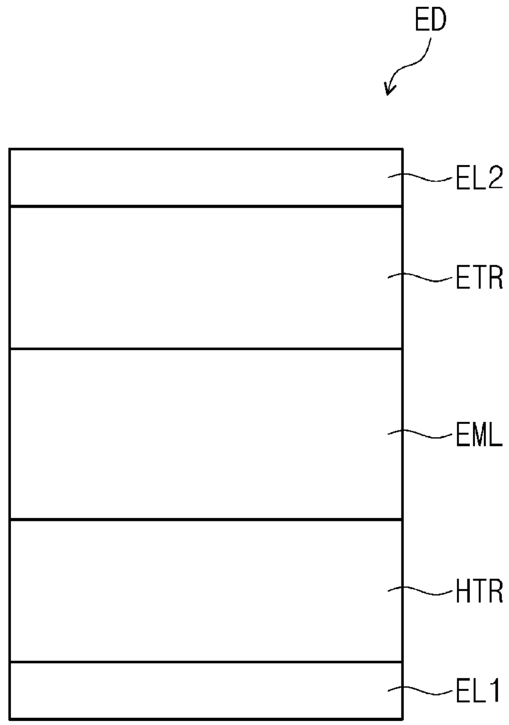
FIG. 3 is a schematic cross-sectional view illustrating a light-emitting element according to an embodiment.
Figure 4:
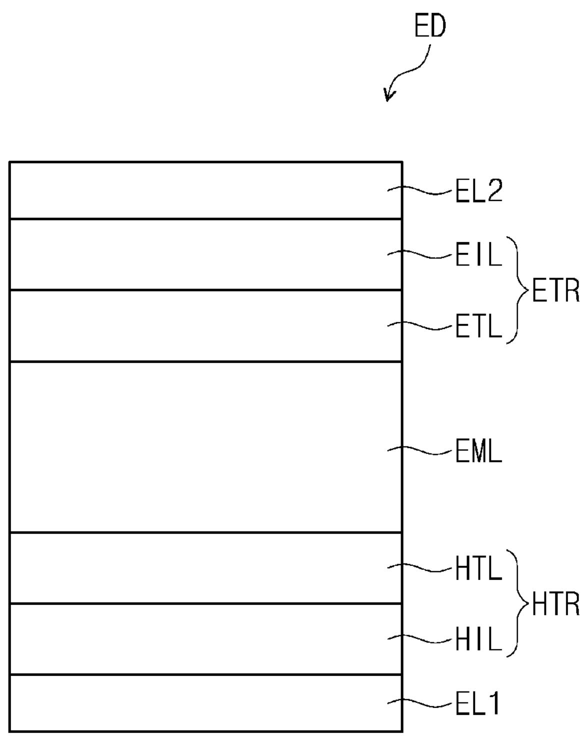
FIG. 4 is a schematic cross-sectional view illustrating a light-emitting element according to an embodiment.
Figure 5:
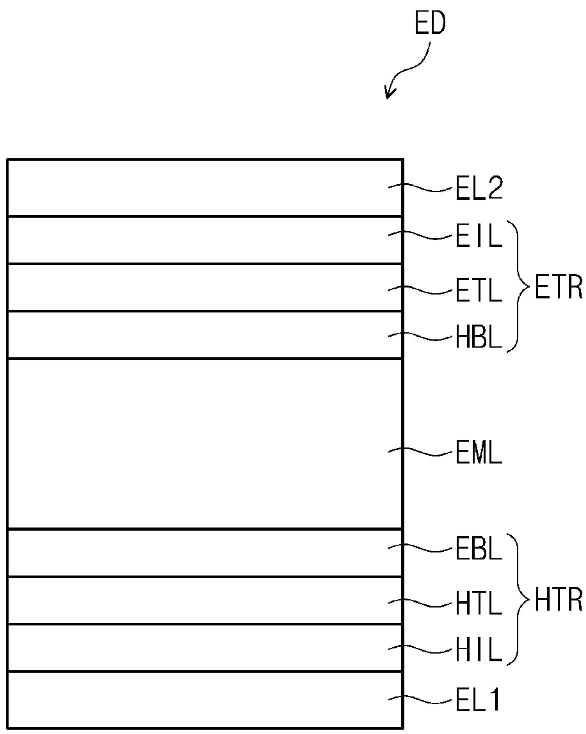
FIG. 5 is a schematic cross-sectional view illustrating a light-emitting element according to an embodiment.
Figure 6:
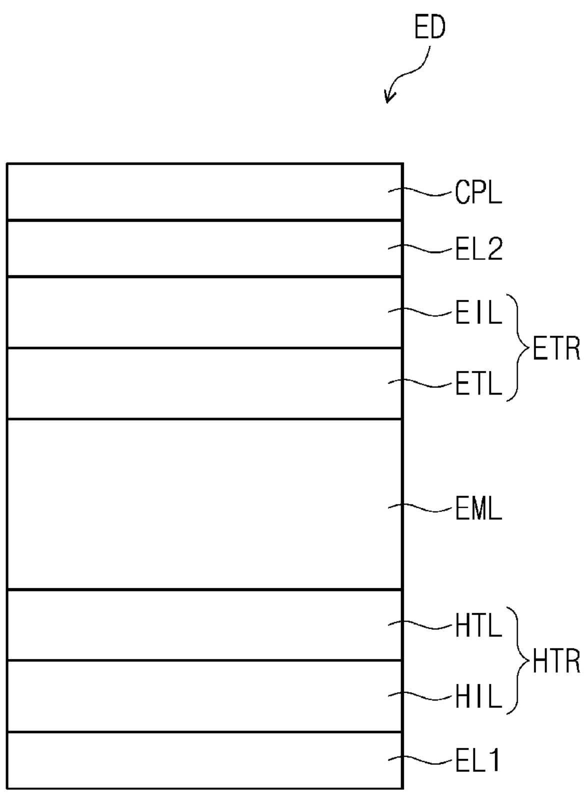
FIG. 6 is a schematic cross-sectional view illustrating a light-emitting element according to an embodiment.

In comparison to FIG. 3, FIG. 4 illustrates a schematic cross-sectional view of a light-emitting element ED of an embodiment, in which a hole transport region HTR includes a hole injection layer HIL and a hole transport layer HTL, and in which an electron transport region ETR includes an electron injection layer EIL and an electron transport layer ETL. In comparison to FIG. 3, FIG. 5 illustrates a schematic cross-sectional view of a light-emitting element ED of an embodiment, in which a hole transport region HTR includes a hole injection layer HIL, a hole transport layer HTL, and an electron blocking layer EBL, and in which an electron transport region ETR includes an electron injection layer EIL, an electron transport layer ETL, and a hole blocking layer HBL. In comparison to FIG. 4, FIG. 6 illustrates a schematic cross-sectional view of a light-emitting element ED of an embodiment, which includes a capping layer CPL disposed on the second electrode EL2.

A first electrode EL1 has conductivity. The first electrode EL1 may be formed of a metal material, a metal alloy, or a conductive compound. The first electrode EL1 may be an anode or a cathode. However, embodiments are not limited thereto. In an embodiment, the first electrode EL1 may be a pixel electrode. The first electrode EL1 may be a transmissive electrode, a transflective electrode, or a reflective electrode. When the first electrode EL1 is a transmissive electrode, the first electrode EL1 may include transparent metal oxide such as indium tin oxide (ITO), indium zinc oxide (IZO), zinc oxide (ZnO), indium tin zinc oxide (ITZO). When the first electrode EL1 is a transflective electrode or a reflective electrode, the first electrode EL1 may include Ag, Mg, Cu, Al, Pt, Pd, Au, Ni, Nd, Ir, Cr, $L_1$, Ca, LiF/Ca, LiF/Al, Mo, Ti, W, a compound thereof, or a mixture thereof (for example, a mixture of Ag and Mg). In an embodiment, the first electrode EL1 may have a multilayer structure including a reflective film or a transflective film formed of the above-described materials and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but embodiments are not limited thereto. The first electrode EL1 may include the above-described metal material, a combination of two or more metal materials selected from the above-described metal materials, or oxides of the above-described metal materials. The thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. In the light-emitting element ED of an embodiment, the hole transport region HTR may include an amine compound of an embodiment.

In the specification, the term "substituted or unsubstituted" may mean a group that is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may itself be substituted or unsubstituted. For example, a biphenyl group may be interpreted as an aryl group or as a phenyl group substituted with a phenyl group.

In the specification, the term "bonded to an adjacent group to form a ring" may mean a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and heterocycle may each be a monocycle or a polycycle. A ring formed by groups being bonded to each other may be connected to another ring to form a spiro structure.

In the specification, the term "adjacent group" may mean a substituent substituted for an atom which is directly connected with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as mutually "adjacent groups", and in 1,1-diethylcyclopentene, two ethyl groups may be interpreted as mutually "adjacent groups". For example, in 4,5-dimethylphenanthrene, two methyl groups may be interpreted as mutually "adjacent groups."

In the specification, examples of the halogen atom may include a fluorine atom, a chlorine atom, a bromine atom, and an iodine atom.

In the specification, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include, but are not limited to, methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, or the like.

In the specification, a hydrocarbon ring group may be any functional group or substituent derived from an aliphatic hydrocarbon ring. For example, the hydrocarbon ring group may be a saturated hydrocarbon ring group having 5 to 20 ring-forming carbon atoms.

In the specification, an aryl group may be any functional group or substituent derived from an aromatic hydrocarbon ring. The aryl group may be a monocyclic aryl group or a polycyclic aryl group. The number of ring-forming carbon atoms of the aryl group may be 6 to 30, 6 to 20, or 6 to 15. Examples of the aryl group may include, but are not limited to, phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, or the like.

In the specification, the heteroaryl group may include at least one of B, O, N, P, Si, or S as a heteroatom. When the heteroaryl group includes two or more heteroatoms, the two or more heteroatoms may be the same as or different from each other. The heteroaryl group may be a monocyclic heteroaryl group or a polycyclic heteroaryl group. The number of ring-forming carbon atoms of the heteroaryl group may be 2 to 30, 2 to 20, or 2 to 10. Examples of the heteroaryl group may include, but are not limited to, a thiophene group, a furan group, a pyrrole group, an imidazole group, a triazole group, a pyridine group, a bipyridine group, a pyrimidine group, a triazine group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc.

In the specification, the description regarding the aryl group stated above may be applied to an arylene group except that the arylene group is a divalent group. The description about the heteroaryl group stated above may be applied to a heteroarylene group except that the heteroarylene group is a divalent group.

In the specification, a thio group may include an alkyl thio group and an aryl thio group. The thio group may be a group in which a sulfur atom is bonded to an alkyl group or an aryl group defined as above.

In the specification, an oxy group may be a group in which an oxygen atom is bonded to an alkyl group or an aryl group defined as above. The oxy group may include an alkoxy group and aryl oxy group. The alkoxy group may be a linear, branched, or cyclic group.

In the specification, the number of carbon atoms of the amine group may be 1 to 30, but is not limited thereto. The amine group may include an alkyl amine group and an aryl amine group.

In the specification, a direct linkage may mean a single bond. In the description,

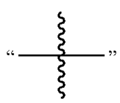

and "——*" each represents a binding site to a neighboring atom in its respective formula.

In the light-emitting element ED of an embodiment, the hole transport region HTR may include an amine compound represented by Formula 1 below.

[Formula 1]

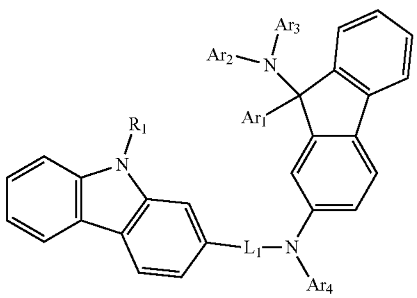

In Formula 1, $L_1$ may be a direct linkage, a substituted or unsubstituted arylene group having 6 to 30 ring-forming carbon atoms, or a substituted or unsubstituted heteroarylene group having 2 to 30 ring-forming carbon atoms. In an embodiment, $L_1$ may be a direct linkage, an unsubstituted phenylene group, an unsubstituted pyridylene group, or a substituted fluorenylene group. For example, the substituted fluorenylene group may be substituted with a methyl group.

In Formula 1, $R_1$ may be a substituted or unsubstituted aryl group having 6 to 30 ring-forming carbon atoms. For example, $R_1$ may be an unsubstituted phenyl group, an unsubstituted naphthyl group, an unsubstituted biphenyl group, or an unsubstituted terphenyl group. In an embodiment, $R_1$ may be a group represented by any one of R1-1 to R1-4 below.

R1-1

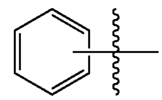

R1-2

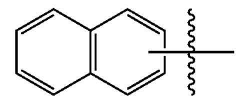

R1-3

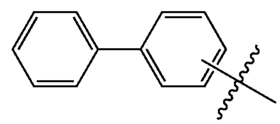

R1-4

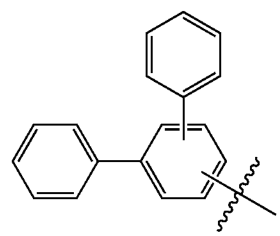

In Formula 1, $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms. In an embodiment, $Ar_1$ may be an unsubstituted phenyl group, and $L_1$ may be a direct linkage.

Any one of $Ar_2$ to $Ar_4$ may be a substituted or unsubstituted heteroaryl group having 2 to 30 ring-forming carbon atoms. In an embodiment, any one of $Ar_2$ to $Ar_4$ may be a substituted carbazole group, an unsubstituted dibenzofuran group, or an unsubstituted dibenzothiophene group, and the remainder of $Ar_2$ to $Ar_4$ may each be a substituted or unsubstituted aryl group having 6 to 30 ring-forming carbon atoms. For example, any one of $Ar_2$ to $Ar_4$ may be a carbazole group substituted with a phenyl group, an unsubstituted dibenzofuran group, or an unsubstituted dibenzothiophene group, and the remainder of $Ar_2$ to $Ar_4$ may each be an unsubstituted phenyl group.

$Ar_4$ may be an unsubstituted phenyl group, an unsubstituted naphthyl group, an unsubstituted biphenyl group, an unsubstituted dibenzofuran group, an unsubstituted dibenzothiophene group, or a carbazole group substituted with a phenyl group. In an embodiment, $Ar_4$ may be a group represented by any one of $Ar_4$-1 to $Ar_4$-6 below.

Ar4-1

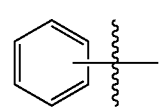

-continued

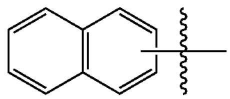

Ar4-2

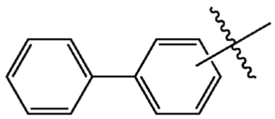

Ar4-3

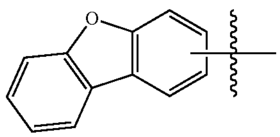

Ar4-4

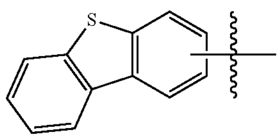

Ar4-5

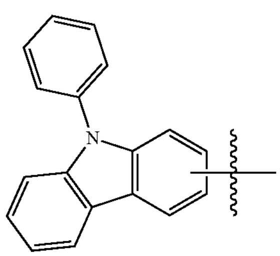

Ar4-6

In an embodiment, $Ar_2$ and $Ar_3$ may each independently be an unsubstituted phenyl group, an unsubstituted naphthyl group, an unsubstituted biphenyl group, an unsubstituted dibenzofuran group, or an unsubstituted dibenzothiophene group.

In an embodiment, the amine compound represented by Formula 1 may be represented by any one of Formula 1-1 to Formula 1-4 below. Formula 1-1 represents a case where in Formula 1, $Ar_2$ and $Ar_3$ are unsubstituted phenyl groups. Formula 1-2 represents a case where in Formula 1, any one of $Ar_2$ and $Ar_3$ is an unsubstituted phenyl group, and the other one is an unsubstituted naphthyl group. Formula 1-3 represents a case where in Formula 1, any one of $Ar_2$ and $Ar_3$ is an unsubstituted phenyl group, and the other one is an unsubstituted biphenyl group. Formula 1-4 represents a case where in Formula 1, any one among $Ar_2$ and $Ar_3$ is an unsubstituted phenyl group, and the other one is an unsubstituted heteroaryl group. In Formula 1-4, the unsubstituted heteroaryl group may be an unsubstituted dibenzofuran group or an unsubstituted dibenzothiophene group.

[Formula 1-1]

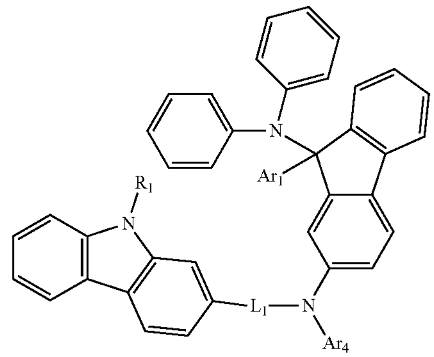

[Formula 1-2]

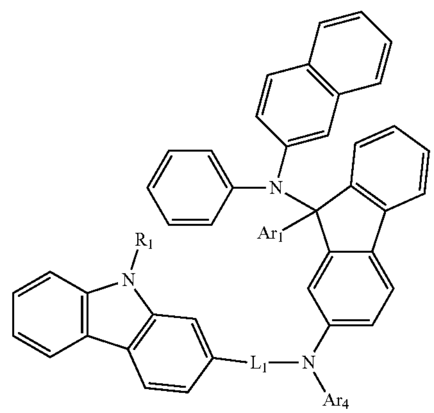

[Formula 1-3]

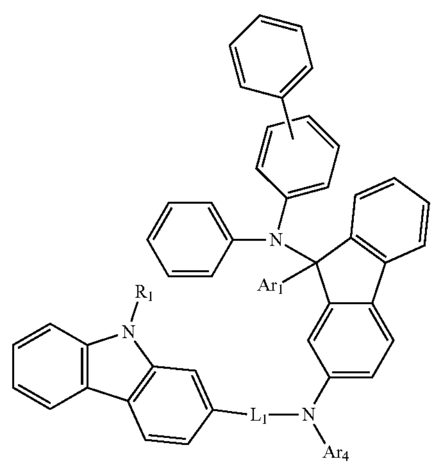

-continued

[Formula 1-4]

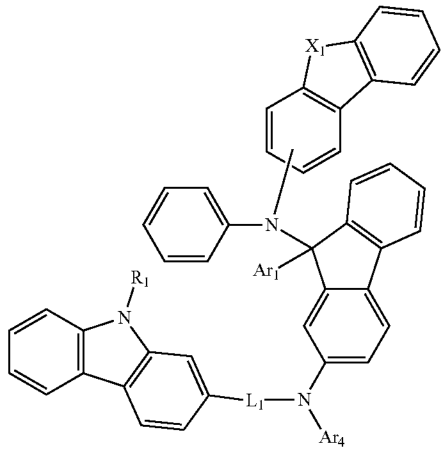

In Formula 1-1 to Formula 1-4, $L_1$, $R_1$, $Ar_1$, and $Ar_4$ may each be the same as defined in Formula 1. In Formula 1-4, $X_1$ may be O or S. In Formula 1-4, a tricyclic ring group including $X_1$ may be an unsubstituted dibenzofuran group or an unsubstituted dibenzothiophene group.

In an embodiment, the amine compounds represented by Formula 1-4 may be represented by Formula 1-4A or Formula 1-4B below. In Formula 1-4A, $X_1$ and a nitrogen atom are bonded at a para position of a hexagonal ring. In Formula 1-4B, $X_1$ and a nitrogen atom are bonded at a meta position of a hexagonal ring. The nitrogen atom is bonded to a hexagonal ring in a tricyclic ring group including $X_1$.

[Formula 1-4A]

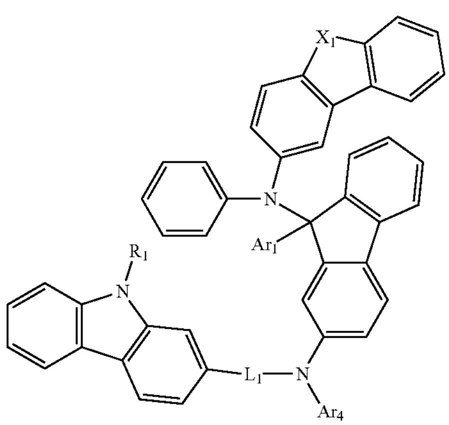

-continued

[Formula 1-4B]

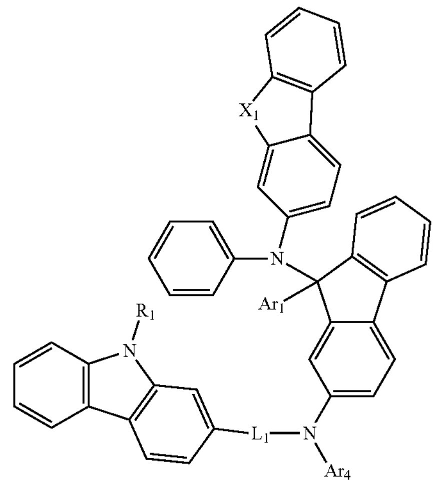

In Formula 1-4A and Formula 1-4B, $L_1$, $R_1$, $Ar_1$, $Ar_4$, and $X_1$ may each be the same as defined in Formula 1-4.

The amine compound represented by Formula 1 of an embodiment may be any one selected from Compound Group 1. The hole transport region HTR of the light-emitting element ED of an embodiment may include at least one of the amine compounds disclosed in Compound Group 1 below.

[Compound Group 1]

1

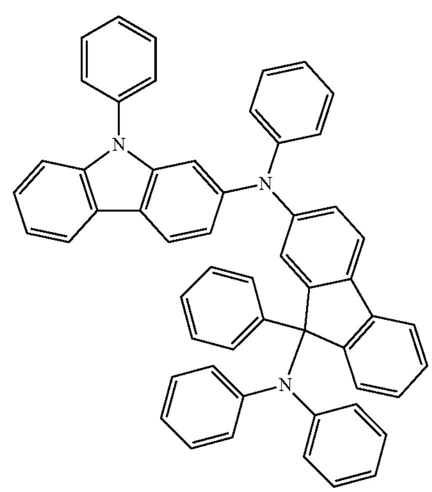

-continued
2
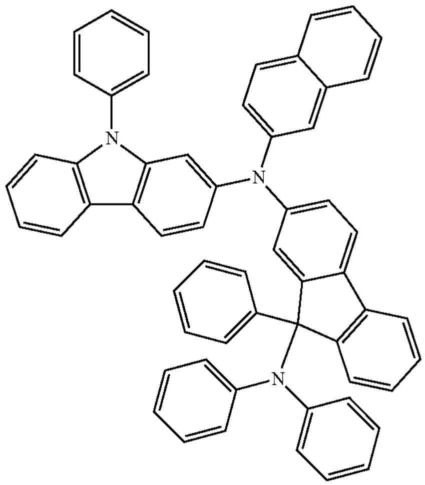
3
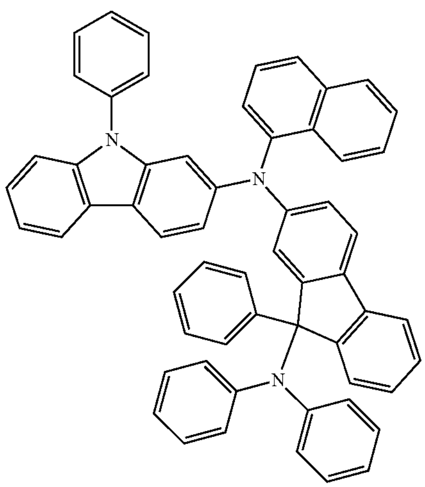
4
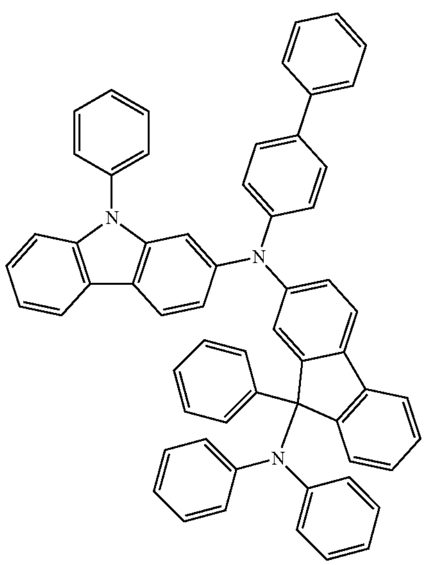
-continued
5
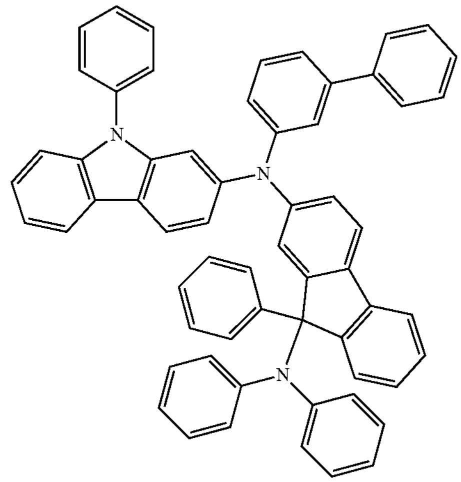
6
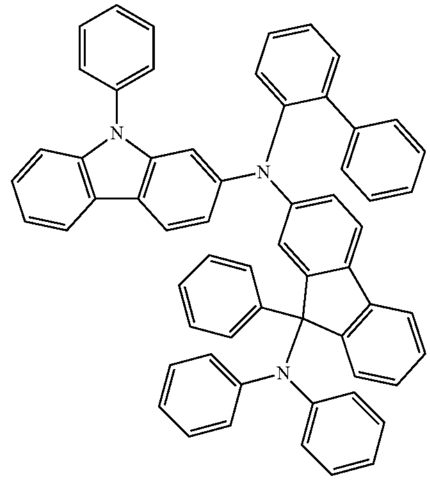
7
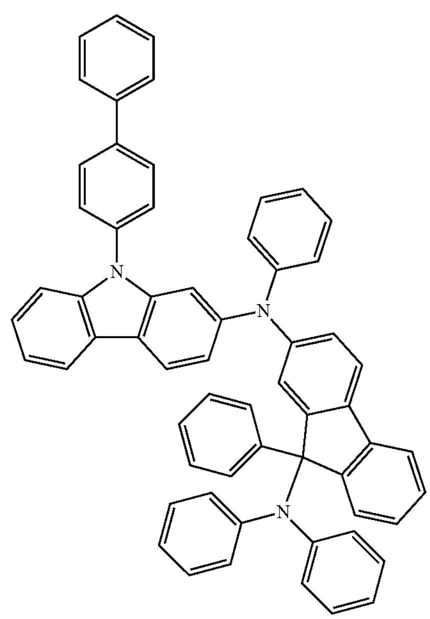

-continued
8
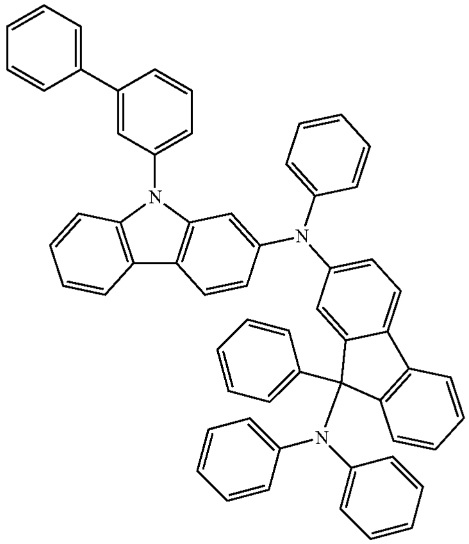
9
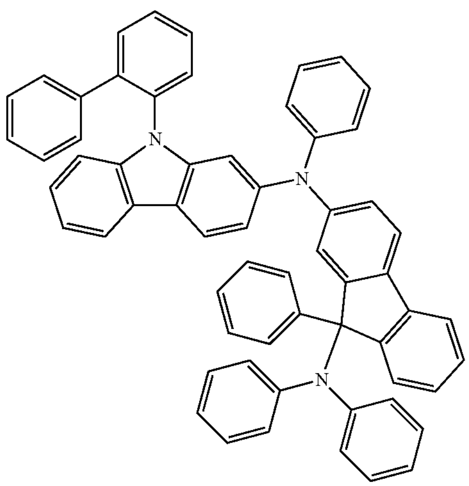
10
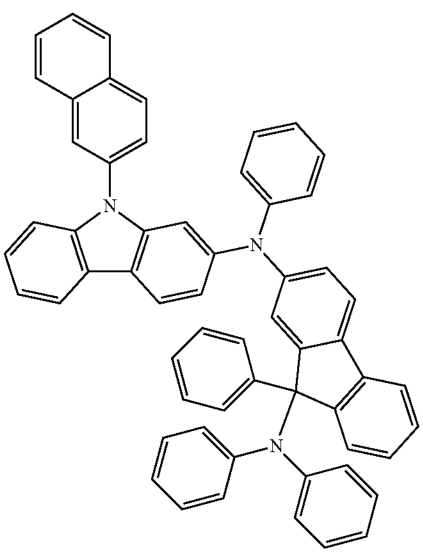
-continued
11
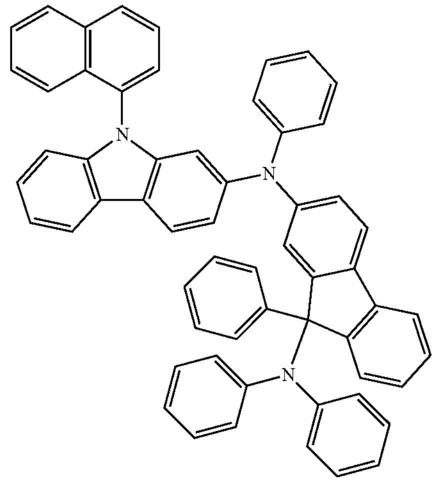
12
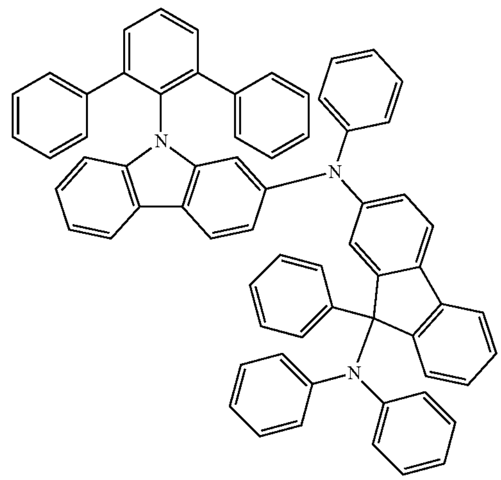
13
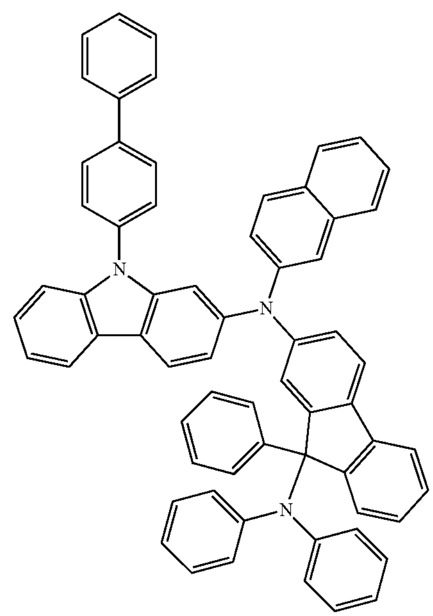

-continued
14
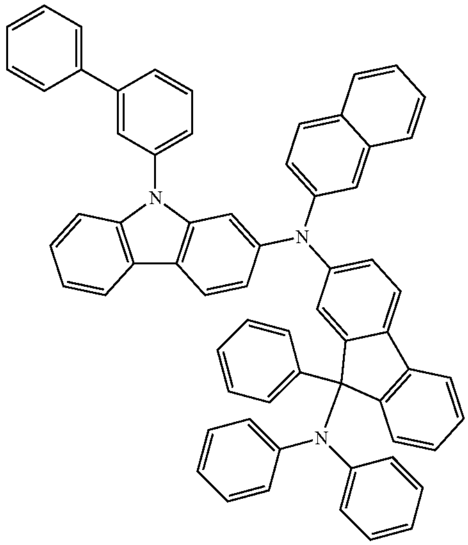
15
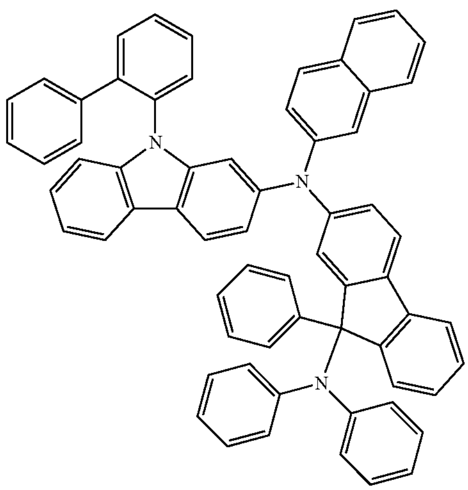
16
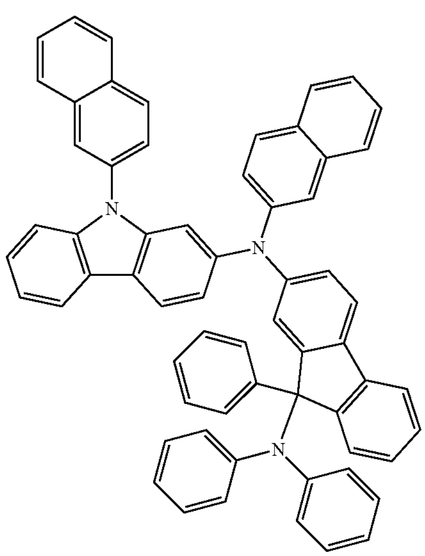
-continued
17
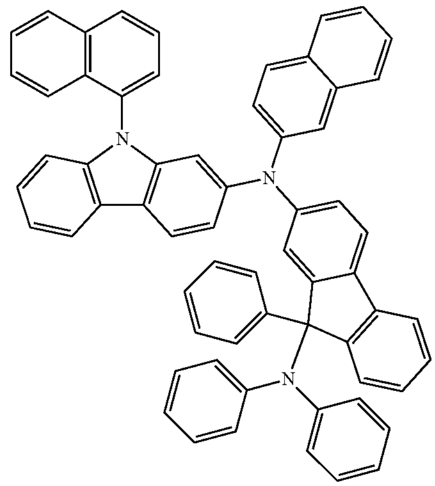
18
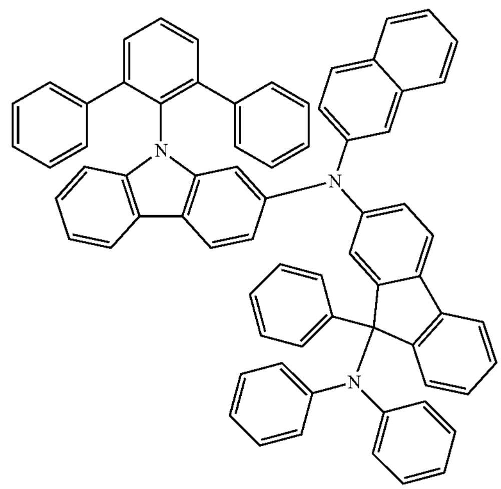
19
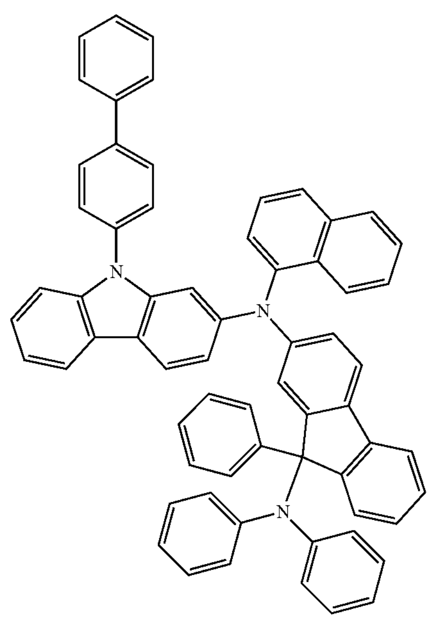

-continued
20
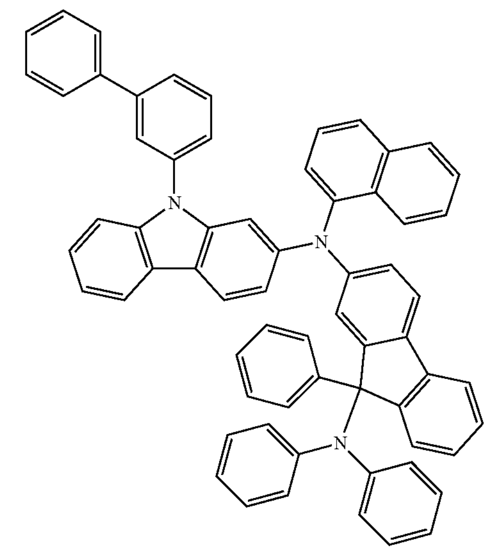
21
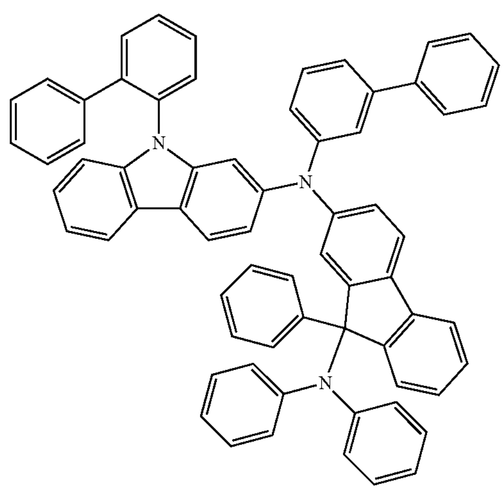
22
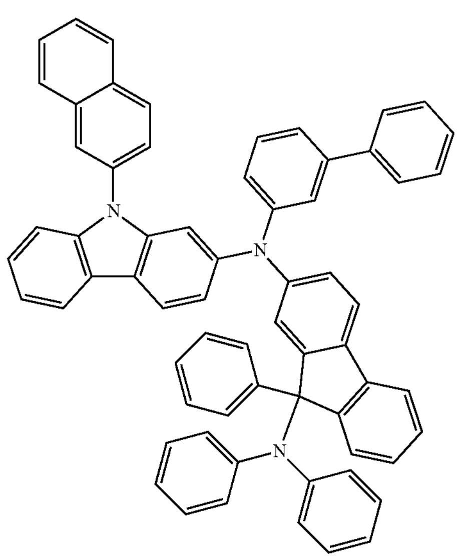
-continued
23
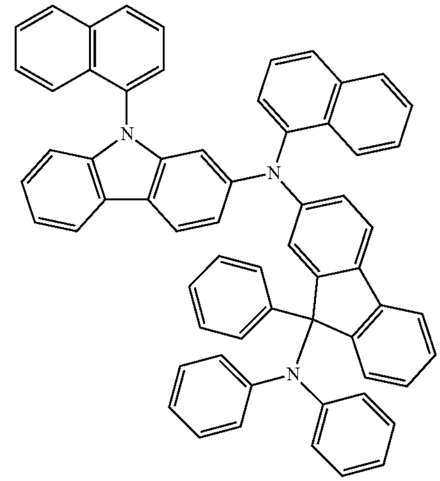
24
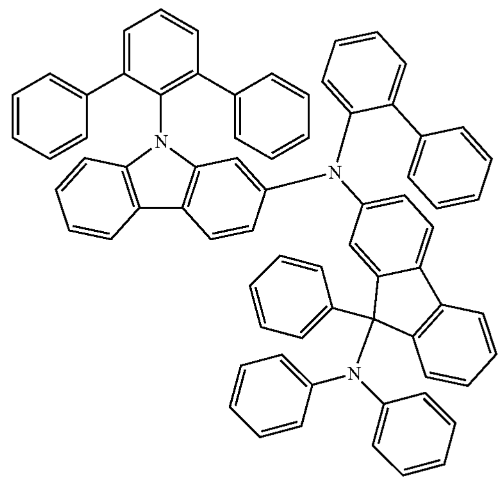
25
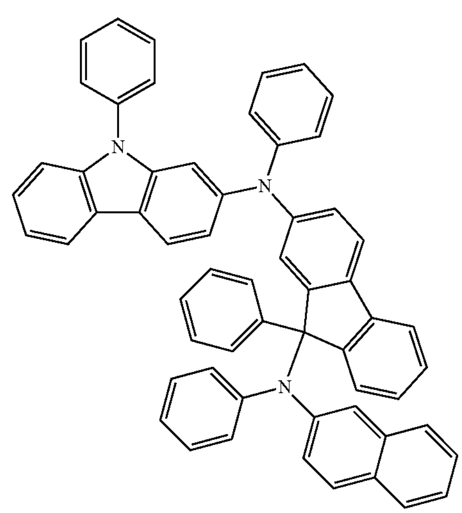

26
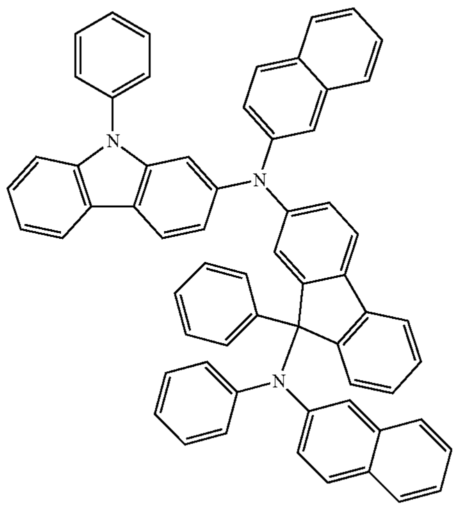
27
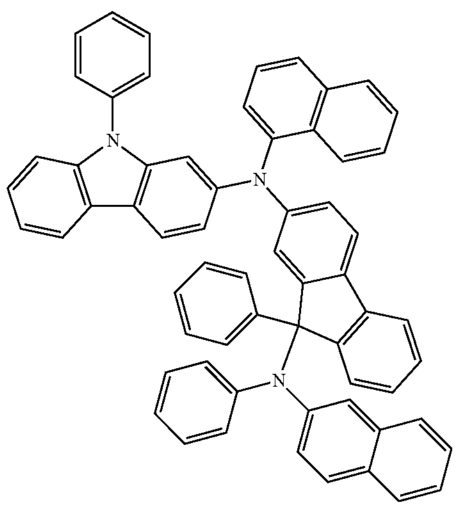
28
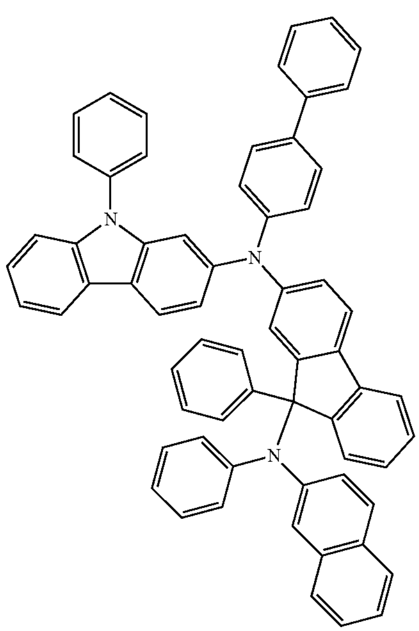
29
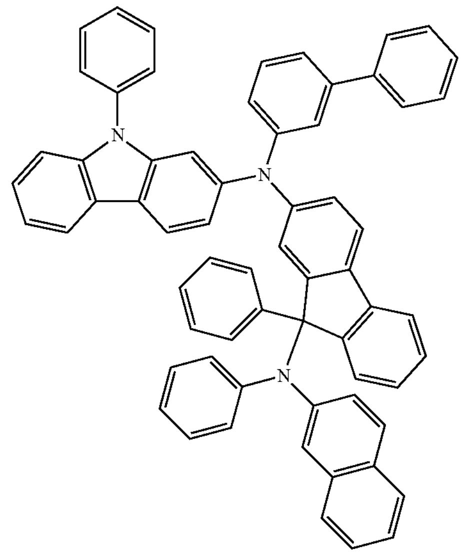
30
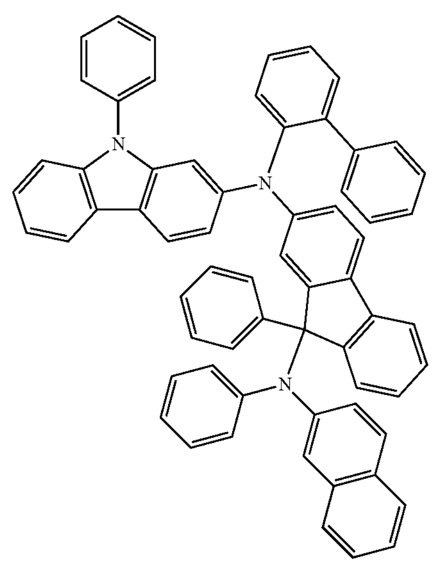

-continued
31
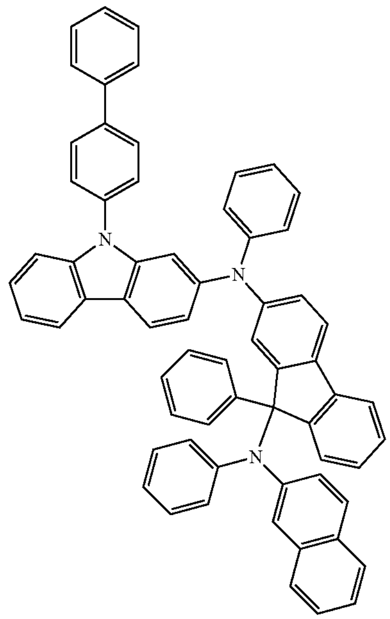
32
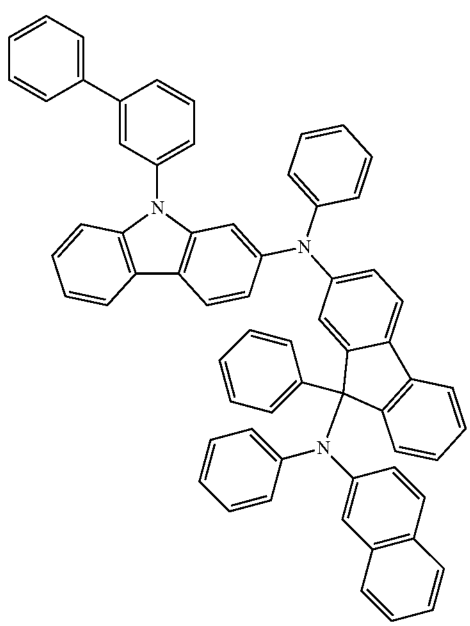
-continued
33
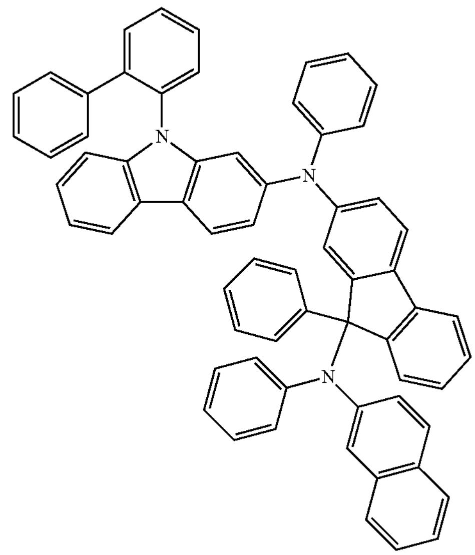
34
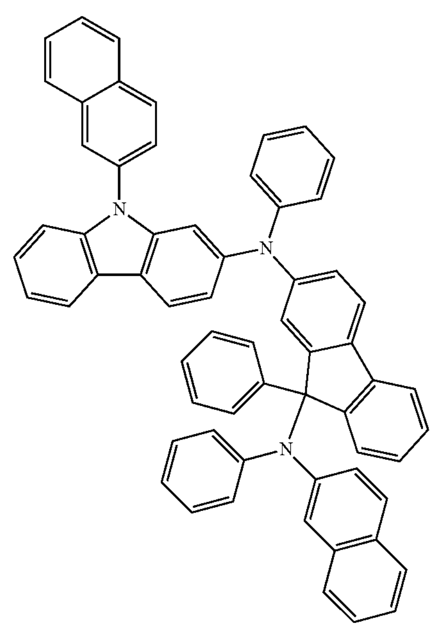

35
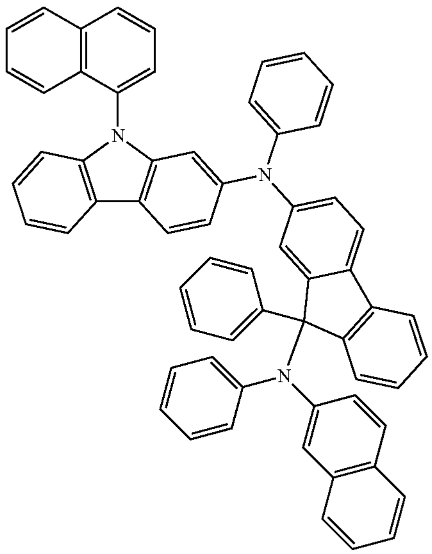
36
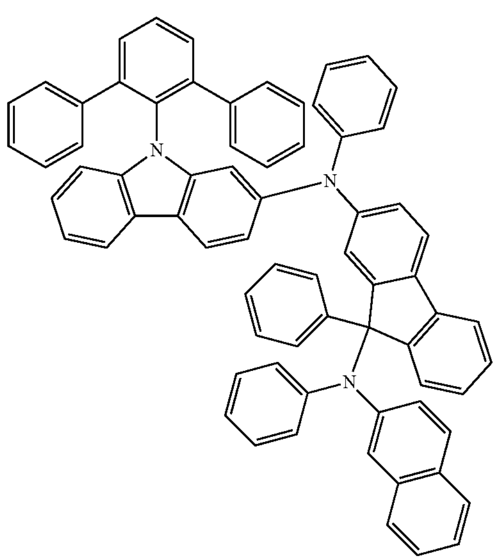
37
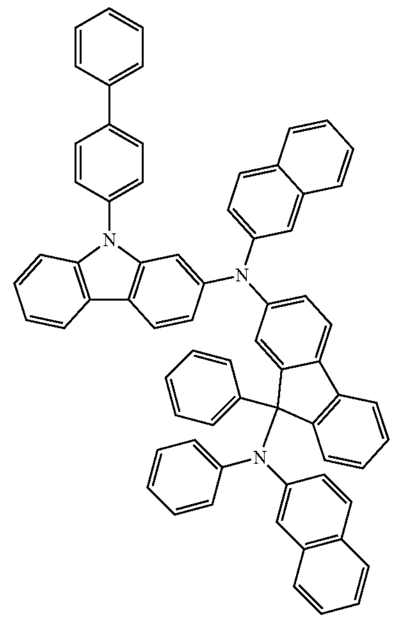
38
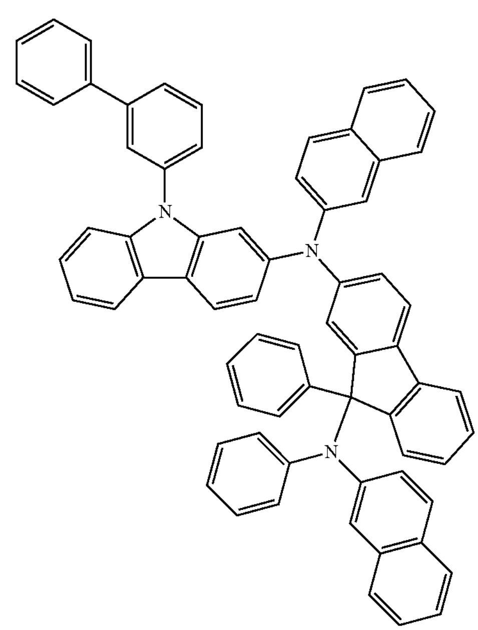

-continued
39
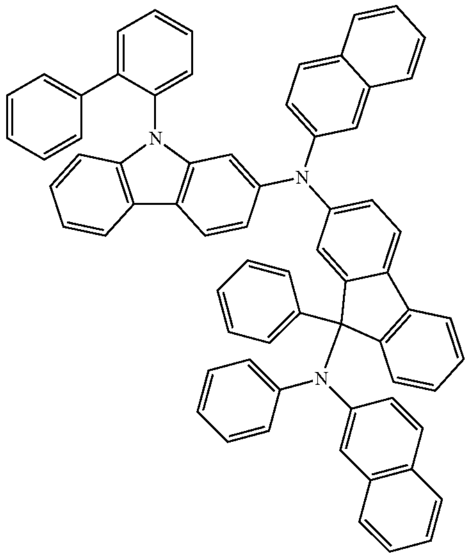
-continued
41
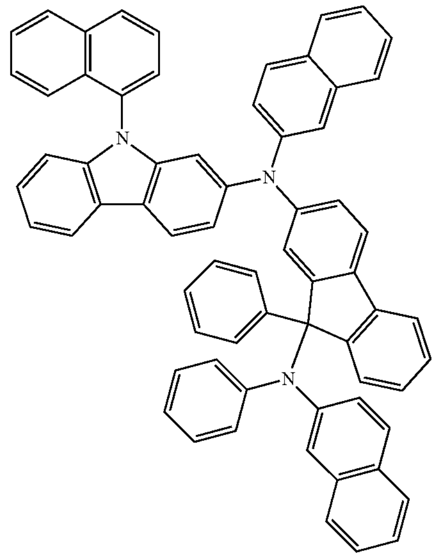
40
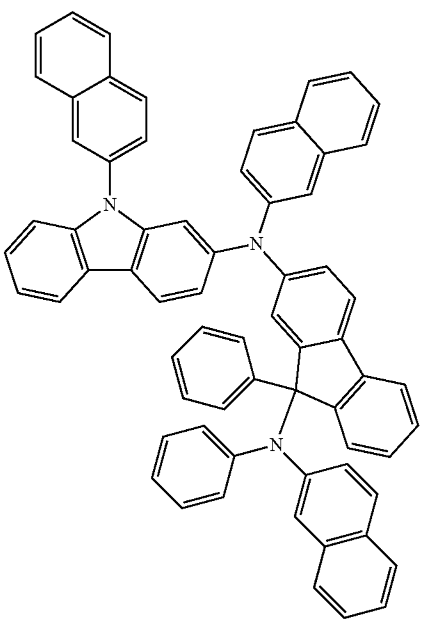
42
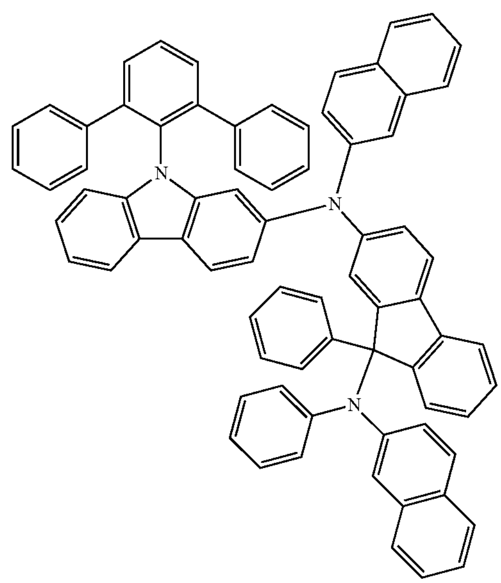

-continued
43
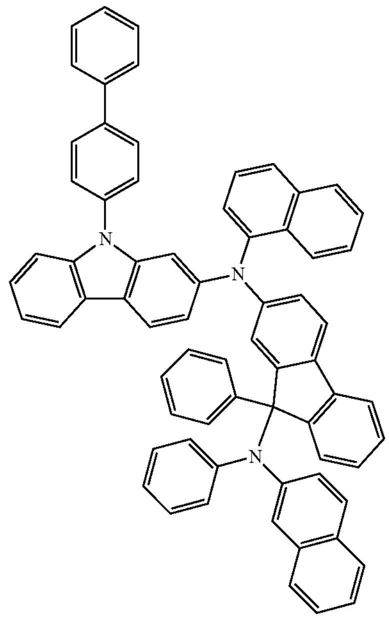
-continued
45
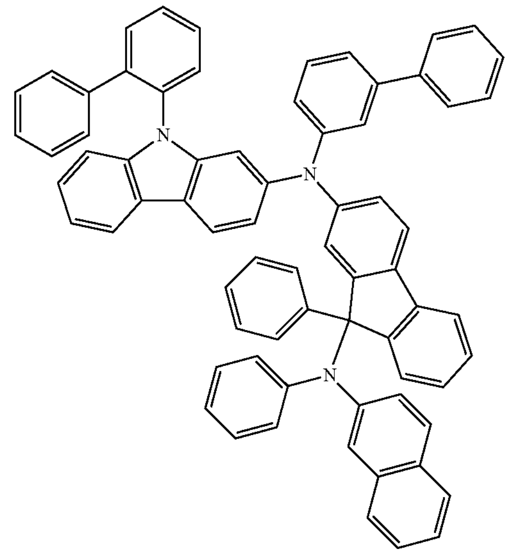
44
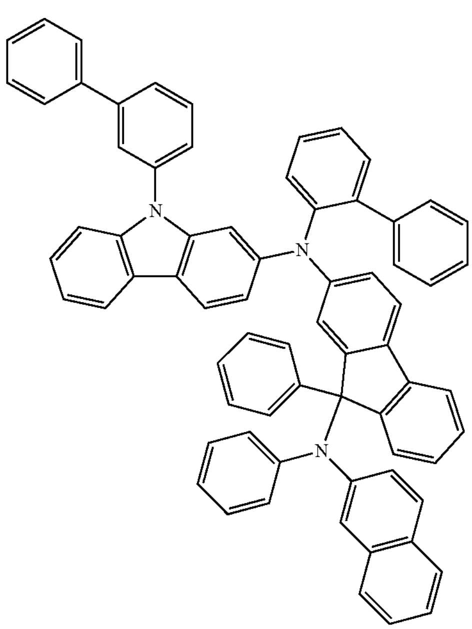
46
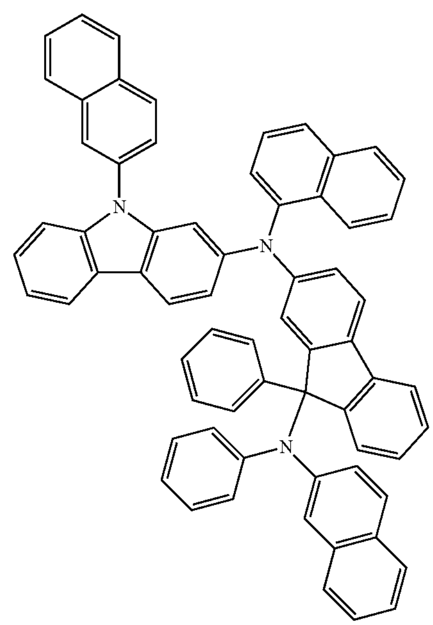

-continued
47
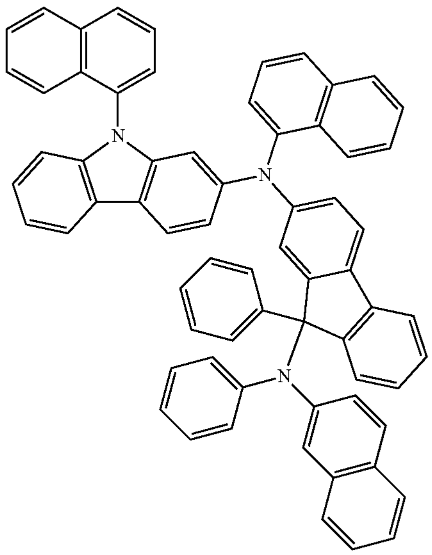
48
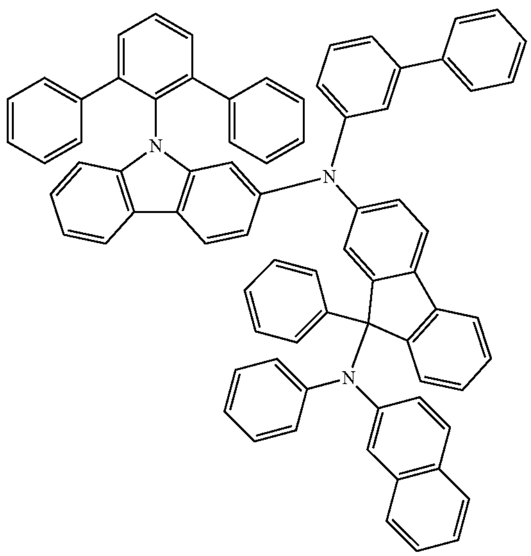
49
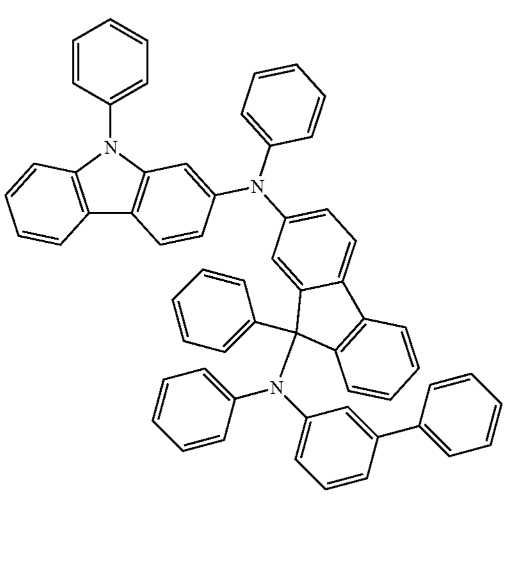
-continued
50
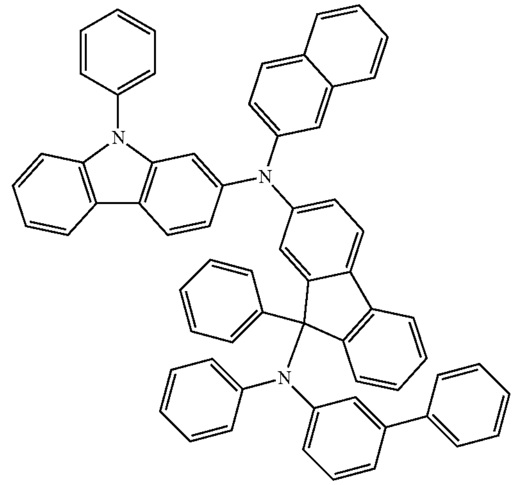
51
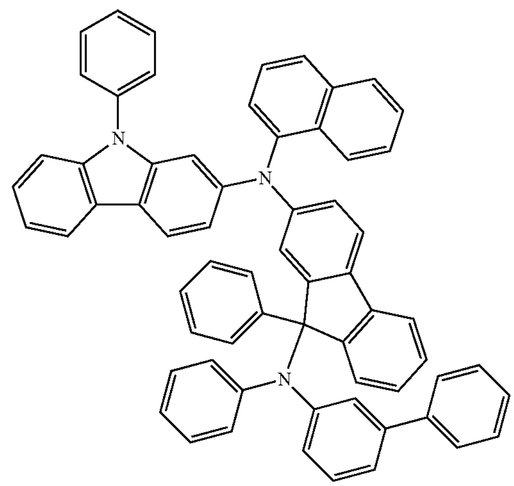
52
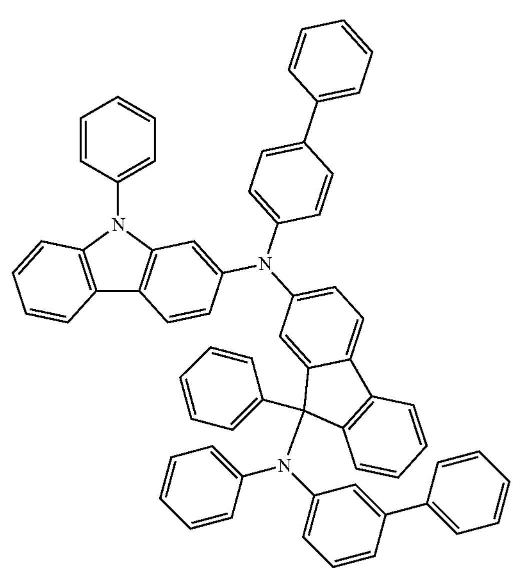

53
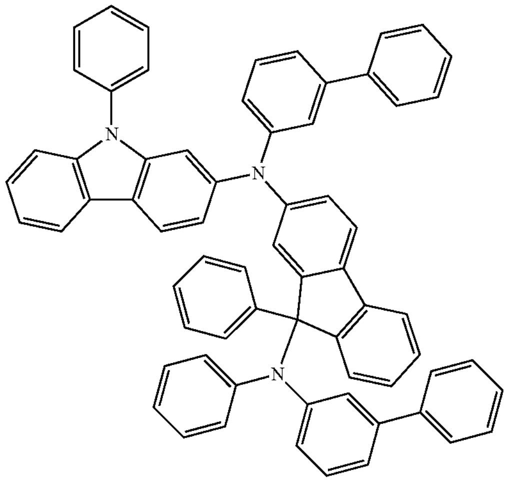
54
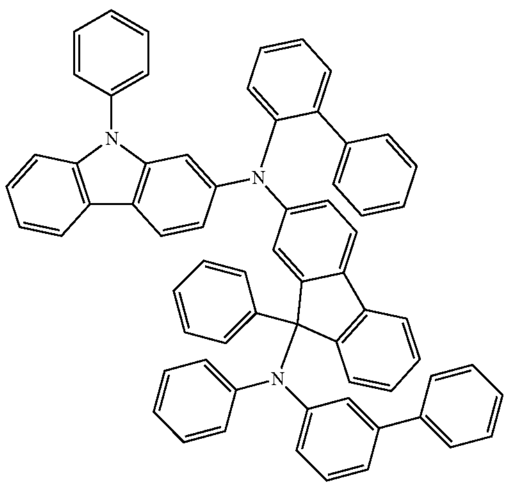
55
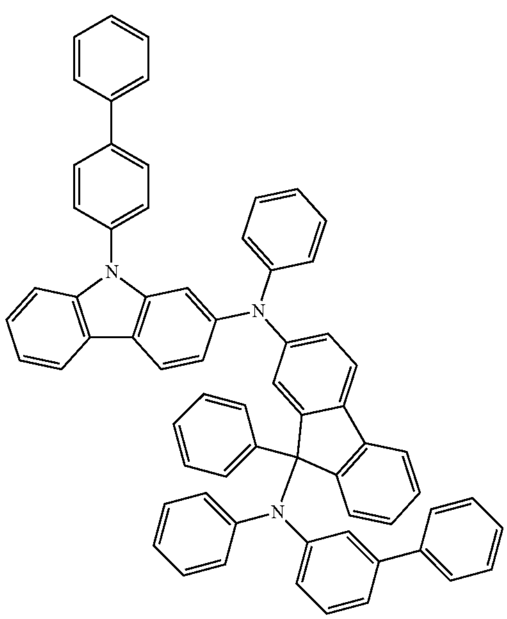
56
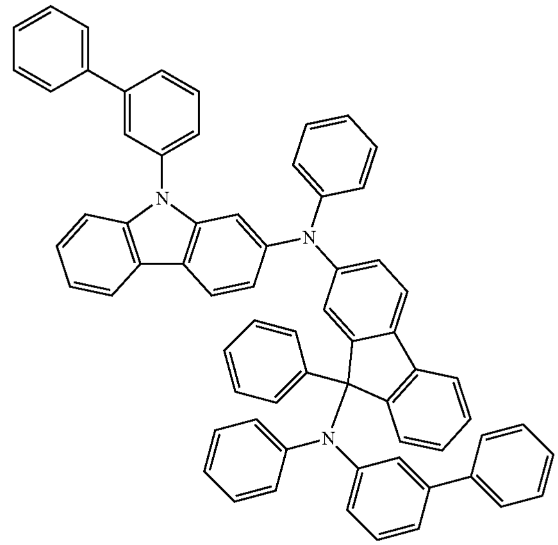
57
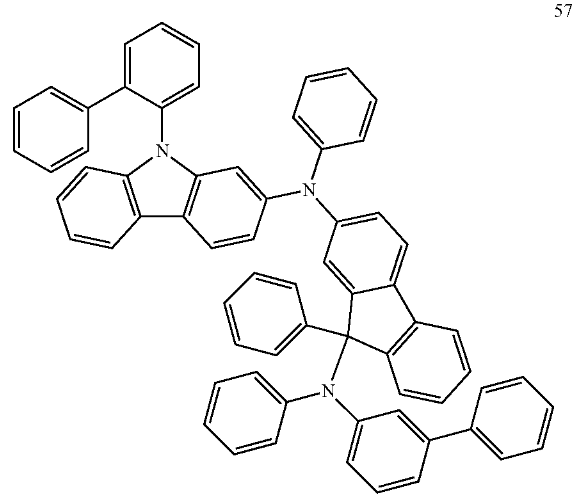
58
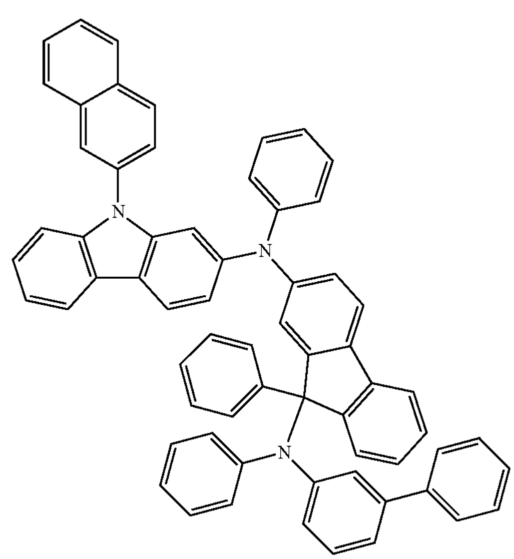

-continued
59
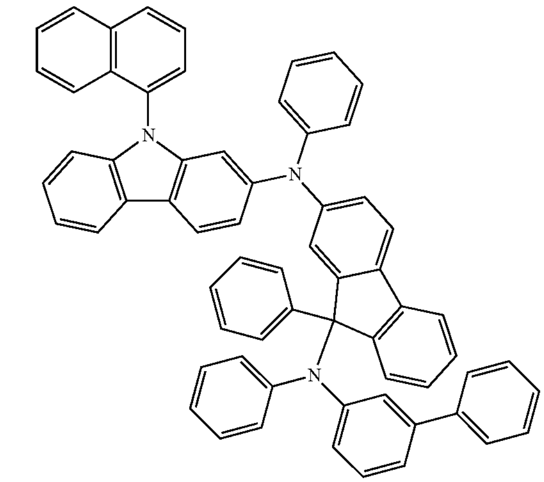
60
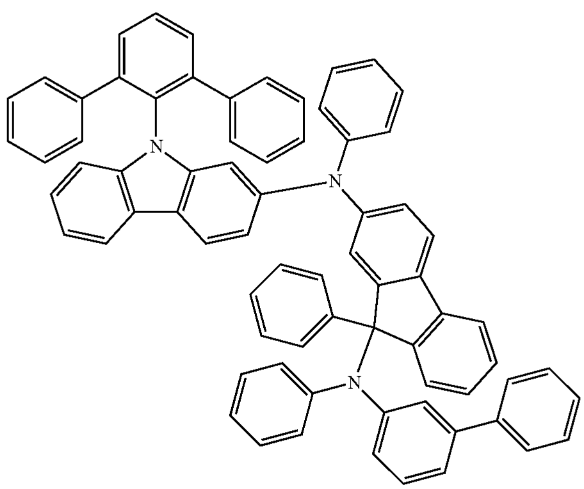
61
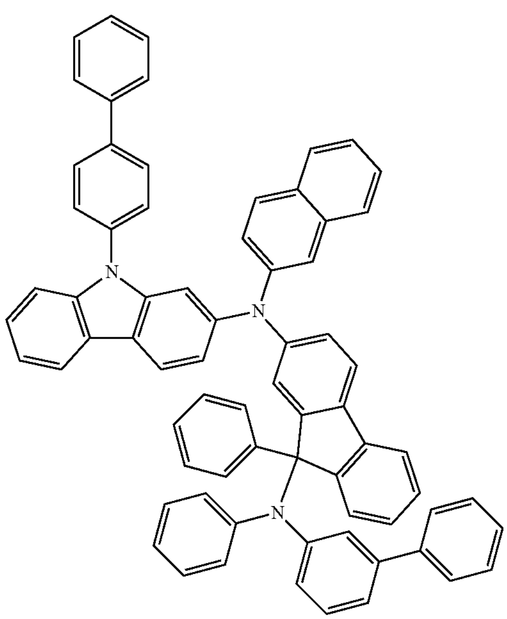
-continued
62
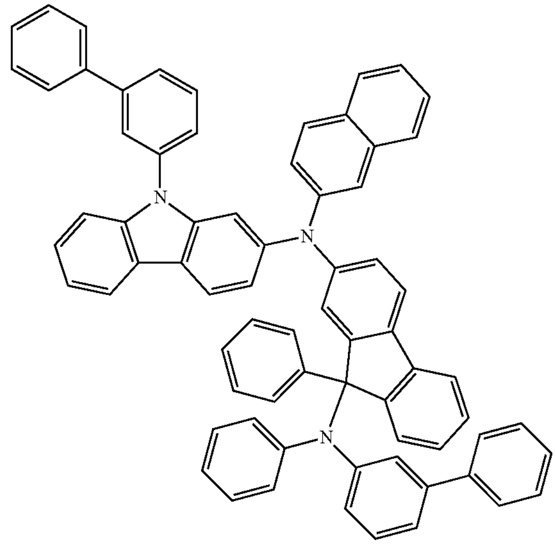
63
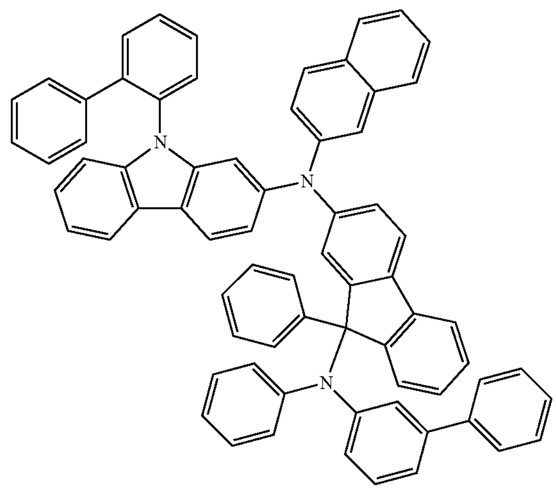
64
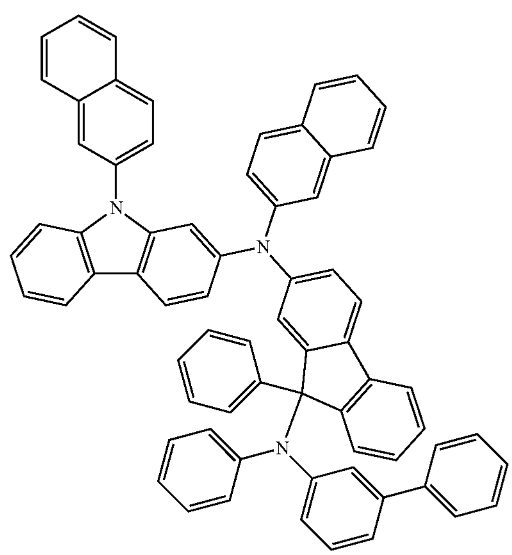

-continued
65
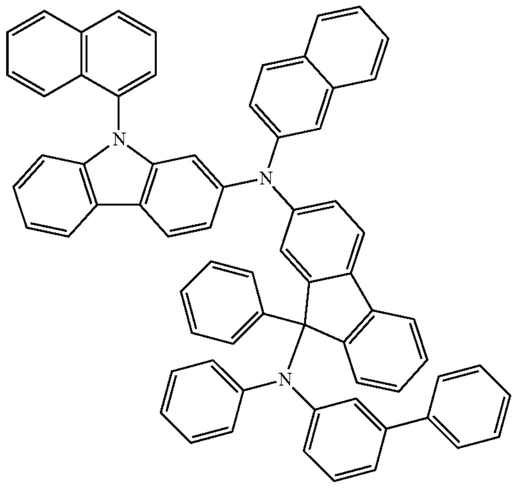
66
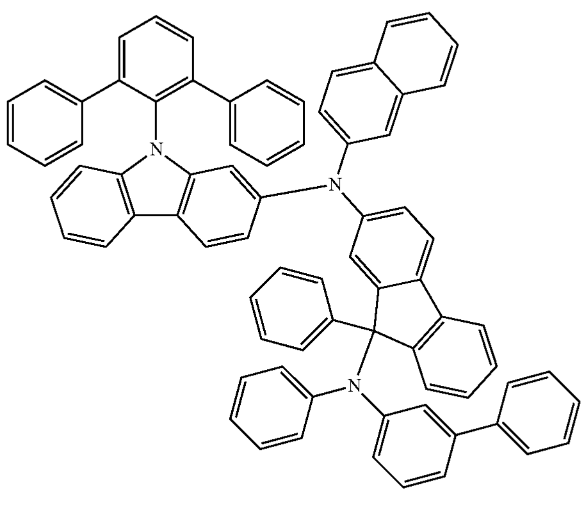
67
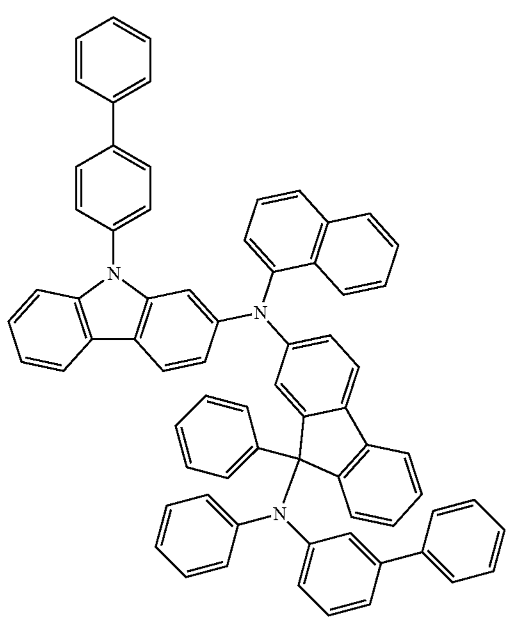
-continued
68
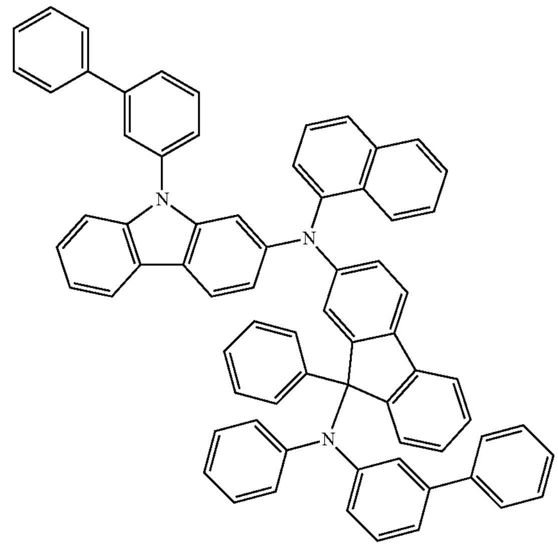
69
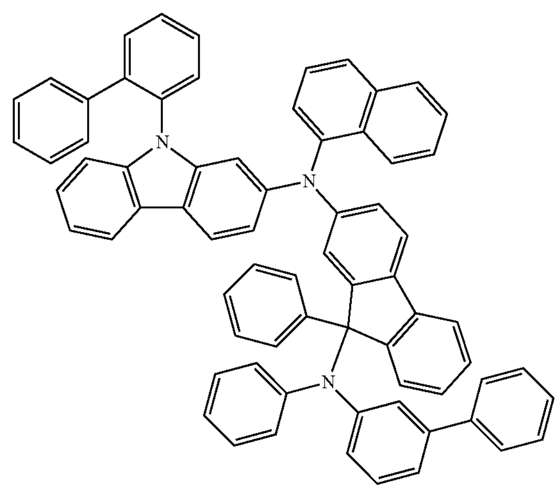
70
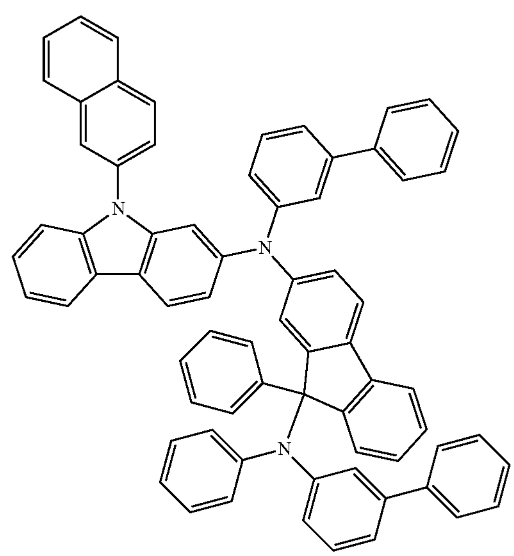

-continued
71
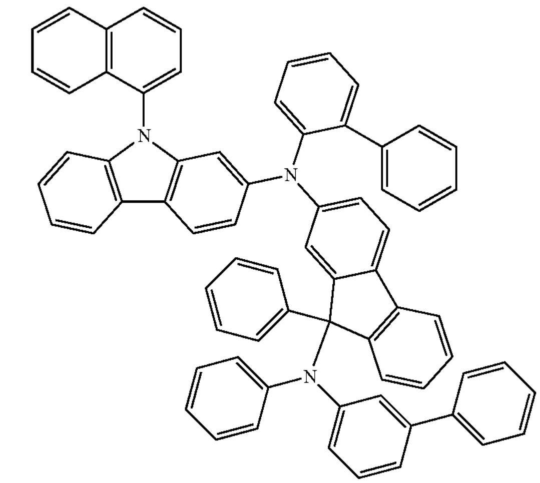
72
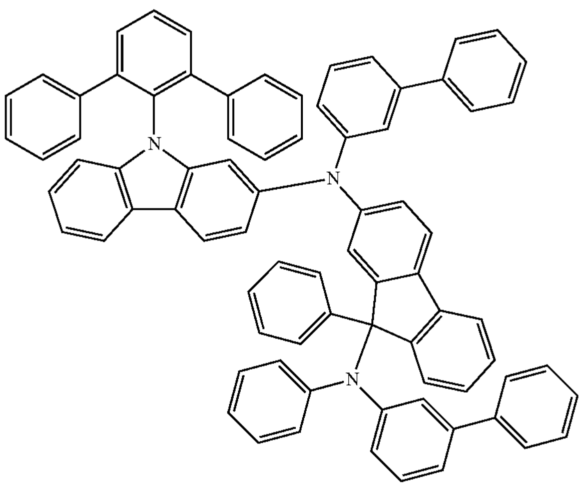
73
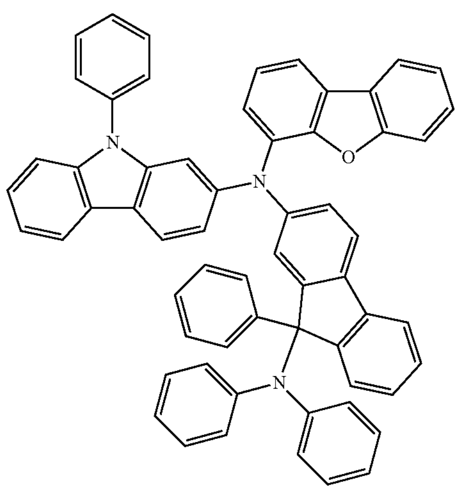
-continued
74
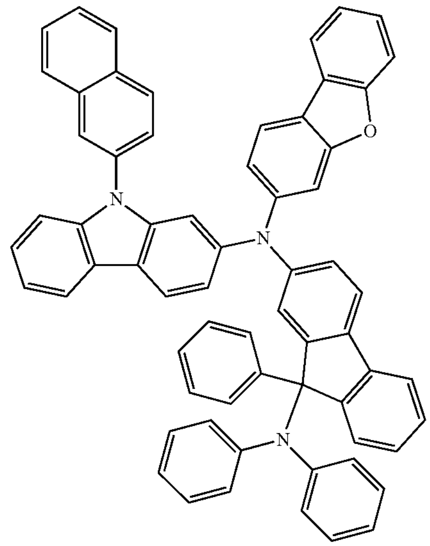
75
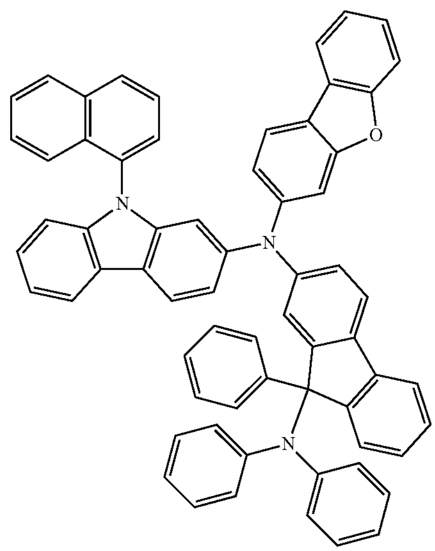
76
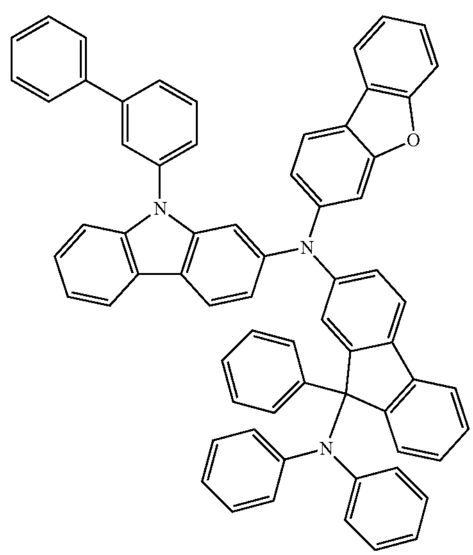

-continued
77
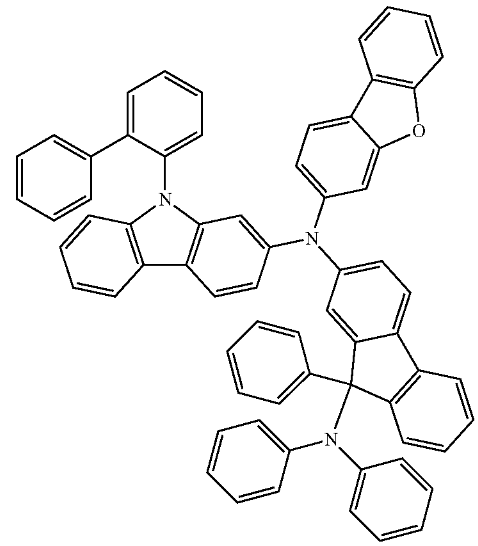
78
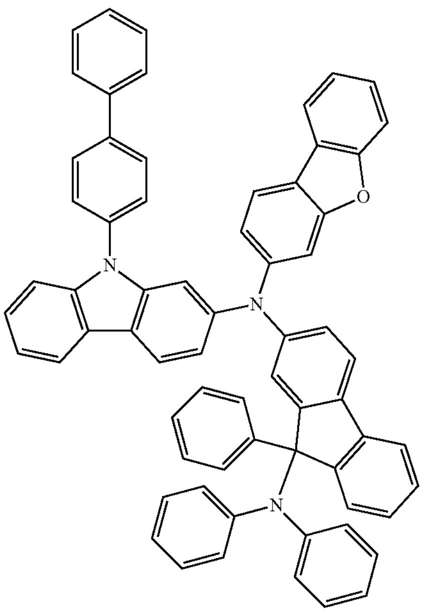
79
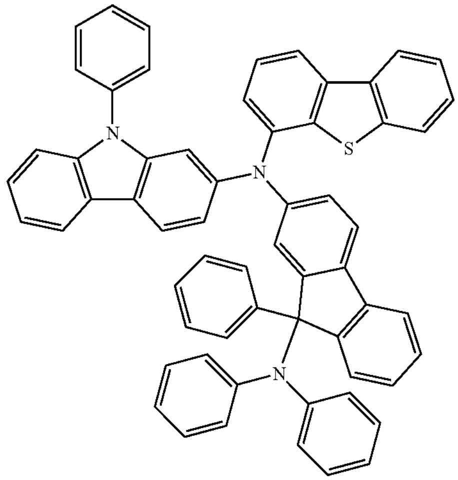
-continued
80
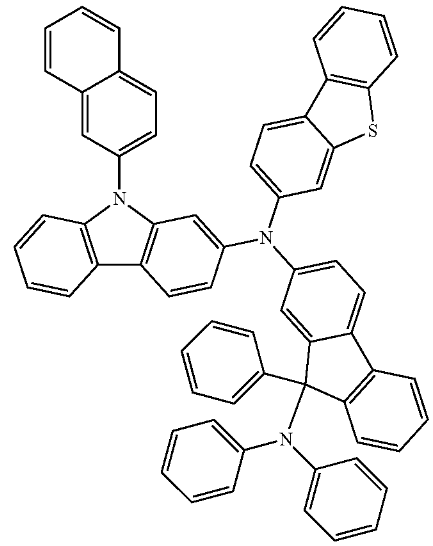
81
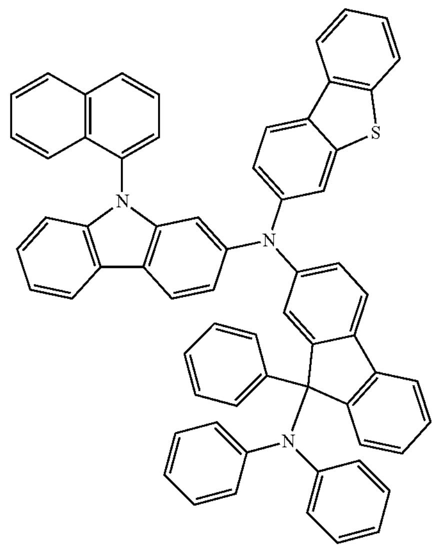
82
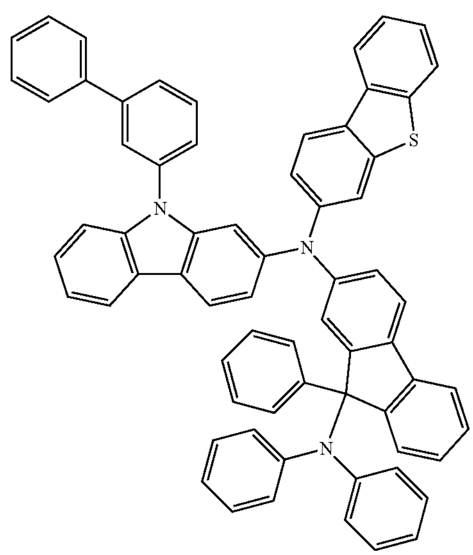

-continued
83
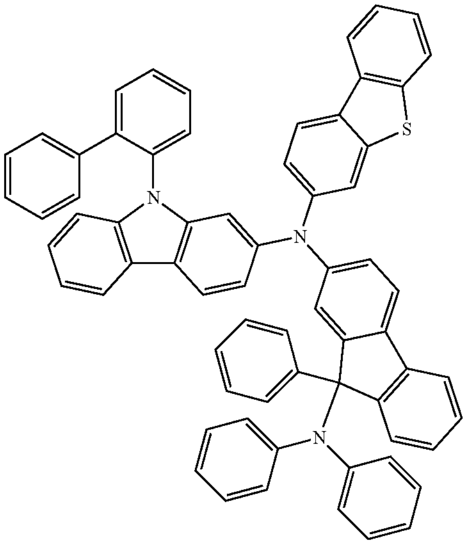
84
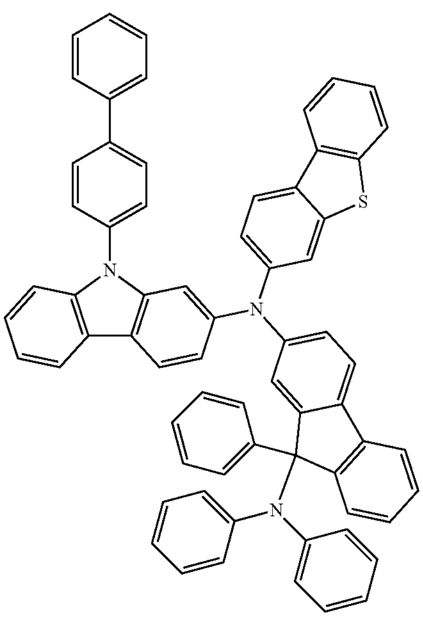
-continued
85
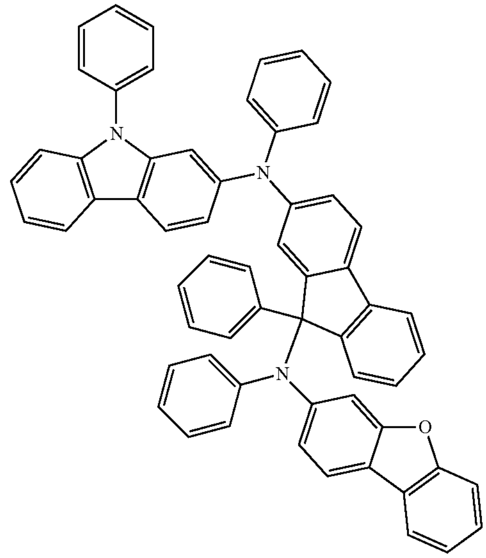
86
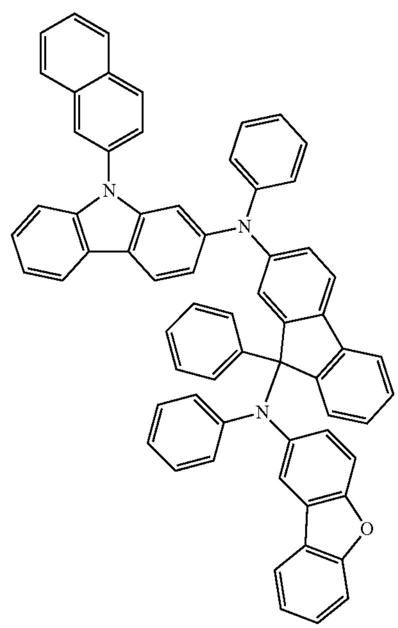

-continued
87
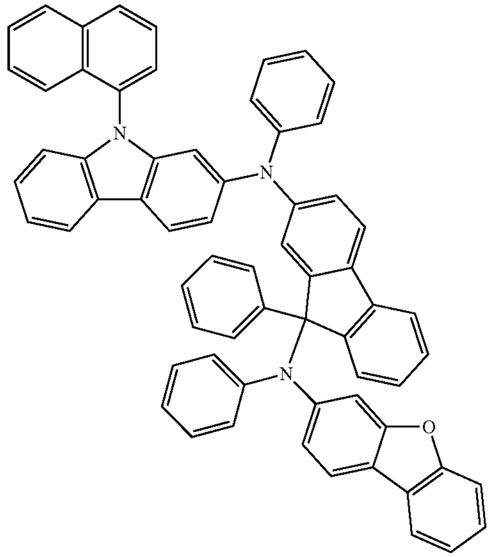
88
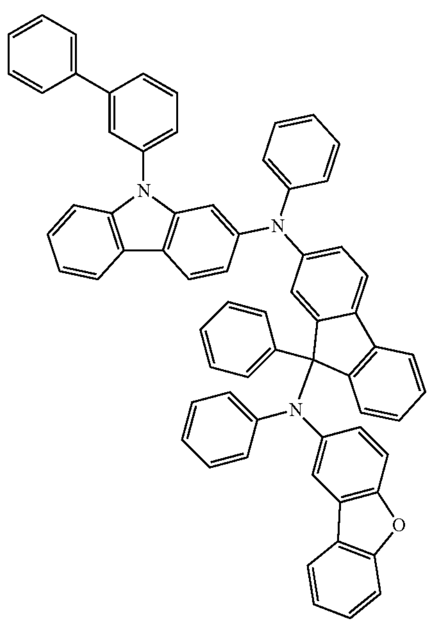
-continued
89
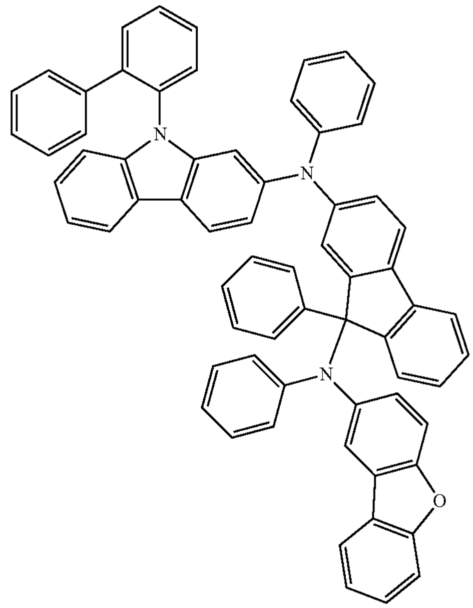
90
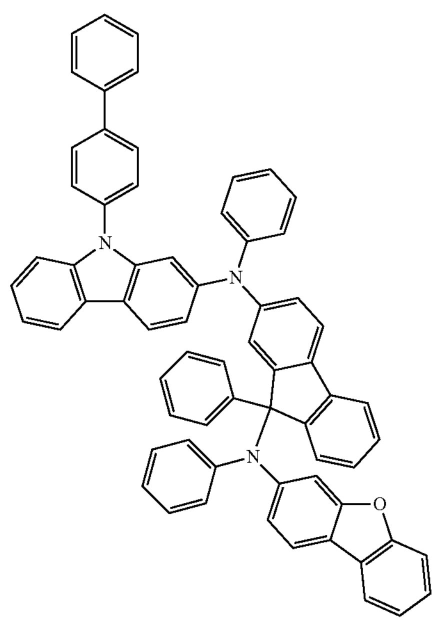

91
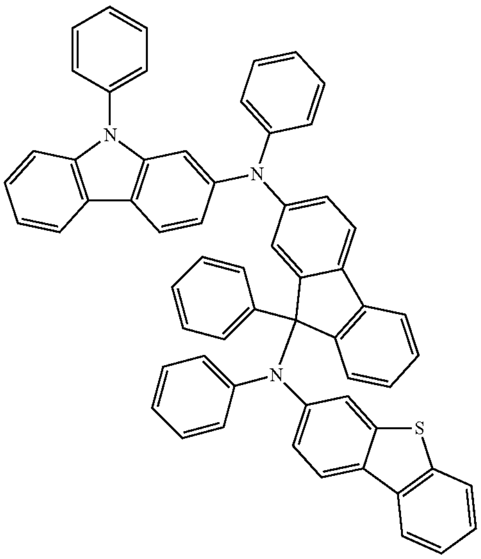
92
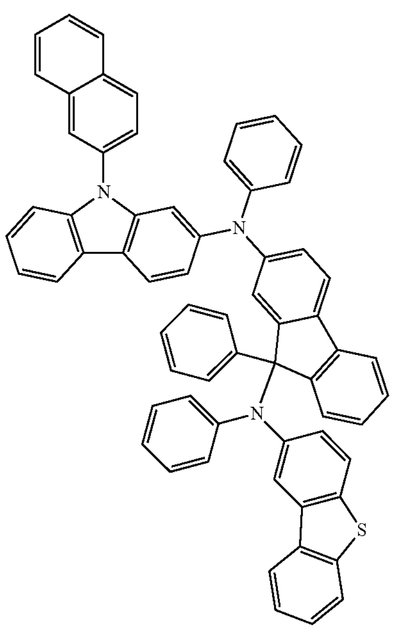
93
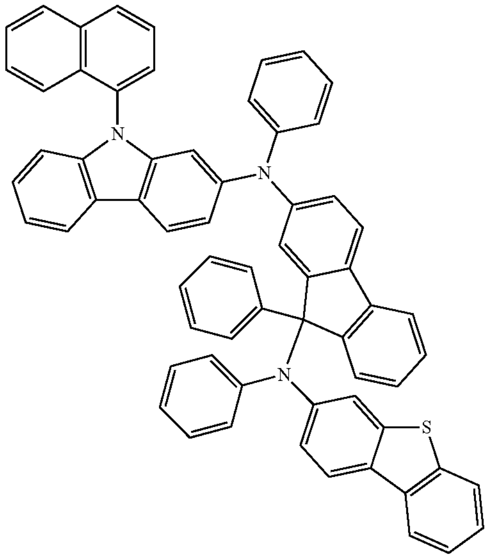
94
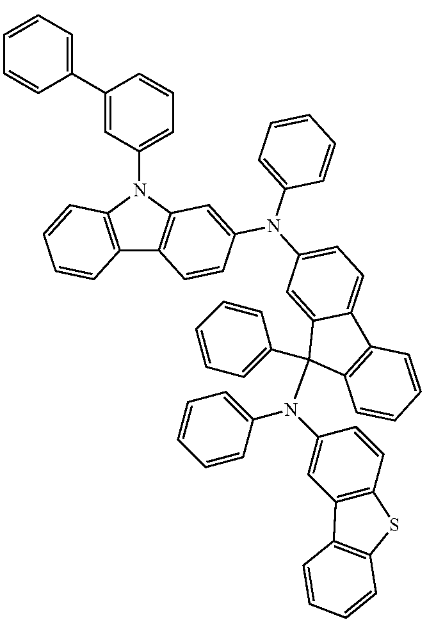

95
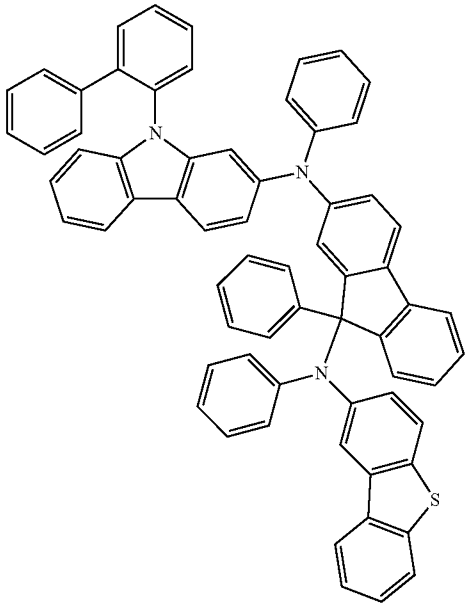
96
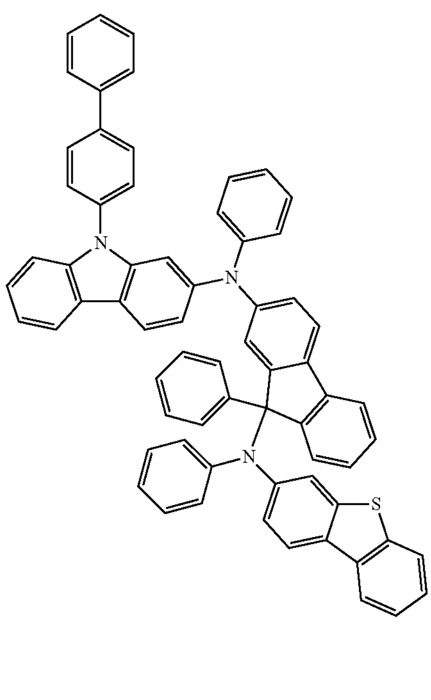
97
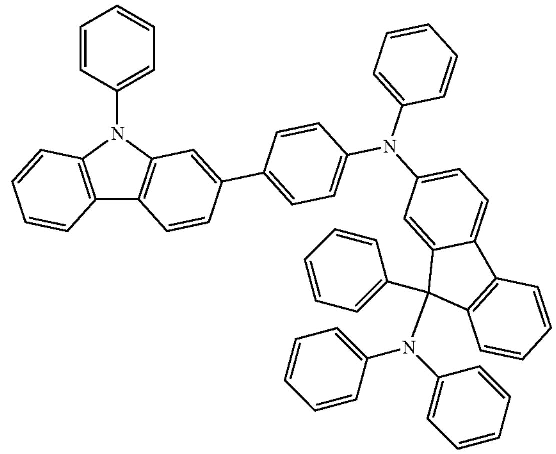
98
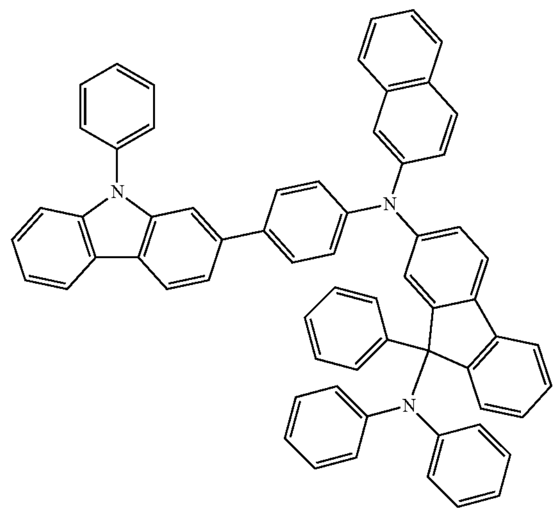
99
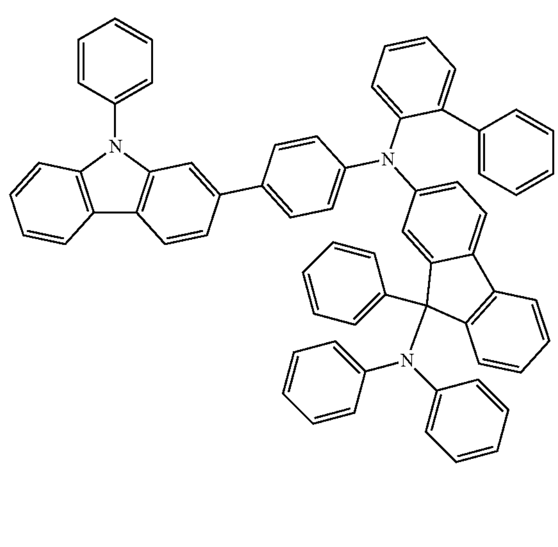

-continued
100
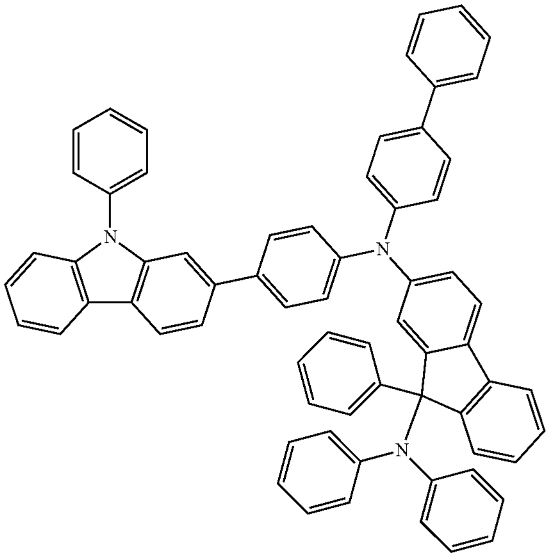
101
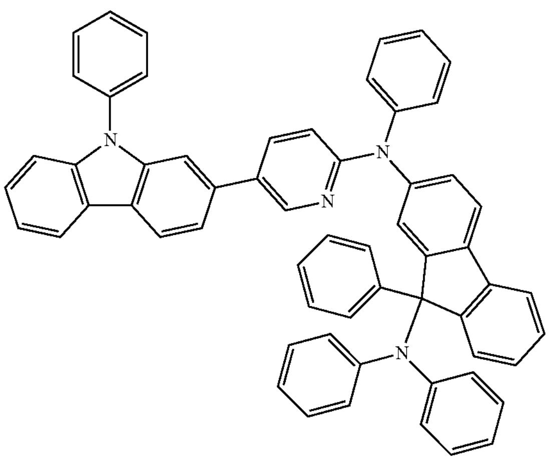
102
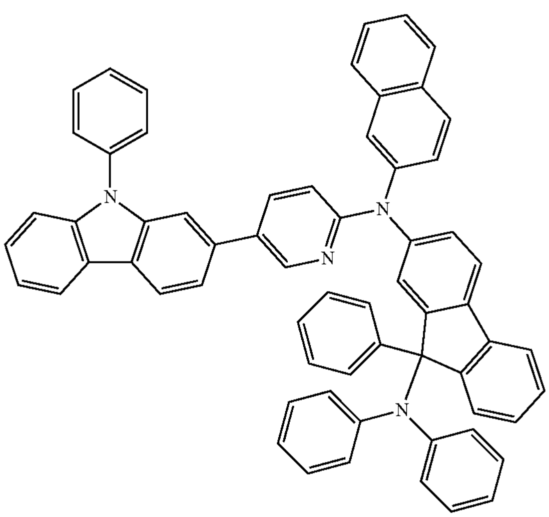
-continued
103
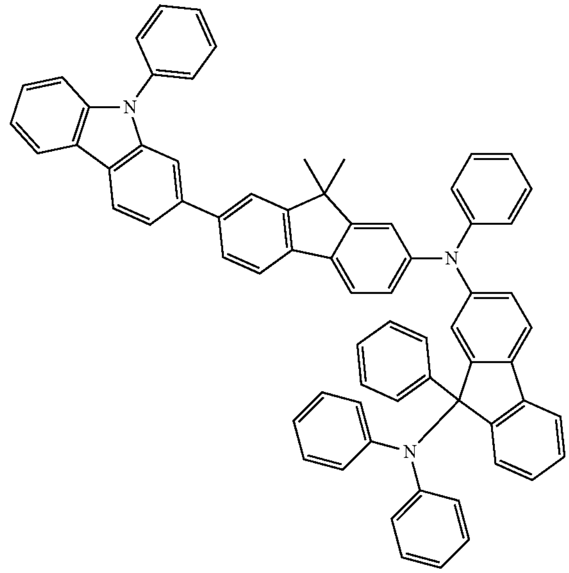
104
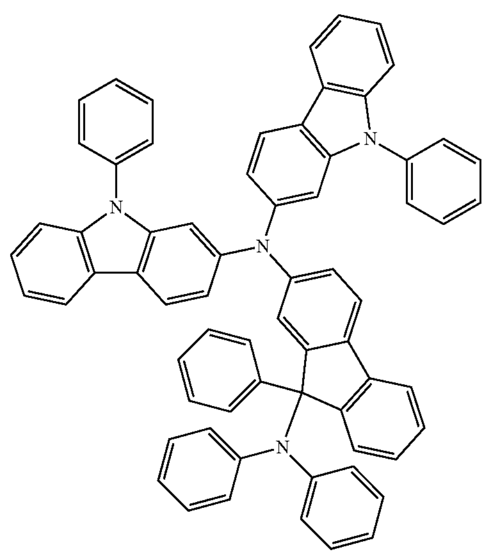

-continued

105

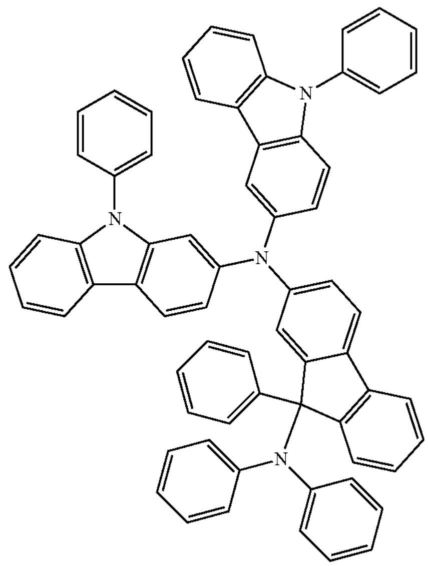

In the amine compound represented by Formula 1 of an embodiment, a substituted carbazole group and a substituted fluorenyl group may be bonded to a nitrogen atom. The substituted carbazole group may be substituted with a substituted or unsubstituted aryl group. In the substituted fluorenyl group, an amine group and an aryl group may be bonded to a carbon atom of the pentagonal ring of the fluorenyl group. An aryl group and a heteroaryl group may be bonded to the amine group. The aryl group and the heteroaryl group may each be substituted or unsubstituted. Since the nitrogen atom of the amine group bonded to the pentagonal ring of the substituted fluorenyl group includes an unshared electron pair, the amine compound of an embodiment may have improved charge-transport properties. In the hole transport region including the amine compound having improved charge-transport properties of an embodiment, the hole transport properties may be increased, and a recombination probability of holes and electrons may be improved in an emission layer. Accordingly, the light-emitting element including the amine compound of an embodiment may exhibit high efficiency and long service life characteristics.

The hole transport region HTR may include at least one of a hole injection layer HIL, a hole transport layer HTL, a buffer layer (not shown), a light-emitting auxiliary layer (not shown), or an electron blocking layer EBL. At least one of the hole injection layer HIL, the hole transport layer HTL, or the electron blocking layer EBL may include the amine compound of an embodiment. For example, in the hole transport region HTR, the hole transport layer HTL may include the amine compound of an embodiment. In another embodiment, in the hole transport region HTR, the hole transport layer HTL and the electron blocking layer EBL may each include an amine compound of an embodiment.

A thickness of the hole transport region may be, for example, in a range of about 50 Å to about 15,000 Å. The hole transport region HTR may be a layer formed of a single material, a layer formed of different materials, or a multi-layer structure having layers formed of different materials.

For example, the hole transport region HTR may have a structure of a single layer of a hole injection layer HIL, or may have a structure of a single layer formed of a hole injection material and a hole transport material. The hole transport region HTR may have a structure of a single layer formed of different materials, or a structure in which a hole injection layer HIL/a hole transport layer HTL, a hole injection layer HIL/a hole transport layer HTL/a buffer layer (not shown), a hole injection layer HIL/a buffer layer (not shown), a hole transport layer HTL/a buffer layer (not shown), or a hole injection layer HIL/a hole transport layer HTL/an electron blocking layer EBL, are stacked in its respective stated order from the first electrode ELL However, embodiments are not limited thereto.

The hole transport region HTR may be formed by using various methods such as a vacuum deposition method, a spin coating method, a cast method, a Langmuir-Blodgett (LB) method, an inkjet printing method, a laser printing method, and a laser induced thermal imaging (LITI) method.

The light-emitting element ED of an embodiment may further include a hole transport material, in addition to the amine compound of an embodiment stated above. The hole transport region HTR may include a compound represented by Formula H-1 below.

[Formula H-1]

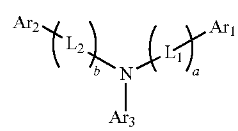

In Formula H-1 above, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a or b is at least 2, multiple $L_1$ groups and multiple $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, An and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

A compound represented by Formula H-1 may be a monoamine compound. In another embodiment, a compound represented by Formula H-1 may be a diamine compound in which at least one of $Ar_1$ to $Ar_3$ includes an amine group as a substituent. For example, a compound represented by Formula H-1 may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

A compound represented by Formula H-1 may be any one selected from Compound Group H below. However, the compounds listed in Compound Group H below are examples, and the compounds represented by Formula H-1 are not limited to those in Compound Group H below.

[Compound Group H]
H-1-1
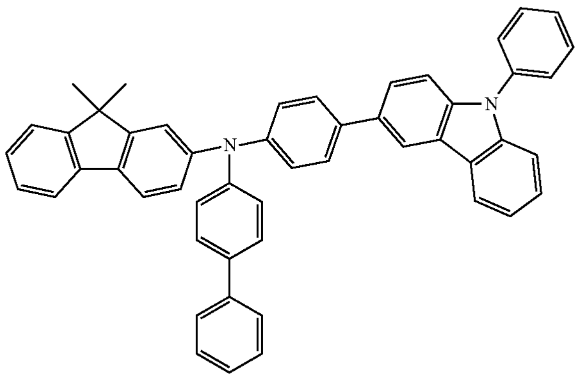
H-1-2
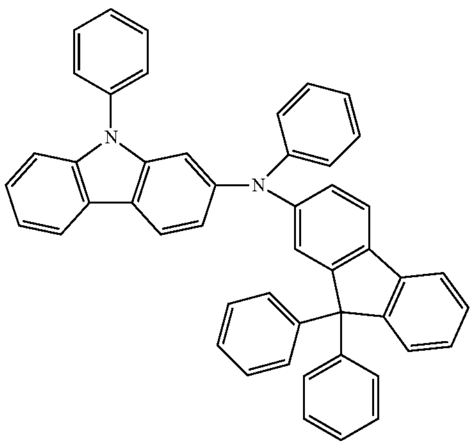
H-1-3
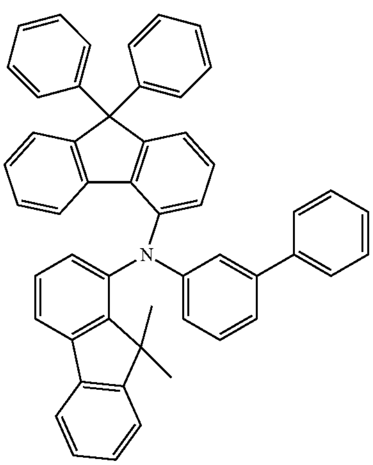
-continued
H-1-4
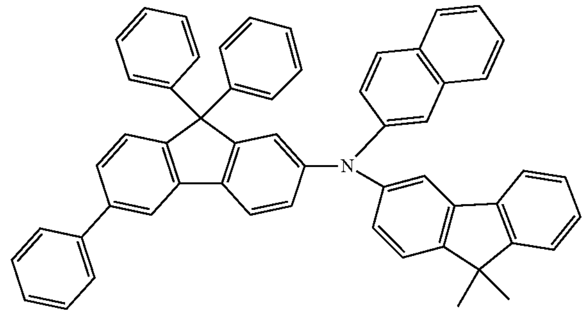
H-1-5
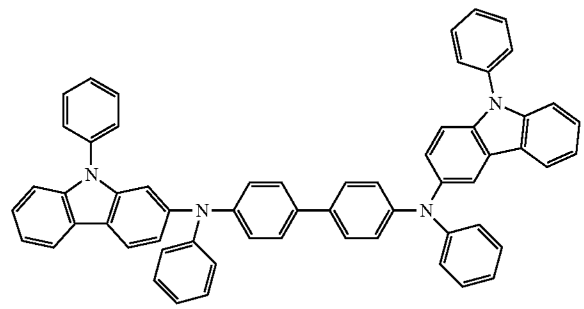
H-1-6
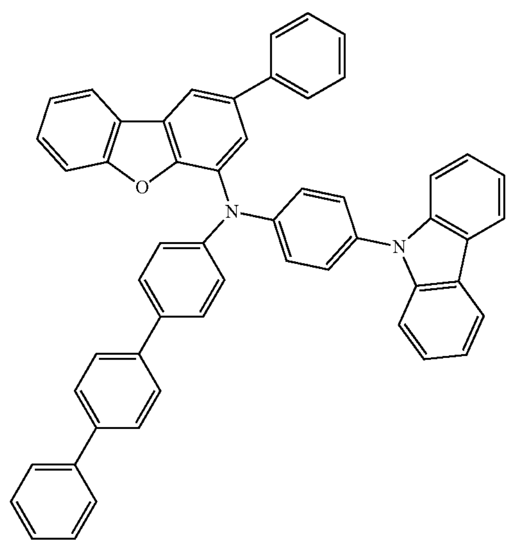

-continued
H-1-7
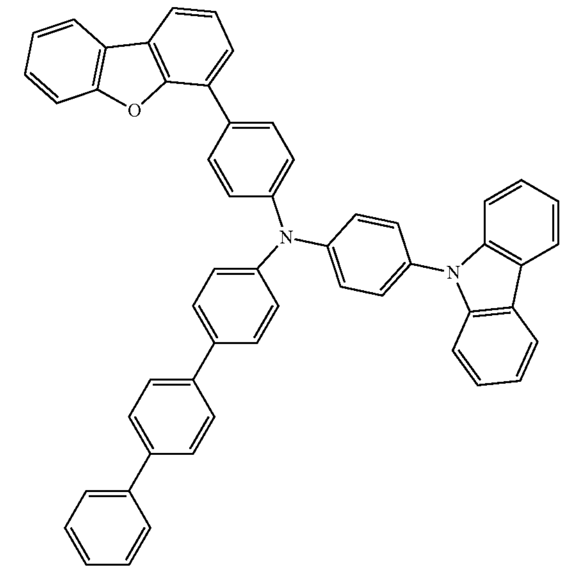
H-1-8
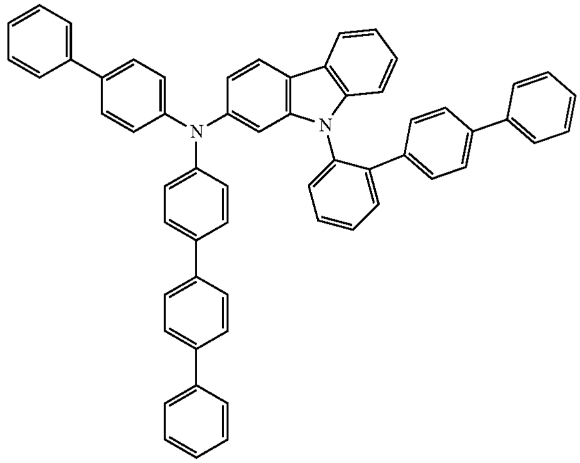
H-1-9
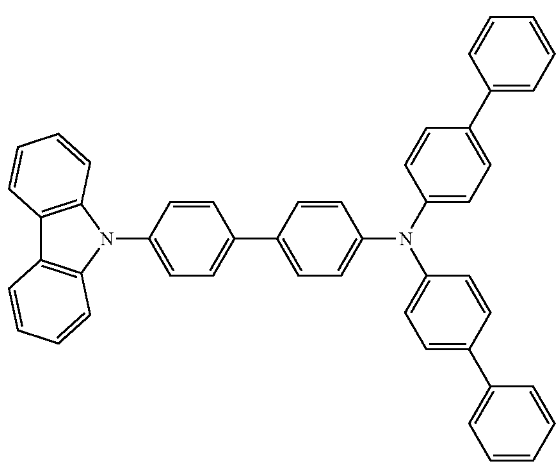
-continued
H-1-10
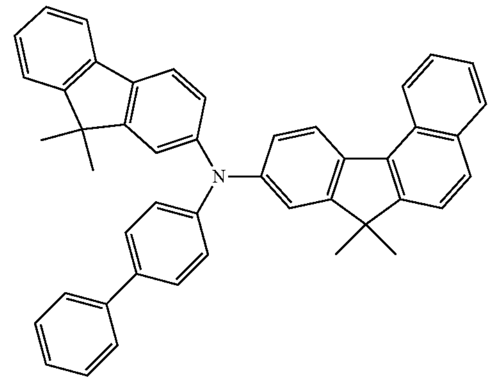
H-1-11
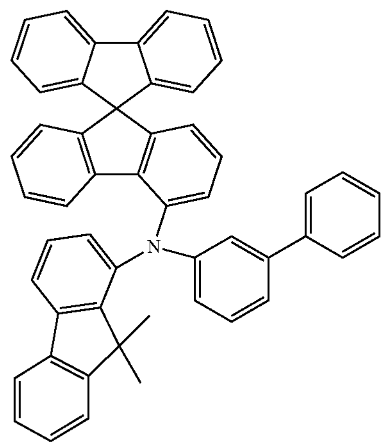
H-1-12
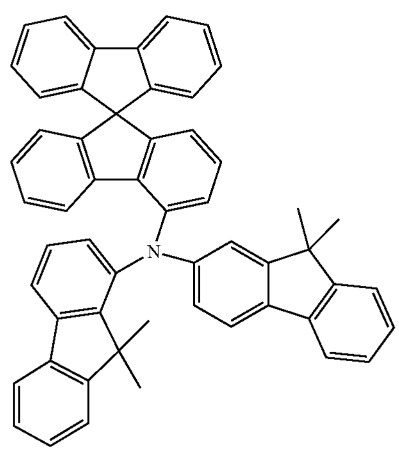
H-1-13
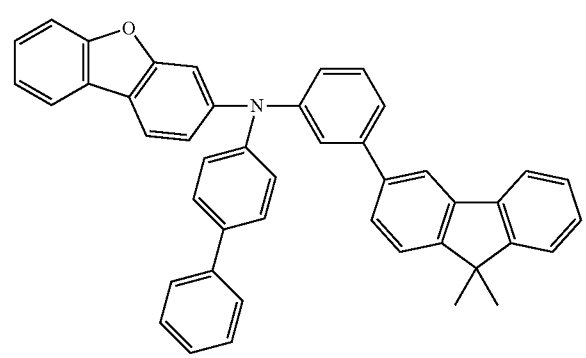

-continued

H-1-14

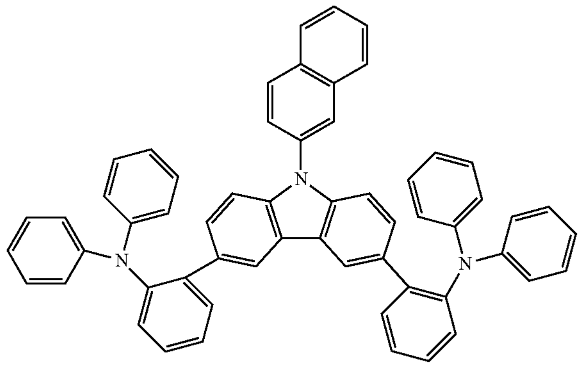

H-1-15

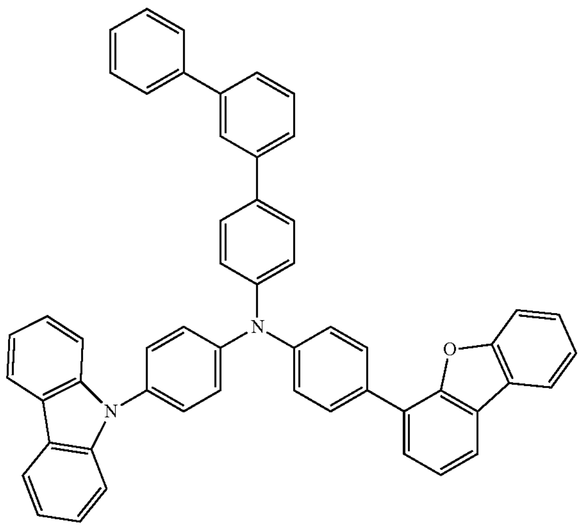

H-1-16

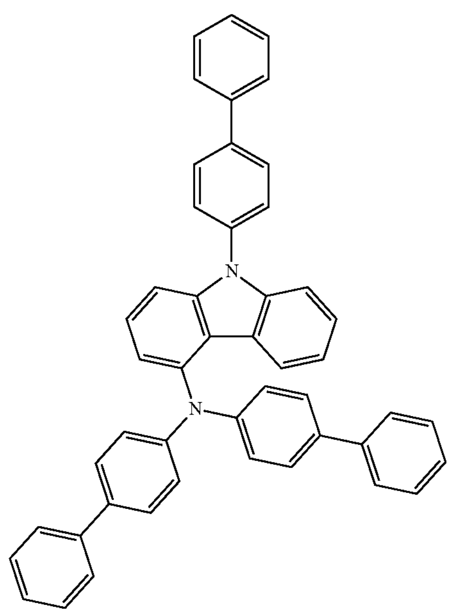

-continued

H-1-17

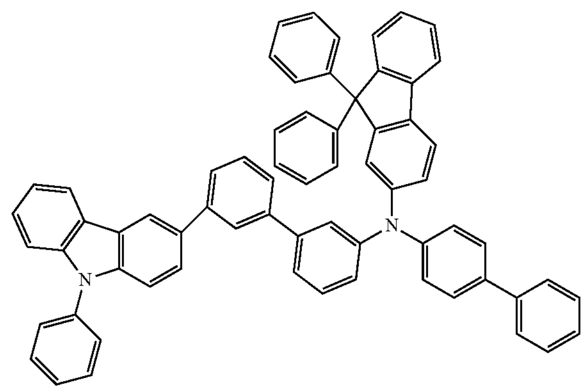

H-1-18

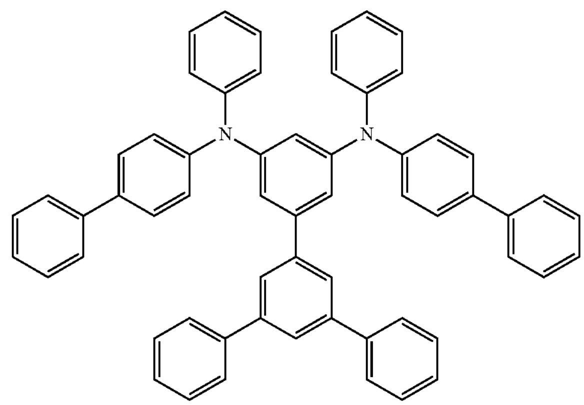

H-1-19

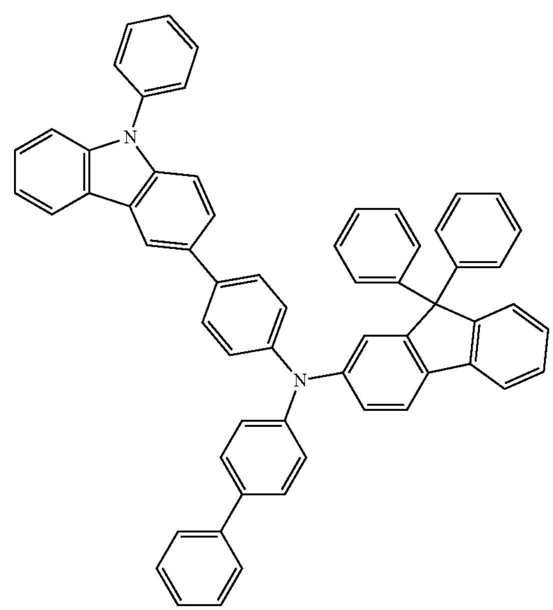

The hole transport region HTR may further include a phthalocyanine compound such as copper phthalocyanine, $N^1,N^{1'}$-([1,1'-biphenyl]-4,4'-diyl)bis($N^1$-phenyl-$N^4,N^4$-di-m-tolylbenzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly (4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may further include a carbazole-based derivative such as N-phenyl carbazole and polyvinyl carbazole, a fluorene-based derivative, N,N'-bis(3-methylphenyl)-N,N'-diphenyl-[1,1-biphenyl]-4,4'-diamine (TPD), a triphenylamine-based derivative such as 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), or the like.

The hole transport region HTR may include the above-described compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, the thickness of the hole transport region HTR may be in a range of about 100 Å to about 5,000 Å. When the hole transport region HTR includes a hole injection layer HIL, the hole injection layer HIL may have, for example, a thickness in a range of about 30 Å to about 1,000 Å. When the hole transport region HTR includes a hole transport layer HTL, a thickness of the hole injection layer HIL may, for example, be in a range of about 30 Å to about 1,000 Å. When the hole transport region HTR includes an electron blocking layer EBL, a thickness of the electron blocking layer EBL may be in a range of about 10 Å to about 1,000 Å. When the thicknesses of the hole transport region HTR, the hole injection layer HIL, the hole transport layer HTL, and the electron blocking layer EBL satisfy the above-described ranges, satisfactory hole transport properties may be achieved without a substantial increase of a driving voltage.

The hole transport region HTR may further include a charge generating material in order to increase conductivity, in addition to the above-described materials. The charge generating material may be uniformly or non-uniformly dispersed in the hole transport region HTR. The charge generating material may, for example, be a p-dopant. The p-dopant may include at least one of a halogenated metal compound, a quinone derivative, a metal oxide, or a cyano group-containing compound, but embodiments are not limited thereto. For example, the p-dopant may include metal halides such as CuI and RbI, quinone derivatives such as tetracyanoquinodimethane (TCNQ) and 2,3,5,6-tetrafluoro-7,7'8,8-tetracyanoquinodimethane (F4-TCNQ), metal oxides such as tungsten oxide and molybdenum oxide, and cyano group-containing compounds such as dipyrazino[2,3-f: 2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), but embodiments are not limited thereto.

As described above, the hole transport region HTR may further include at least one of a buffer layer (not shown) or an electron blocking layer EBL, in addition to the hole injection layer HIL and the hole transport layer HTL. The buffer layer (not shown) may compensate for an optical resonance distance according to a wavelength of light emitted from the emission layer EML, thereby improving light-emitting efficiency. Materials which may be included in the hole transport region HTR may be used as materials to be included in the buffer layer (not shown). The electron blocking layer EBL may prevent electron injection from the electron transport region ETR to the hole transport region HTR.

The emission layer EML is provided on the hole transport region HTR. In the light-emitting element ED of an embodiment, the emission layer EML may include the above-described amine compound of an embodiment. The amine compound of an embodiment may be used as a dopant material or a host material in the emission layer EML.

In the light-emitting element ED of an embodiment, the emission layer EML may include an anthracene derivative, a pyrene derivative, a fluoranthene derivative, a chrysene derivative, a dihydrobenzanthracene derivative, or a triphenylene derivative. For example, the emission layer EML may include an anthracene derivative or a pyrene derivative.

In the light-emitting elements ED of embodiments illustrated in FIG. 3 to FIG. 6, the emission layer EML may include a host and a dopant, and the emission layer EML may include a compound represented by Formula E-1 below. The compound represented by Formula E-1 below may be used as a fluorescent host material.

Formula E-1

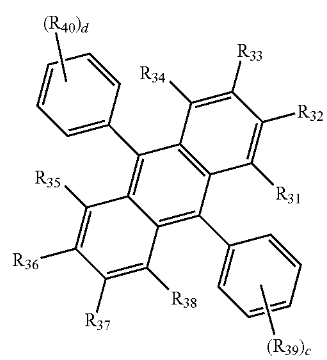

In Formula E-1, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring or an unsaturated hydrocarbon ring.

In Formula E-1, c and d may each independently be an integer from 0 to 5. The compound represented by Formula E-1 may be any one selected from Compound E1 to Compound E19 below.

E1
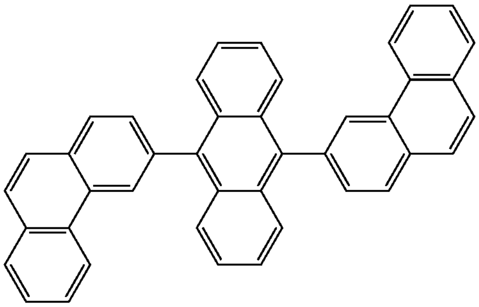
E2
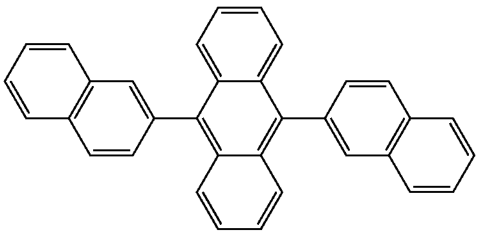
E3
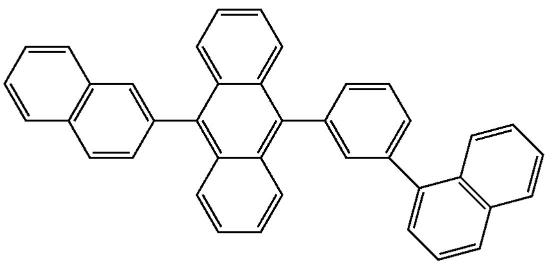
E4
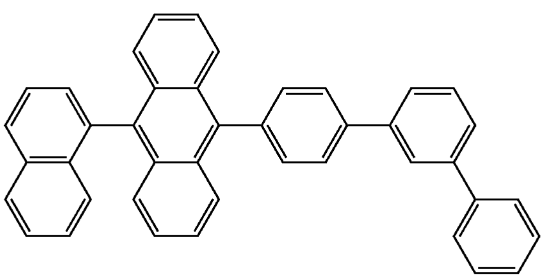
E5
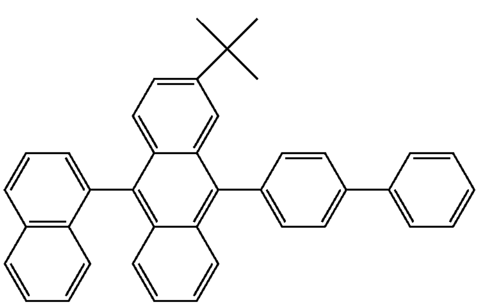
-continued
E6
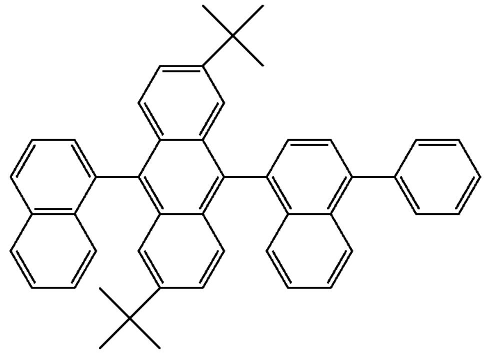
E7
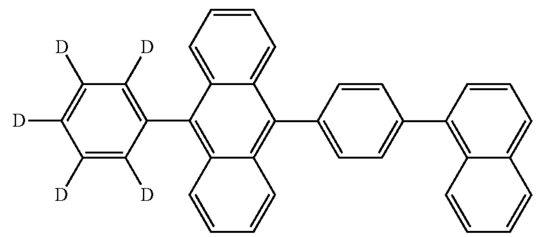
E8
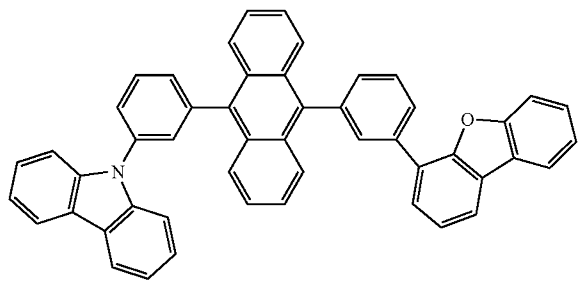
E9
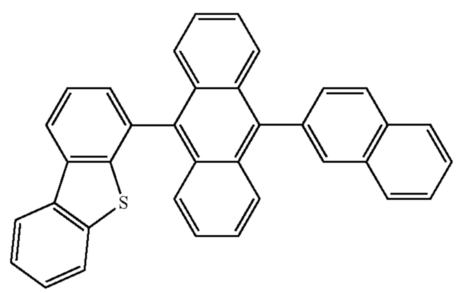
E10
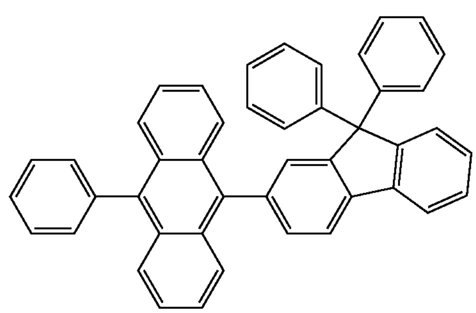

-continued
E11
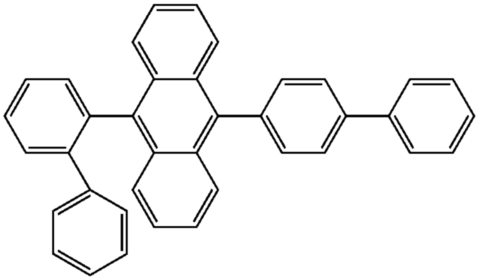
E12
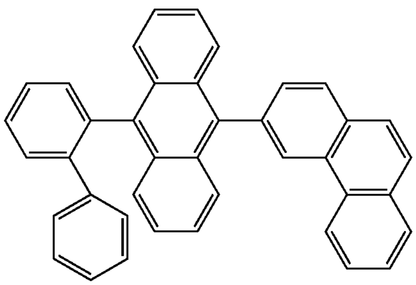
E13
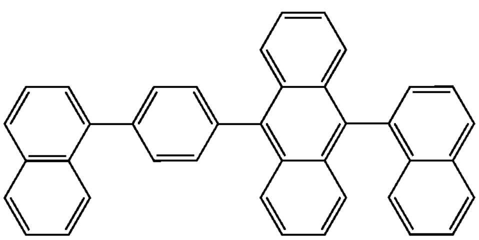
E14
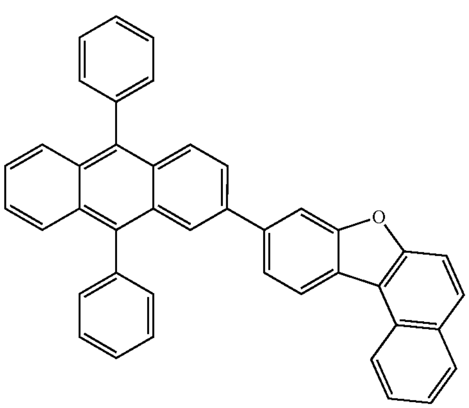
-continued
E15
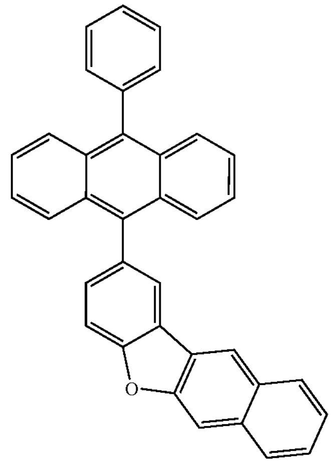
E16
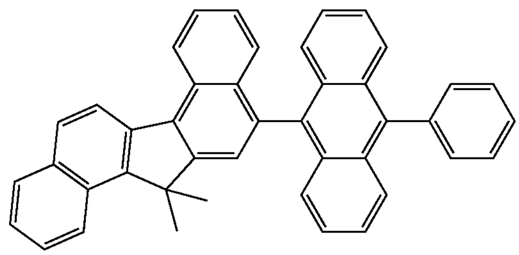
E17
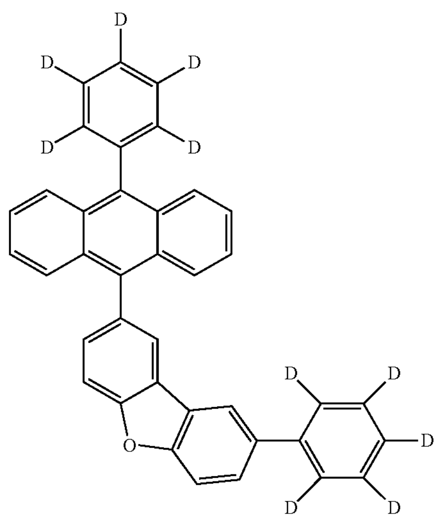
E18
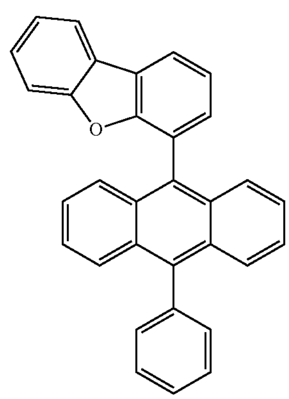

-continued

E19

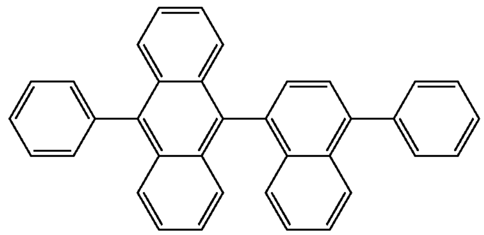

In an embodiment, the emission layer EML may include a compound represented by Formula E-2a or Formula E-2b below. The compound represented by Formula E-2a or Formula E-2b below may be used as a phosphorescent host material.

[Formula E-2a]

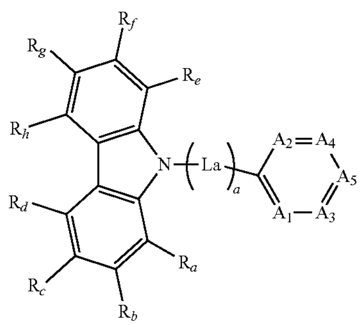

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or more, multiple $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(\text{Cbz1}) \!\!-\!\!\left(L_b\right)_{b}\!\!-\!\! \text{Cbz2})$$

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is at least 2, multiple $L_b$ groups may each independently be a substituted or unsubstituted arylene group having 6 to 30 ring-forming carbon atoms, or a substituted or unsubstituted heteroarylene group having 2 to 30 ring-forming carbon atoms.

A compound represented by Formula E-2a or Formula E-2b may be any one selected from Compound Group E-2 below. However, the Compounds listed in Compound Group E-2 below are example, and the compound represented by Formula E-2a or Formula E-2b is not limited to those listed in Compound Group E-2 below.

[Compound Group E-2]

E-2-1

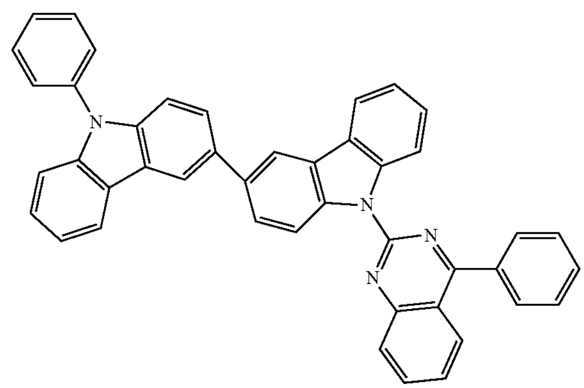

E-2-2

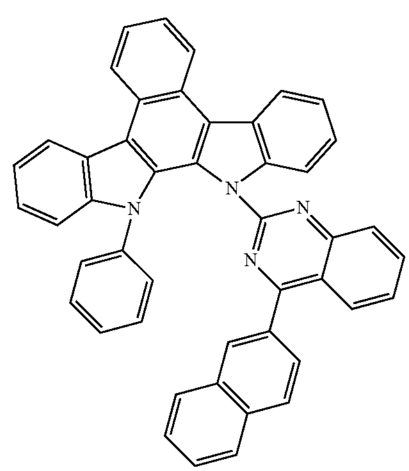

-continued
E-2-3
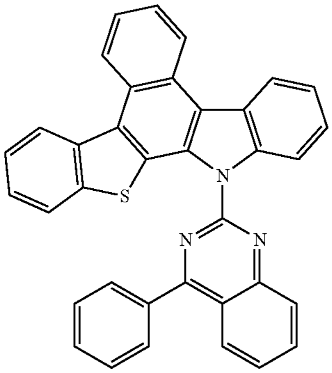
E-2-4
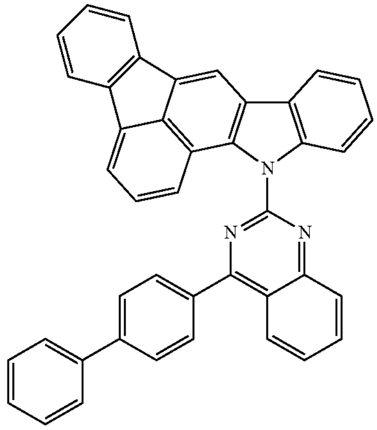
E-2-5
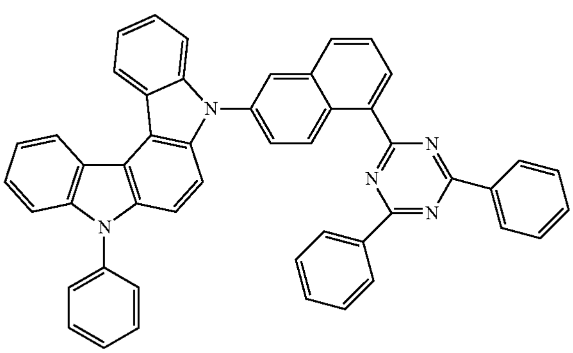
E-2-6
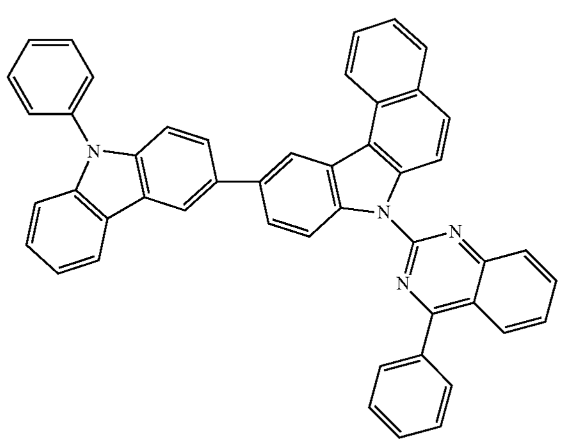
-continued
E-2-7
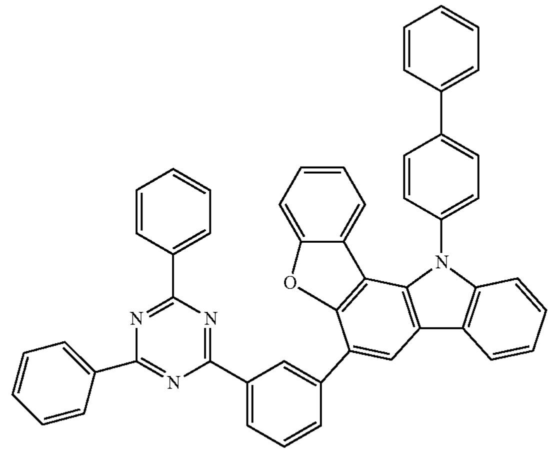
E-2-8
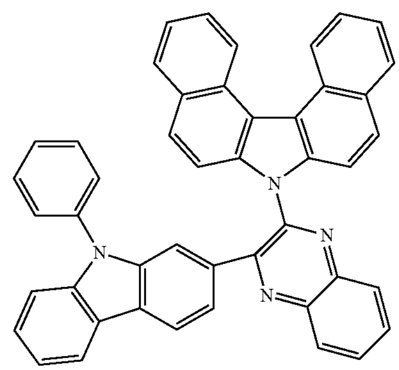
E-2-9
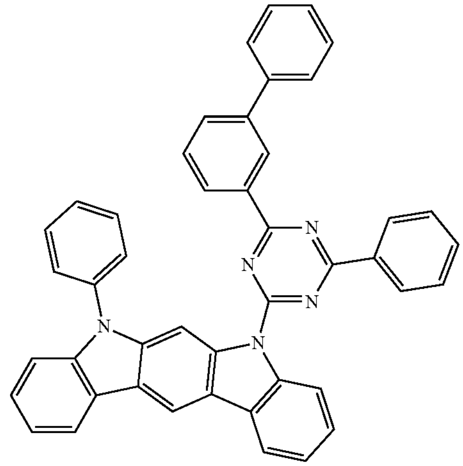

-continued
E-2-10
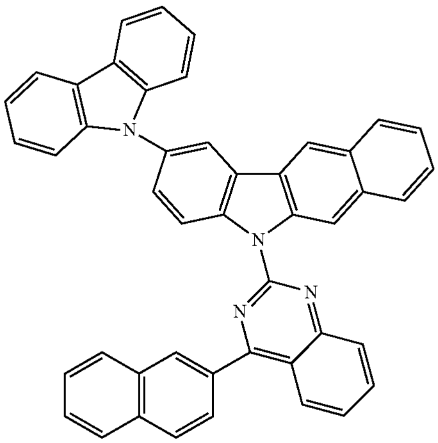
E-2-11
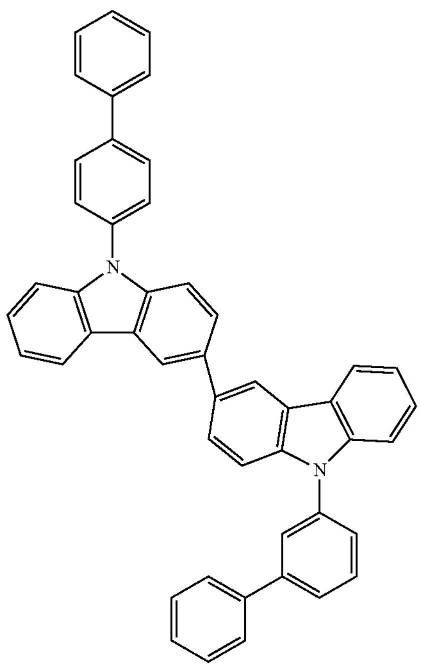
E-2-12
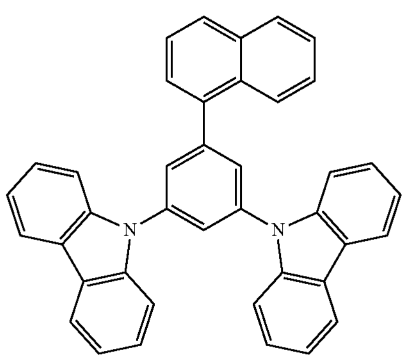
-continued
E-2-13
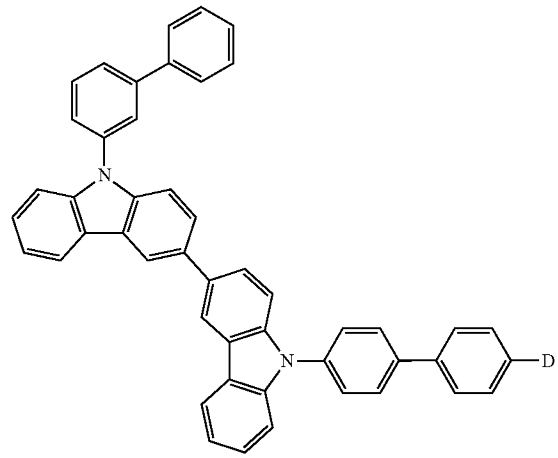
E-2-14
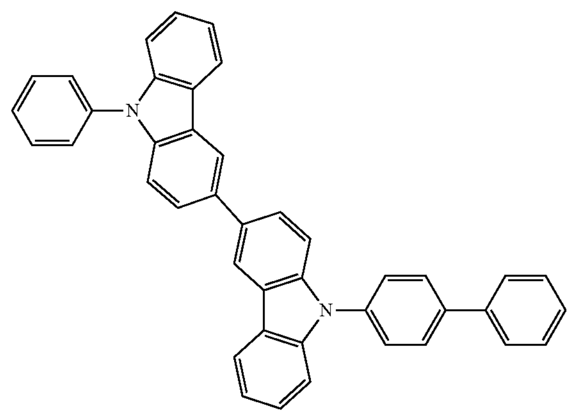
E-2-15
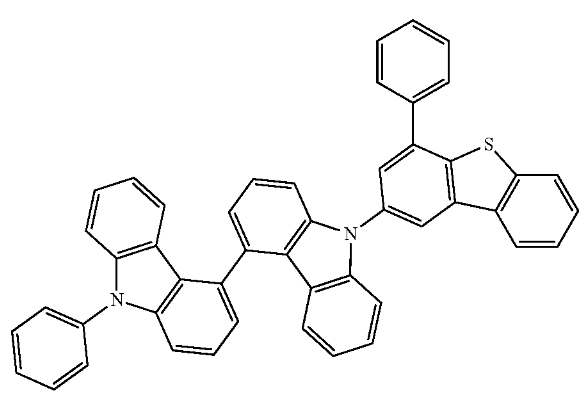

-continued
E-2-16
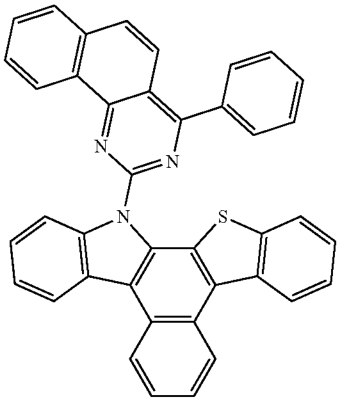
E-2-17
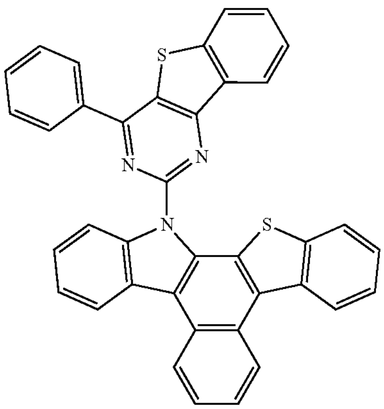
E-2-18
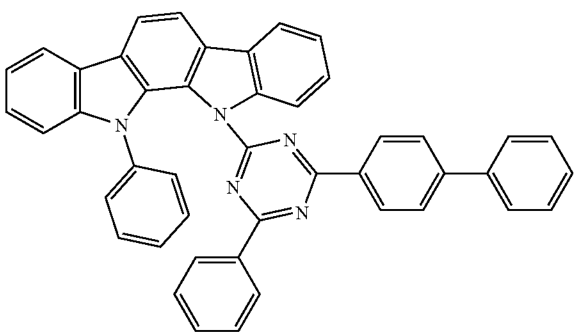
E-2-19
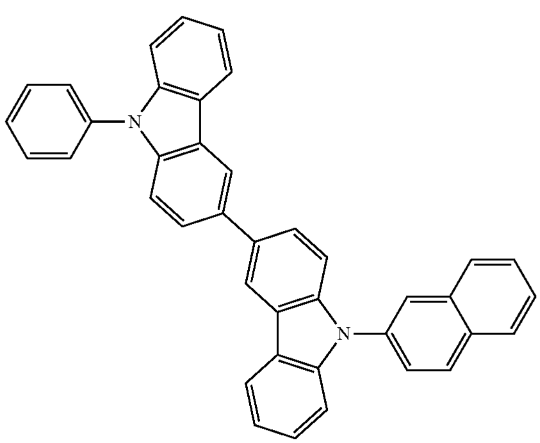
-continued
E-2-20
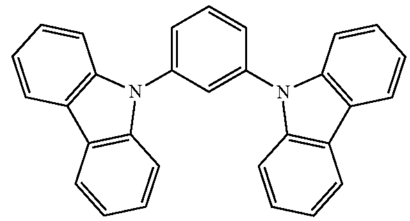
E-2-21
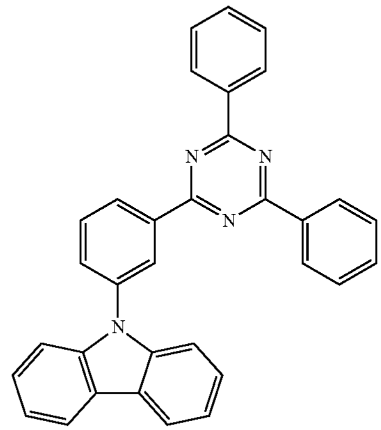
E-2-22
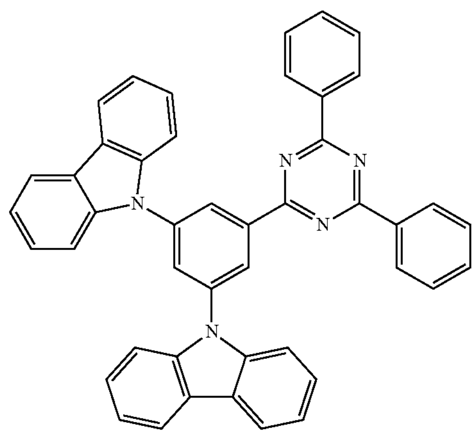
E-2-23
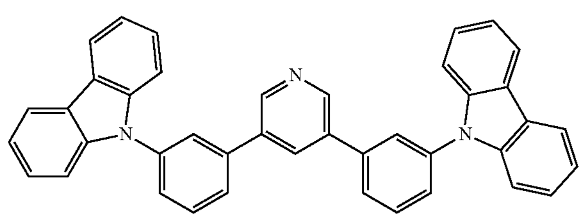

-continued

E-2-24

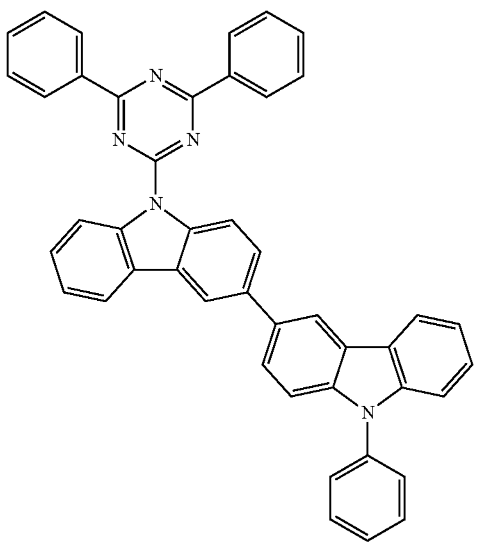

The emission layer EML may further include a common material in the art as a host material. For example, the emission layer EML may include, as a host material, at least one of bis[2-(diphenylphosphino)phenyl] ether oxide (DPEPO), 4,4'-bis(N-carbazolyl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments are not limited thereto, and for example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be used as a host material.

The emission layer EML may include a compound represented by Formula M-a or Formula M-b below. A compound represented by Formula M-a or Formula M-b below may be used as a phosphorescent dopant material.

[Formula M-a]

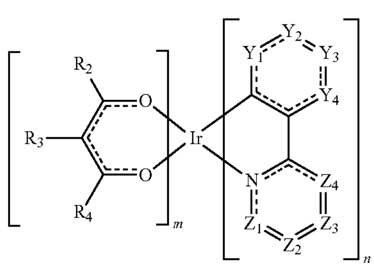

In Formula M-a above, $Y_1$ to $Y_4$ and $Z_1$ to $Z_4$ may each independently be $C(R_1)$ or N, $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

A compound represented by Formula M-a may be used as a phosphorescent dopant.

The compound represented by Formula M-a may be any one selected from Compounds M-a1 to M-a25 below. However, Compounds M-a1 to M-a25 below are examples, and the compound represented by Formula M-a is not limited to Compounds M-a1 to M-a25 below.

M-a1

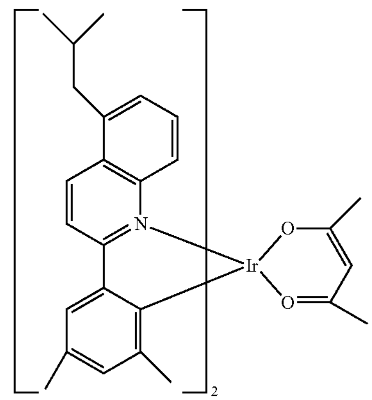

M-a2

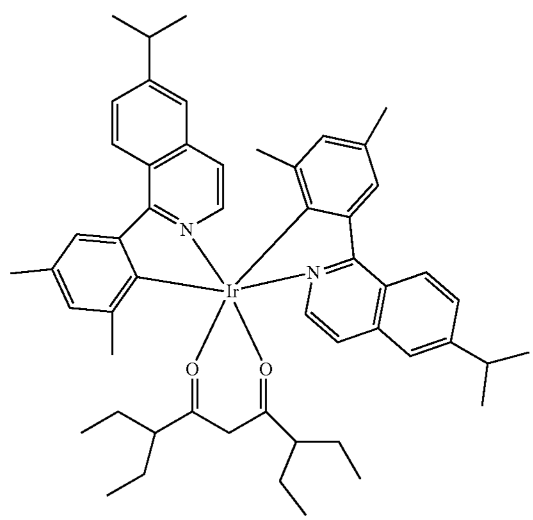

M-a3

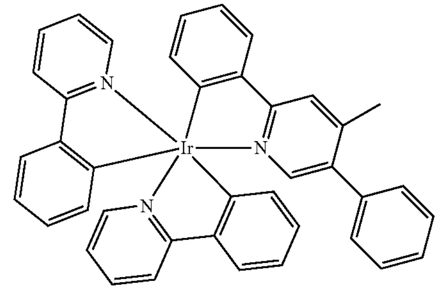

-continued
M-a4
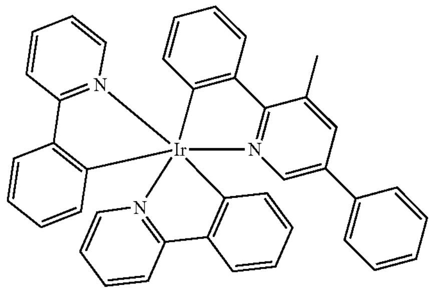
M-a5
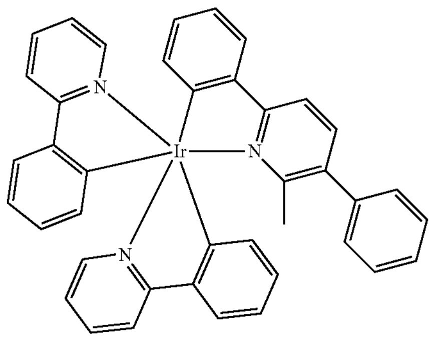
M-a6
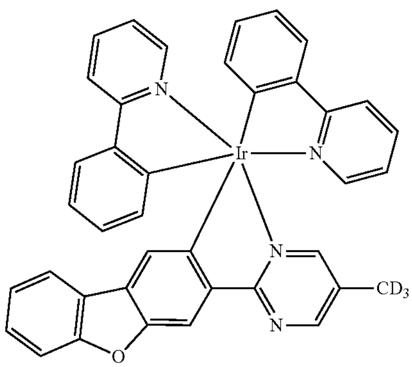
M-a7
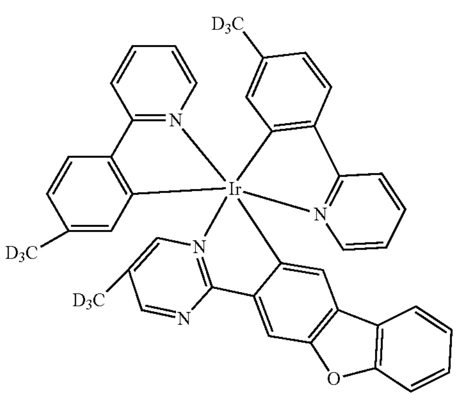
M-a8
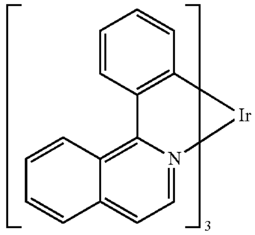
-continued
M-a9
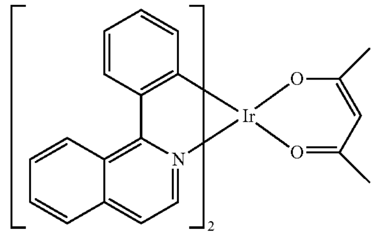
M-a10
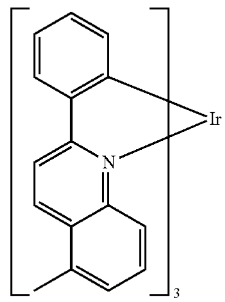
M-a11
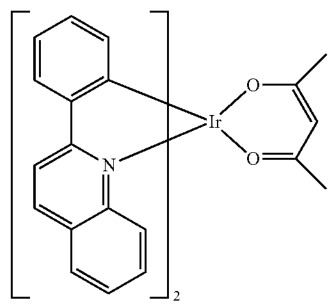
M-a12
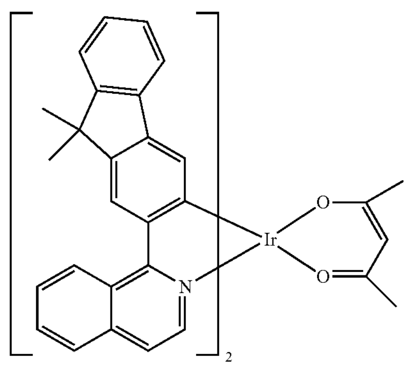
M-a13
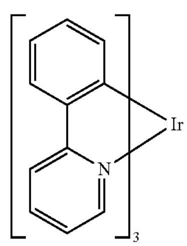

-continued
M-a14
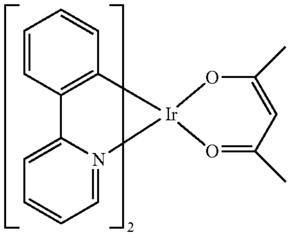
M-a15
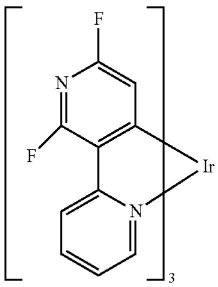
M-a16
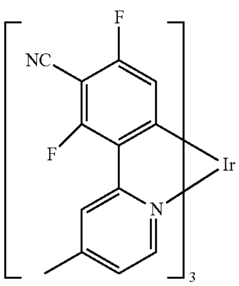
M-a17
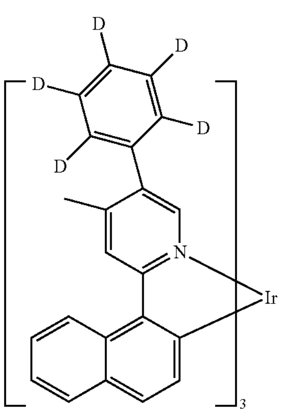
M-a18
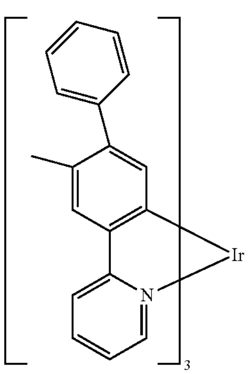
-continued
M-a19
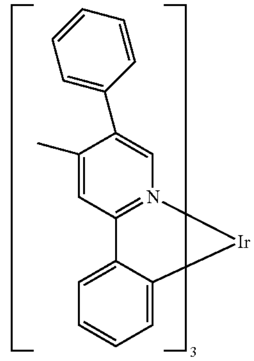
M-a20
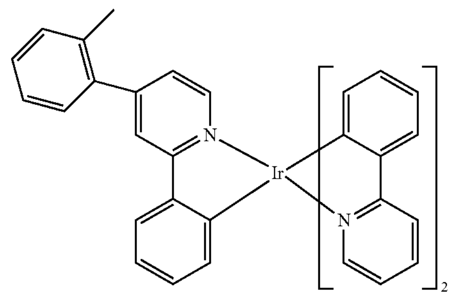
M-a21
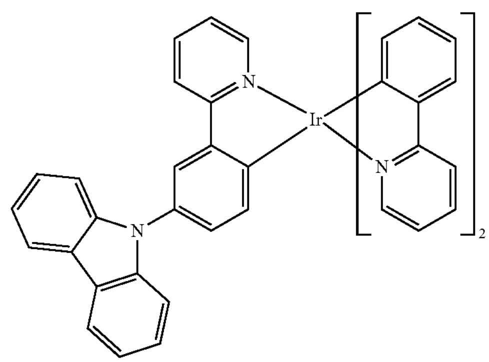
M-a22
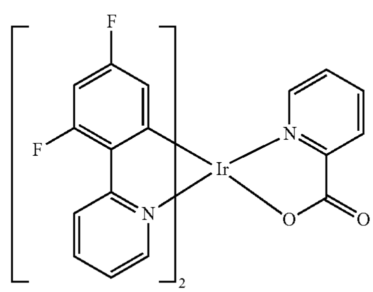
M-a23
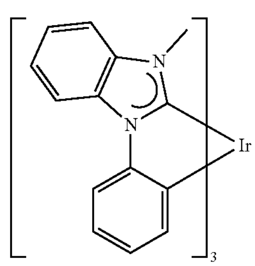

-continued

M-a24

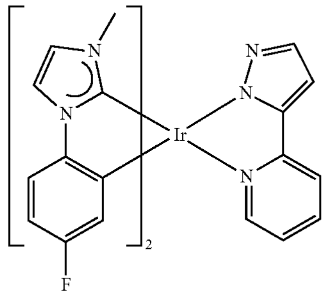

M-a25

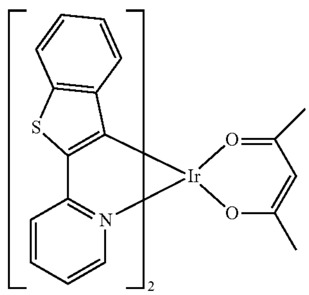

Compound M-a1 and Compound M-a2 may be used as a red dopant material, and Compound M-a3 to Compound M-a7 may be used as a green dopant material.

[Formula M-b]

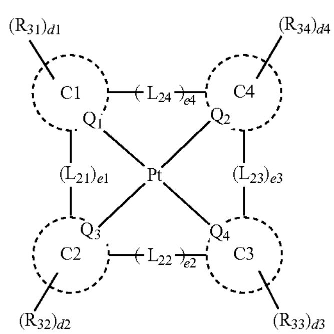

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

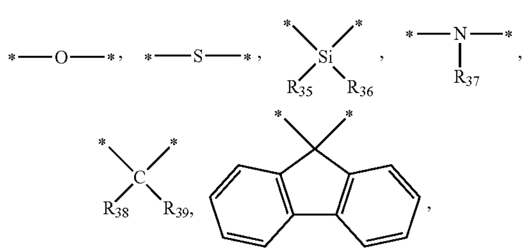

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

A compound represented by Formula M-b may be used as a blue phosphorescent dopant or a green phosphorescent dopant.

The compound represented by Formula M-b may be any one selected from the compounds below. However, the compounds below are examples, and the compound represented by Formula M-b is not limited to the compounds below.

M-b-1

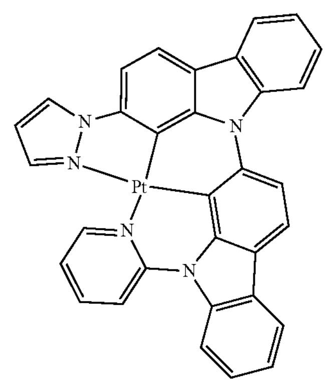

M-b-2

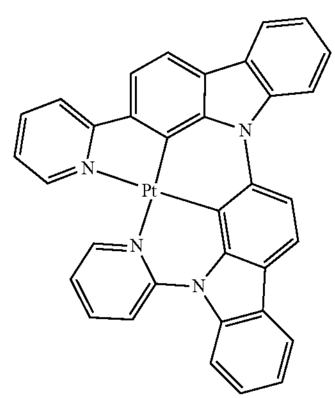

-continued
M-b-3
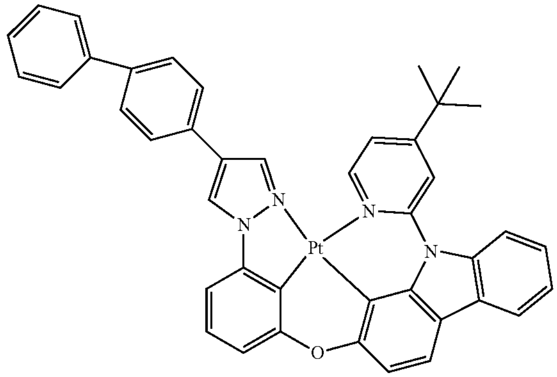
M-b-4
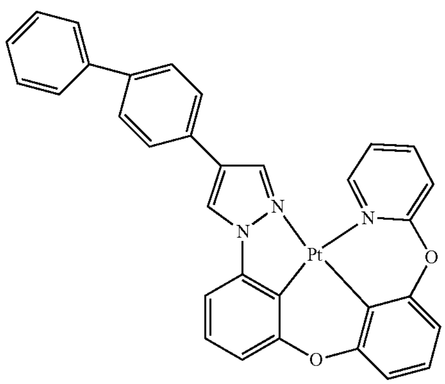
M-b-5
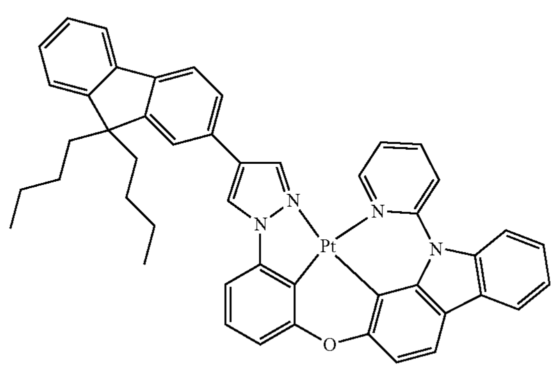
M-b-6
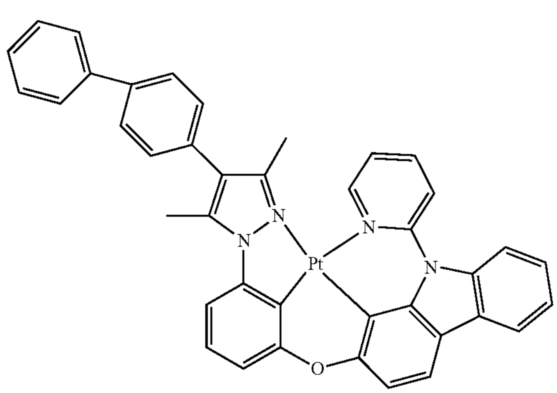
-continued
M-b-7
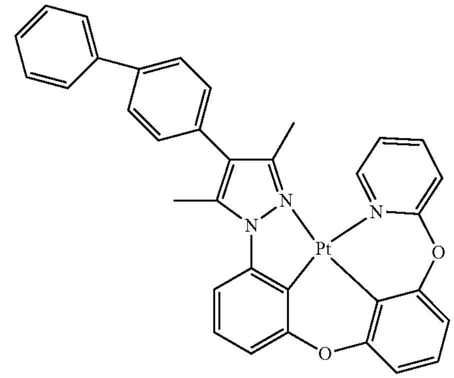
M-b-8
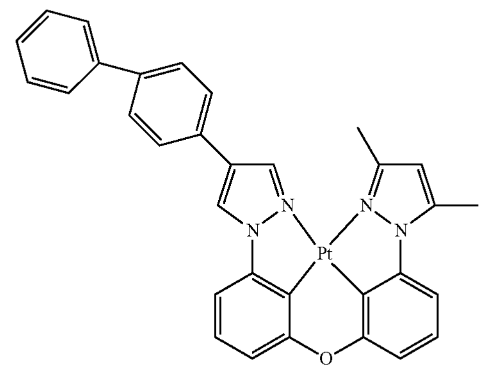
M-b-9
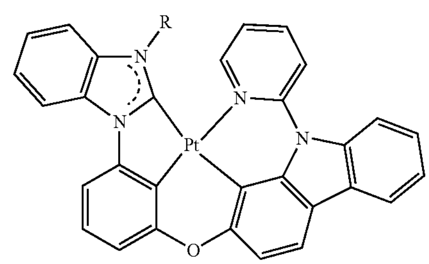
M-b-10
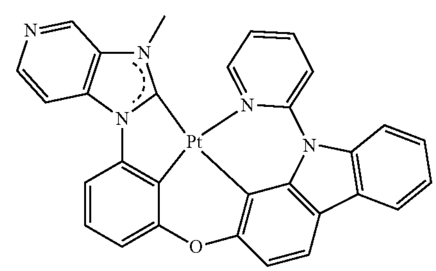
M-b-11
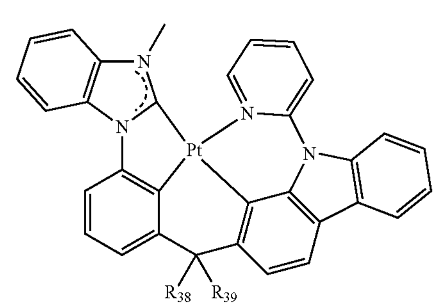
In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formula F-a to Formula F-c below. The compound represented by Formula F-a to Formula F-c below may be used as a fluorescence dopant material.

[Formula F-a]

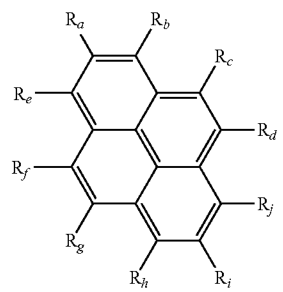

In Formula F-a, two selected from $R_a$ to may each independently be substituted with $*\!-\!NAr_1Ar_2$. The remainder of $R_a$ to $R_j$ which are not substituted with $*\!-\!NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group $*\!-\!NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group including O or S as a ring-forming atom.

[Formula F-b]

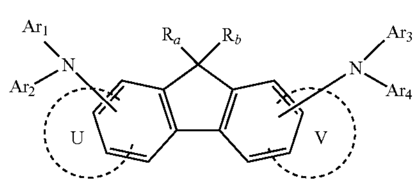

In Formula F-b above, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms. $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, the number of rings represented by U and V may each independently be 0 or 1. For example, in Formula F-b, when the number of U or V is 1, a fused ring may be present at the position indicated by U or V, and when the number of U or V is 0, a ring may not be present at the position indicated by U or V. When the number of U is 0 and the number of V is 1, or when the number of U is 1 and the number of V is 0, a fused ring having the fluorene core of Formula F-b may be a ring compound with four rings. When the number of both U and V is 0, the fused ring of Formula F-b may be a ring compound with three rings. When the number of both U and V is 1, a fused ring having the fluorene core of Formula F-b may be a ring compound with five rings.

[Formula F-c]

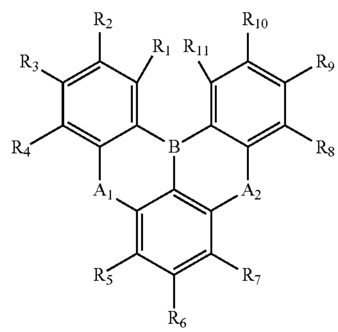

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to Ru may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of an adjacent ring to form a fused ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

In an embodiment, the emission layer EML may include, as a dopant material, a styryl derivative (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi), 4,4'-bis[2-(4-(N,N-diphenylamino)phenyl)vinyl]thiphenyl (DPAVBi), perylene and a derivative thereof (e.g., 2,5,8,11-tetra-t-butylperylene (TBP)), pyrene and a derivative thereof (e.g., 1,1-dipyrene, 1,4-dipyrenylbenzene, 1,4-bis(N,N-diphenylamino)pyrene), etc.

The emission layer EML may further include a phosphorescent dopant material. For example, a metal complex including iridium (Ir), platinum (Pt), osmium (Os), gold (Au), titanium (Ti), zirconium (Zr), hafnium (Hf), europium (Eu), terbium (Tb), or thulium (Tm) may be used as a phosphorescent dopant. For example, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), or platinum octaethyl porphyrin (PtOEP) may be used as a phosphorescent dopant. However, embodiments are not limited thereto.

The emission layer EML may include a quantum dot material. The quantum dot may be a Group II-VI compound, a Group III-VI compound, a Group compound, a Group III-V compound, a Group III-II-V compound, a Group IV-VI compound, a Group IV element, a Group IV compound, or a combination thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof or a combination thereof.

The Group III-VI compound may include a binary compound such as $In_2S_3$ and $In_2Se_3$, a ternary compound such as $InGaS_3$ and $InGaSe_3$, or any combination thereof.

The Group compound may be a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof, a quaternary compound such as $AgInGaS_2$ and $CuInGaS_2$, or a combination thereof.

The Group III-V compound may be a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; or a combination thereof. The Group III-V compound may further include a Group II metal. For example, InZnP, etc. may be selected as a Group III-II-V compound.

The Group IV-VI compound may be a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; a quaternary compound selected from the group consisting of SnPbSSe, SnPbSeTe, SnPbSTe, and a mixture thereof; or a combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration distribution, or may be present in the particle at a partially different concentration distribution. In an embodiment, the quantum dot may have a core/shell structure in which one quantum dot surrounds another quantum dot. The core/shell structure may have a concentration gradient in which the concentration of an element present in the shell gradually decreases towards the core.

In embodiments, a quantum dot may have the above-described core-shell structure including a core containing nanocrystals and a shell surrounding the core. The shell of the quantum dot may be a protection layer that prevents chemical deformation of the core so as to maintain semiconductor properties, and/or may be a charging layer that imparts electrophoretic properties to the quantum dot. The shell may be a single layer or a multilayer. Examples of the shell of the quantum dot may include a metal oxide, a non-metal oxide, a semiconductor compound, or a combination thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but embodiments are not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Color purity or color gamut may be improved in the above ranges. Light emitted through the quantum dot may be emitted in all directions, and thus, a wide viewing angle may be improved.

The quantum dot may have a shape that is generally used in the art, and is not particularly limited. For example, the quantum dot may have a spherical shape, a pyramidal shape, a multi-arm shape, or a cubic shape, or the quantum dot may be in the form of nanoparticles, nanotubes, nanowires, nanofibers, nanoplate particles, etc.

The quantum dot may control the color of emitted light according to a particle size thereof, and accordingly, the quantum dot may have various emission colors such as blue, red, and green.

In the light-emitting elements ED of embodiments illustrated in FIG. 3 to FIG. 6, the electron transport region ETR is provided on the emission layer EML. The electron transport region ETR may include at least one of a hole blocking layer HBL, an electron transport layer ETL, or an electron injection layer EIL, but embodiments are not limited thereto.

The electron transport region ETR may be a layer formed of a single material, a layer formed of different materials, or a multilayer structure having layers formed of different materials.

For example, the electron transport region ETR may have a structure of a single layer of an electron injection layer EIL or an electron transport layer ETL, or may have a structure of a single layer formed of an electron injection material and an electron transport material. The electron transport region ETR may have a single layer structure formed of different materials, or a structure in which an electron transport layer ETL/electron injection layer EIL, or a hole blocking layer HBL/electron transport layer ETL/electron injection layer EIL are stacked in its respective stated order from the emission layer EML, but embodiments are not limited thereto. A thickness of the electron transport region ETR may, for example, be in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 below:

[Formula ET-1]

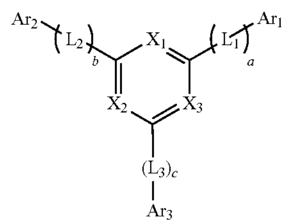

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula ET-1, when a to c are 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound.

However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) ($Bebq_2$), 9,10-di(naphthalene-2-yl)anthracene (ADN), 1,3-Bis[3,5-di(pyridin-3-yl)phenyl]benzene (BmPyPhB), or a mixture thereof.

The electron transport region ETR may include at least one selected from Compounds ET1 to ET36 below.

ET1

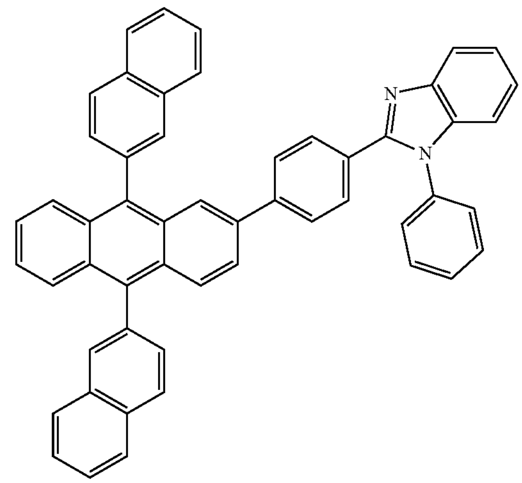

ET2

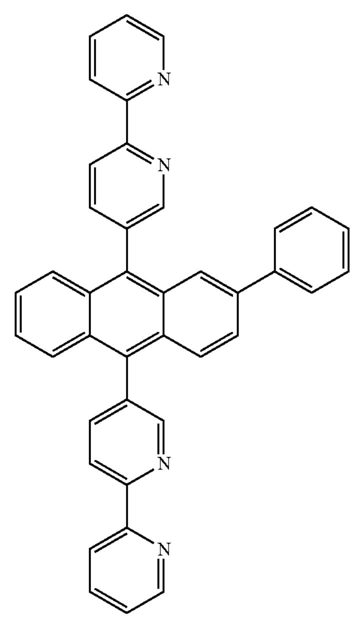

ET3

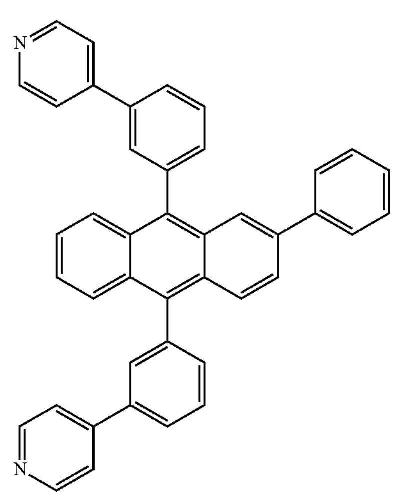

-continued
ET4
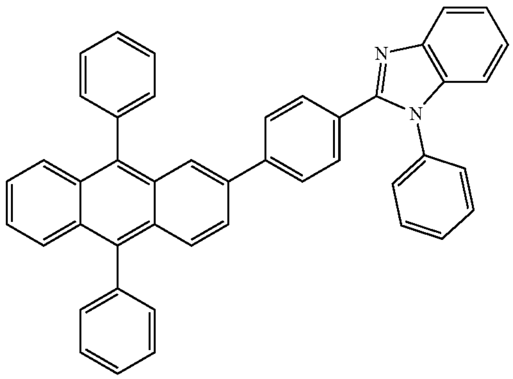
ET5
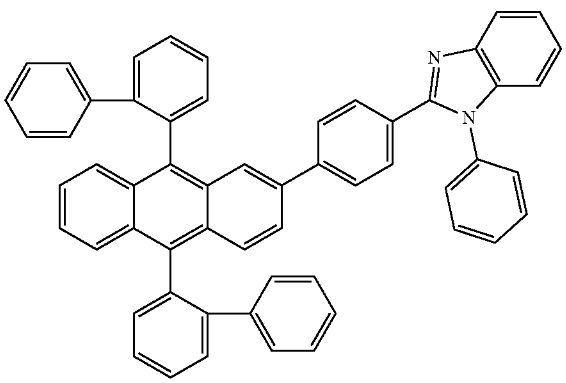
ET6
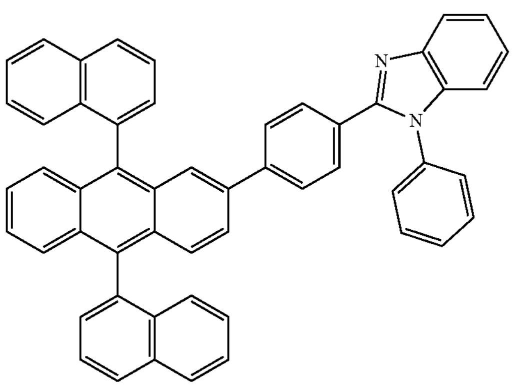
ET7
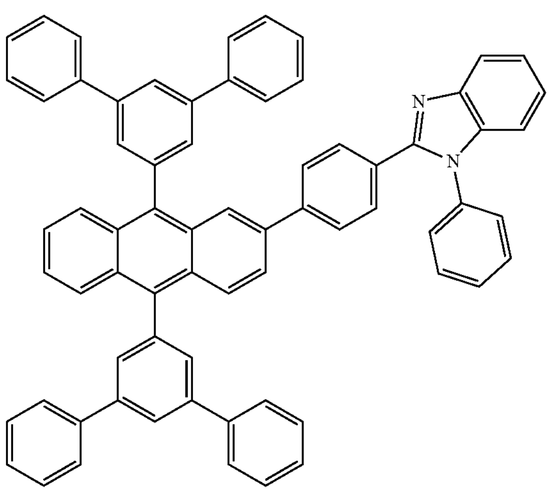
-continued
ET8
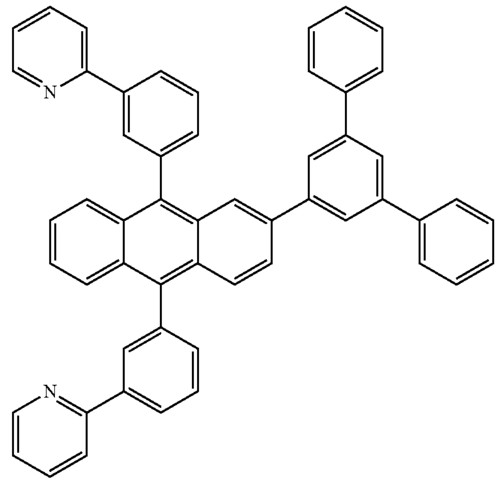
ET9
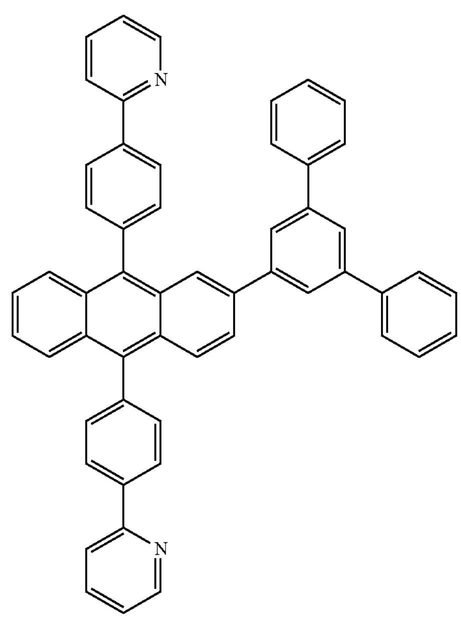

-continued
ET10
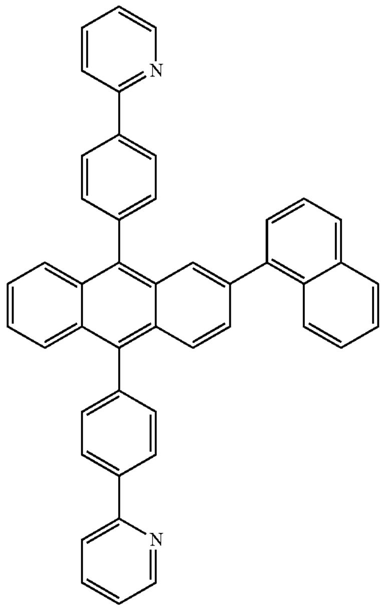
ET11
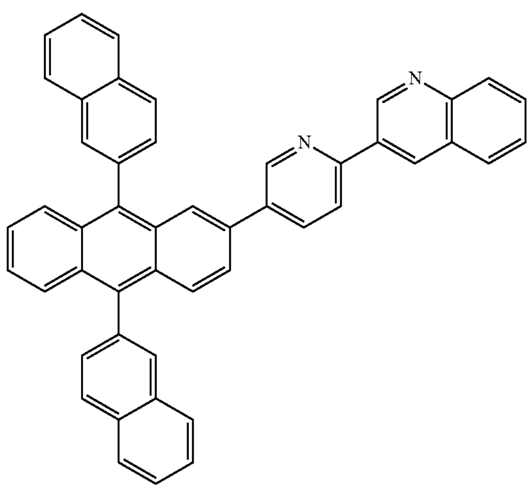
ET12
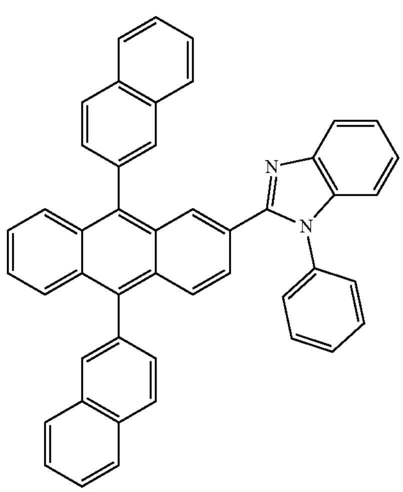
-continued
ET13
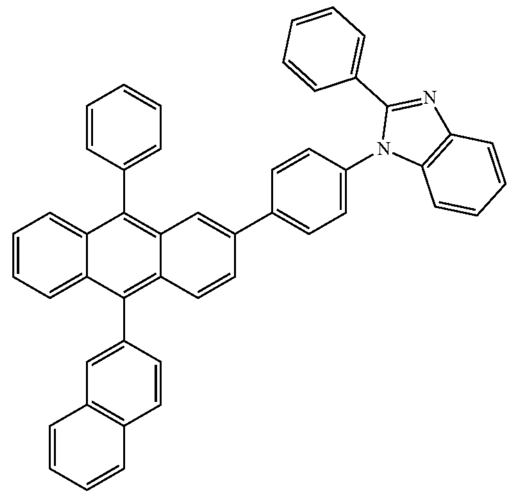
ET14
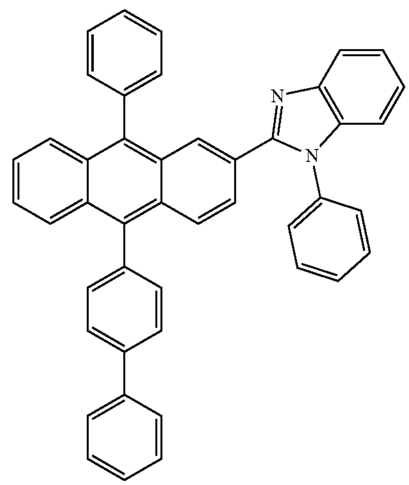
ET15
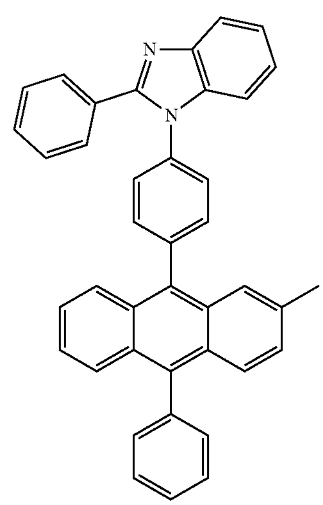

-continued
ET16
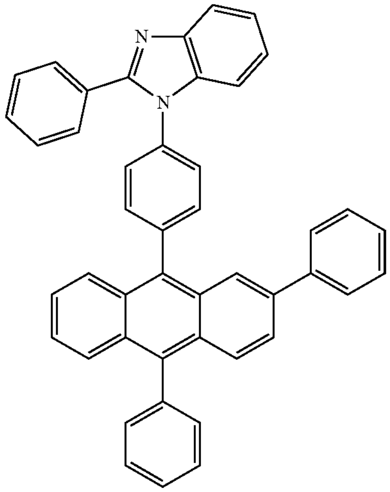
ET17
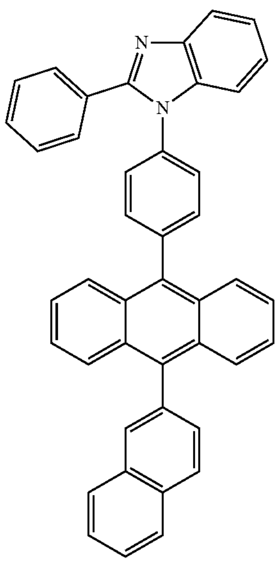
ET18
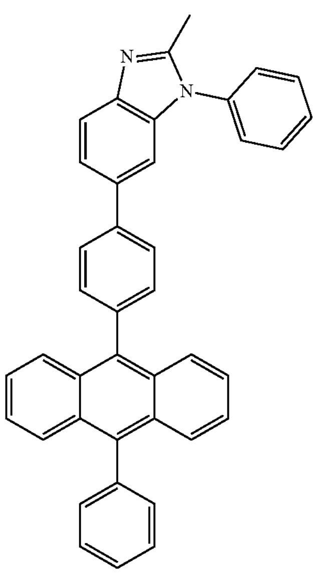
-continued
ET19
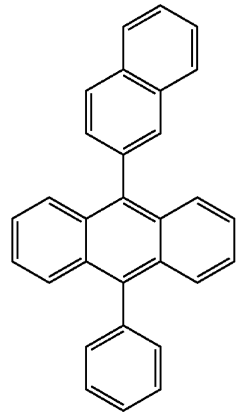
ET20
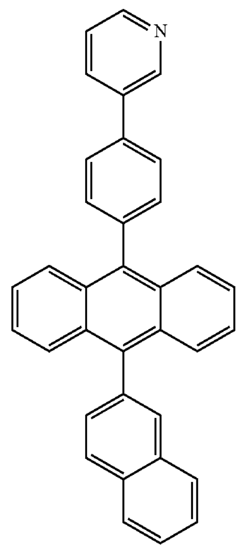
ET21
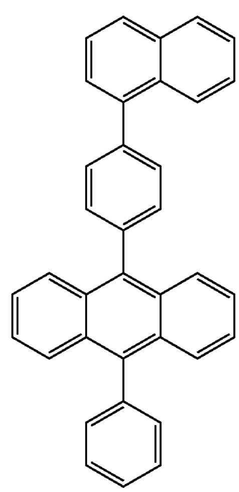

ET22
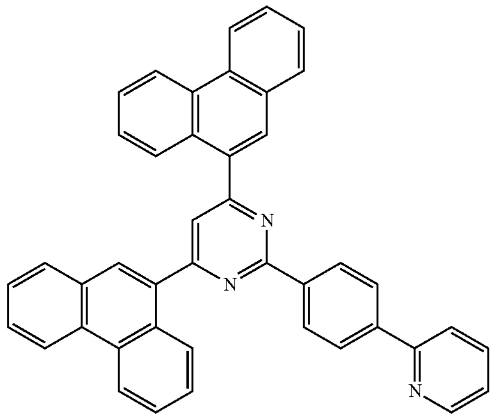
ET23
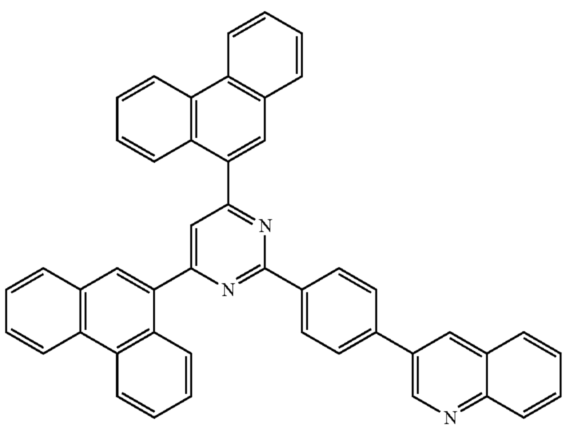
ET24
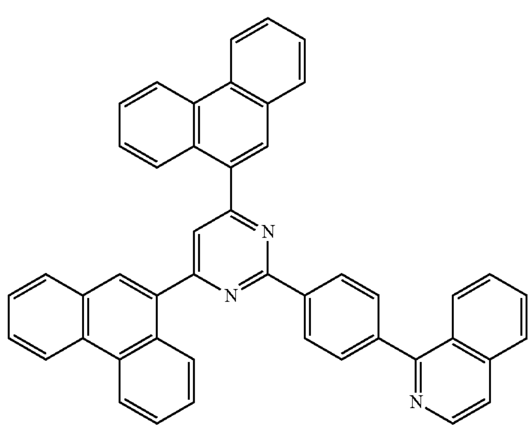
ET25
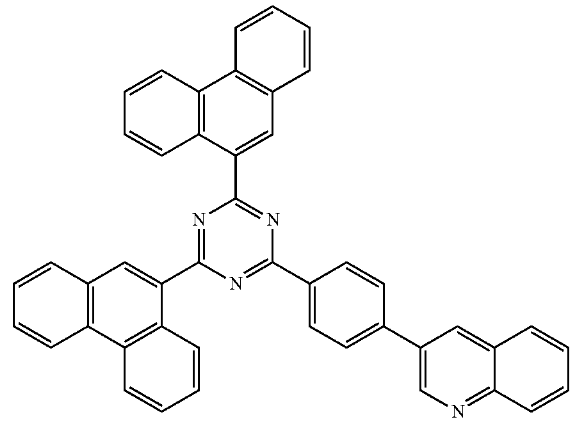
ET26
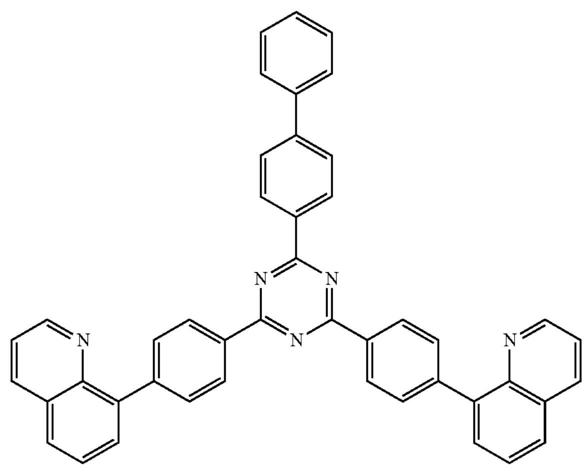
ET27
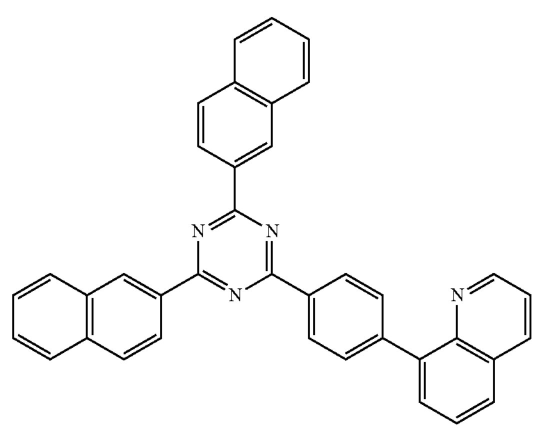

-continued
ET28
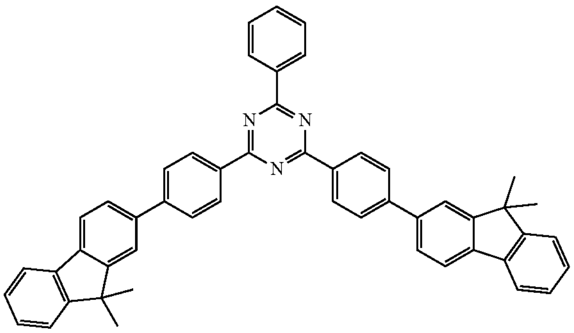
ET29
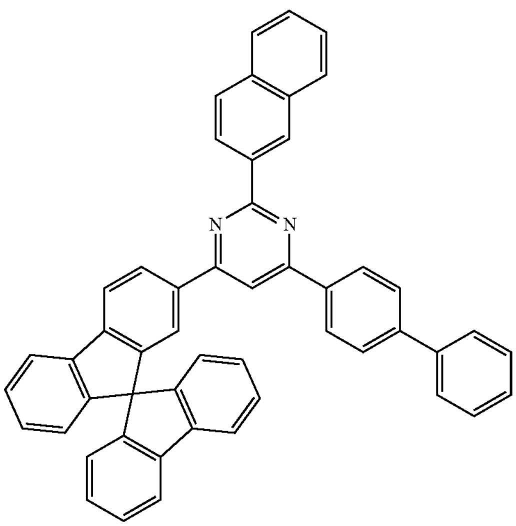
ET30
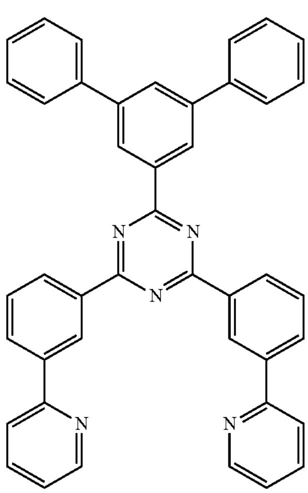
-continued
ET31
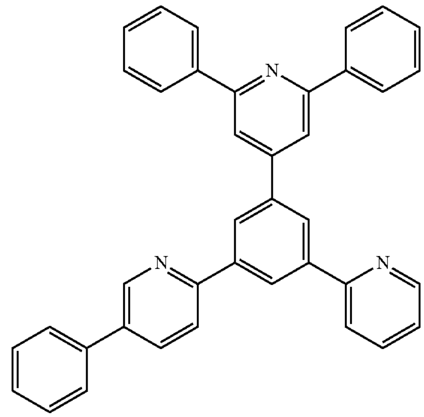
ET32
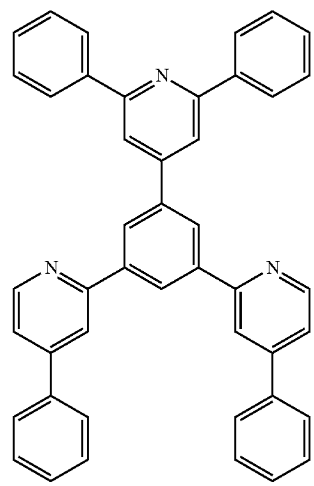
ET33
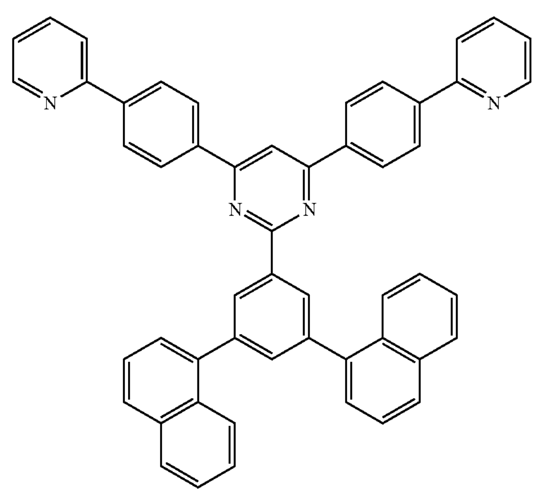

-continued

ET34

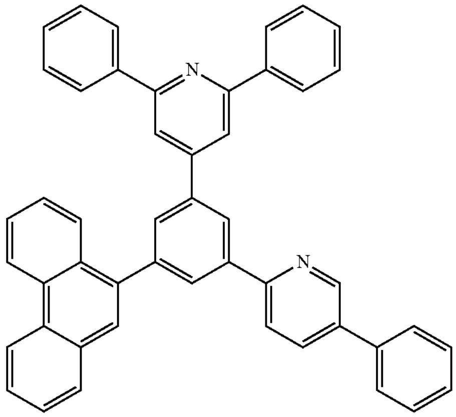

ET35

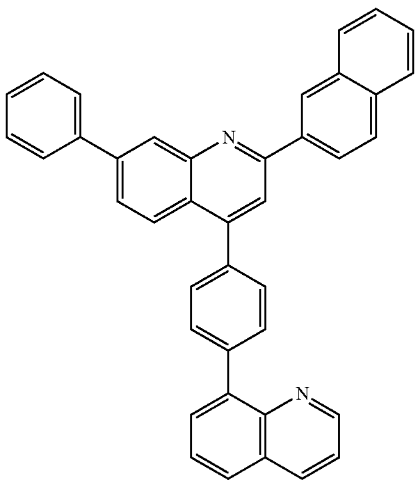

ET36

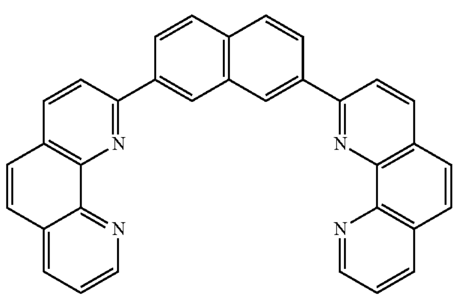

The electron transport region ETR may include a metal halide such as LiF, NaCl, CsF, RbCl, RbI, CuI, or KI, a lanthanide metal such as Yb, or a co-deposited material of the metal halide and the lanthanide metal. For example, the electron transport region ETR may include KI:Yb, RbI:Yb, etc. as a co-deposited material. The electron transport region ETR may be formed using a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap equal to or greater than about 4 eV. For example, the organometallic salt may include metal acetates, metal benzoates, metal acetoacetates, metal acetylacetonates, or metal stearates.

The electron transport region ETR may further include at least one of 2,9-dimethyl-4,7-diphenyl-1,10-phenanthroline (BCP), or 4,7-diphenyl-1,10-phenanthroline (Bphen) in addition to the materials stated above, but embodiments are not limited thereto.

The electron transport region ETR may include the above-described compounds of the hole transport region in at least one of the electron injection layer EIL, the electron transport layer ETL, or the hole blocking layer HBL.

When the electron transport region ETR includes an electron transport layer ETL, the electron transport layer ETL may have a thickness in a range of about 100 Å to about 1,000 Å. For example, the electron transport layer ETL may have a thickness in a range of about 150 Å to about 500 Å. When the thickness of the electron transport layer ETL satisfies the aforementioned range, satisfactory electron transport properties may be achieved without a substantial increase of a driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. When the thickness of the electron injection layer EIL satisfies the above-described range, satisfactory electron injection properties may be achieved without a substantial increase of a driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be composed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, $L_1$, Ca, LiF/Ca, LiF/Al, Mo, Ti, Yb, W, a compound thereof, or a mixture thereof (e.g., AgMg, AgYb, or MgYb). In an embodiment, the second electrode EL2 may have a multi-layer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), or the like. For example, the second electrode EL2 may include the above-described metal material, a combination of two or more metal materials selected from the above-described metal materials, or an oxide of the above-described metal materials.

Although not shown in the drawings, the second electrode EL2 may be electrically connected to an auxiliary electrode. When the second electrode EL2 is electrically connected to the auxiliary electrode, the resistance of the second electrode EL2 may decrease.

In an embodiment, the light-emitting element ED may further include a capping layer CPL disposed on the second electrode EL2. The capping layer CPL may be a multilayer or a single layer.

In an embodiment, the capping layer CPL may include an organic layer or an inorganic layer. For example, when the capping layer CPL includes an inorganic material, the inorganic material may include an alkaline metal compound such as LiF, an alkaline earth metal compound such as $MgF_2$, SiON, $SiN_x$, $SiO_y$, etc.

For example, when the capping layer CPL includes an organic material, the organic material may include a-NPD, NPB, TPD, m-MTDATA, $Alq_3$, CuPc, N4,N4,N4',N4'-tetra (biphenyl-4-yl)biphenyl-4,4'-diamine (TPD15), 4,4',4"-tris (carbazol-9-yl)triphenylamine (TCTA), etc., or may include an epoxy resin, or acrylate such as methacrylate. However, embodiments are not limited thereto, and the capping layer CPL may include at least one of Compounds P1 to P5 below:

P1

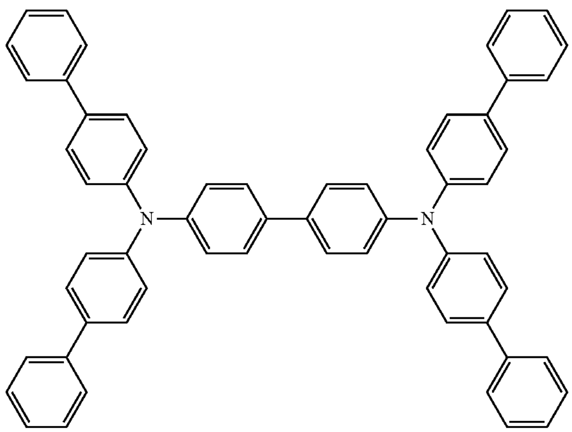

P2

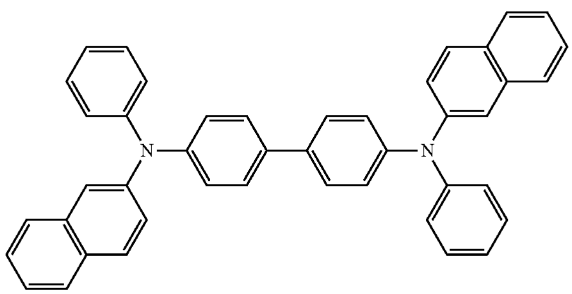

P3

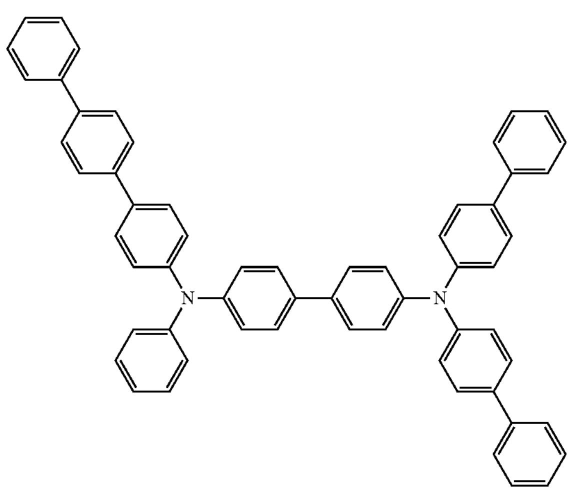

-continued

P4

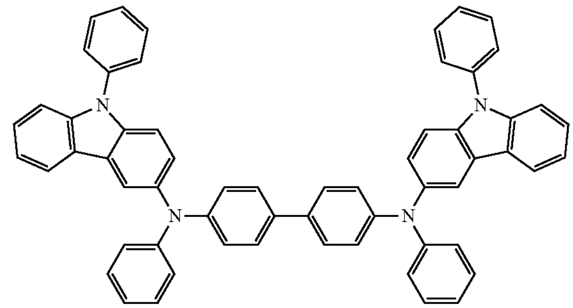

P5

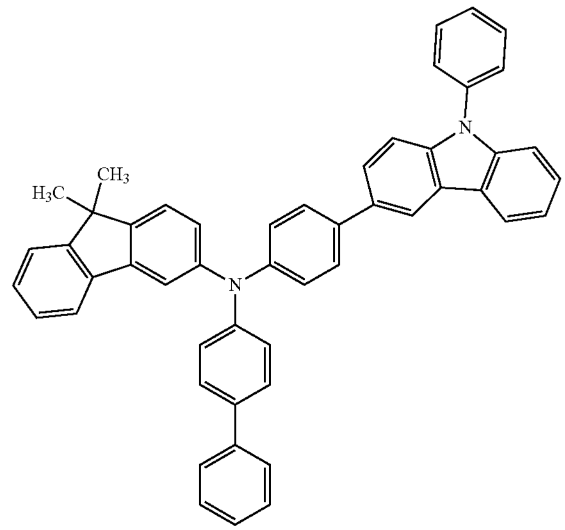

A refractive index of the capping layer CPL may be equal to or greater than about 1.6. For example, the refractive index of the capping layer CPL may be equal to or greater than about 1.6 with respect to light in a wavelength range of about 550 nm to about 660 nm.

Figure 7:
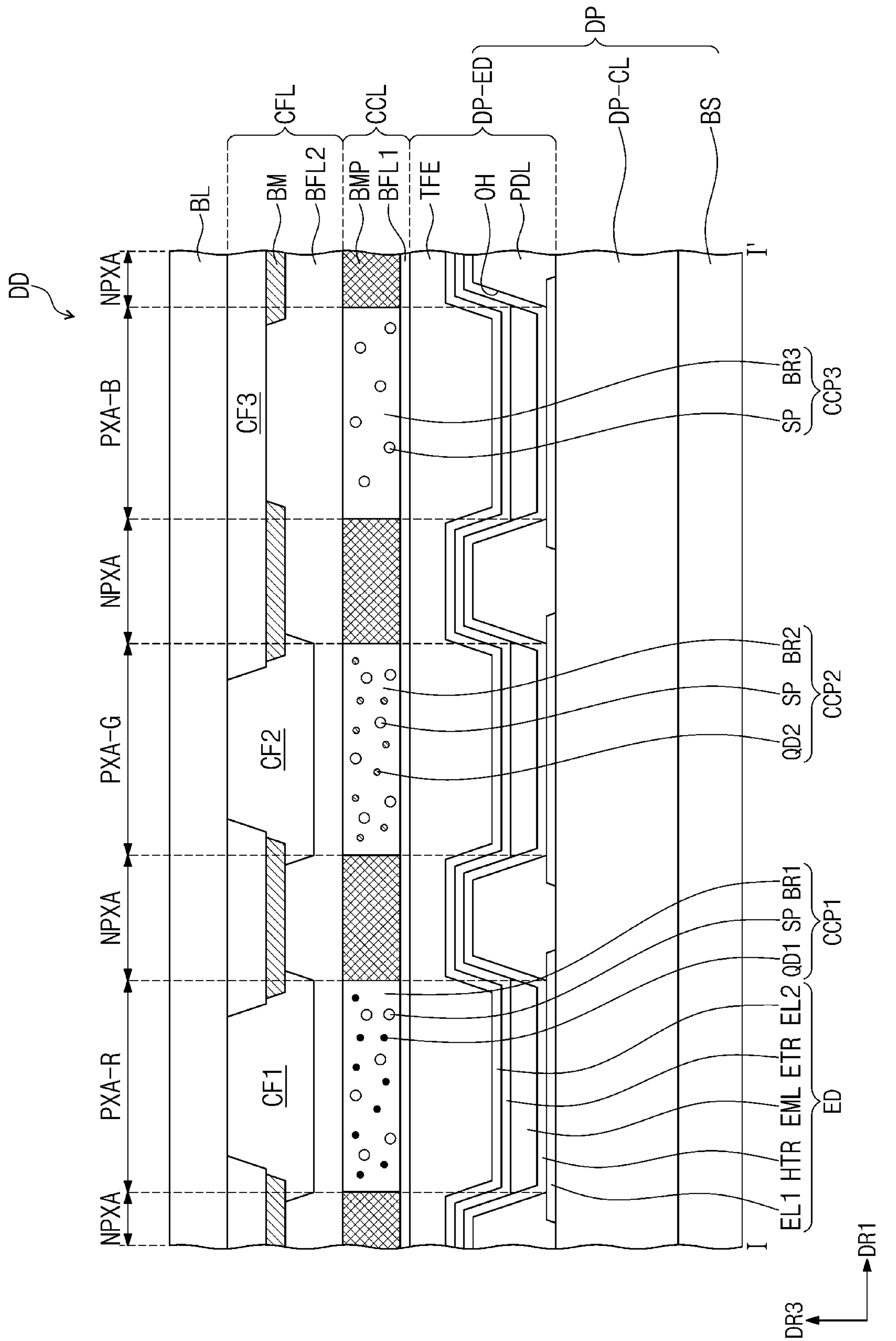
FIG. 7 is a schematic cross-sectional view illustrating a display device according to an embodiment.
Figure 8:
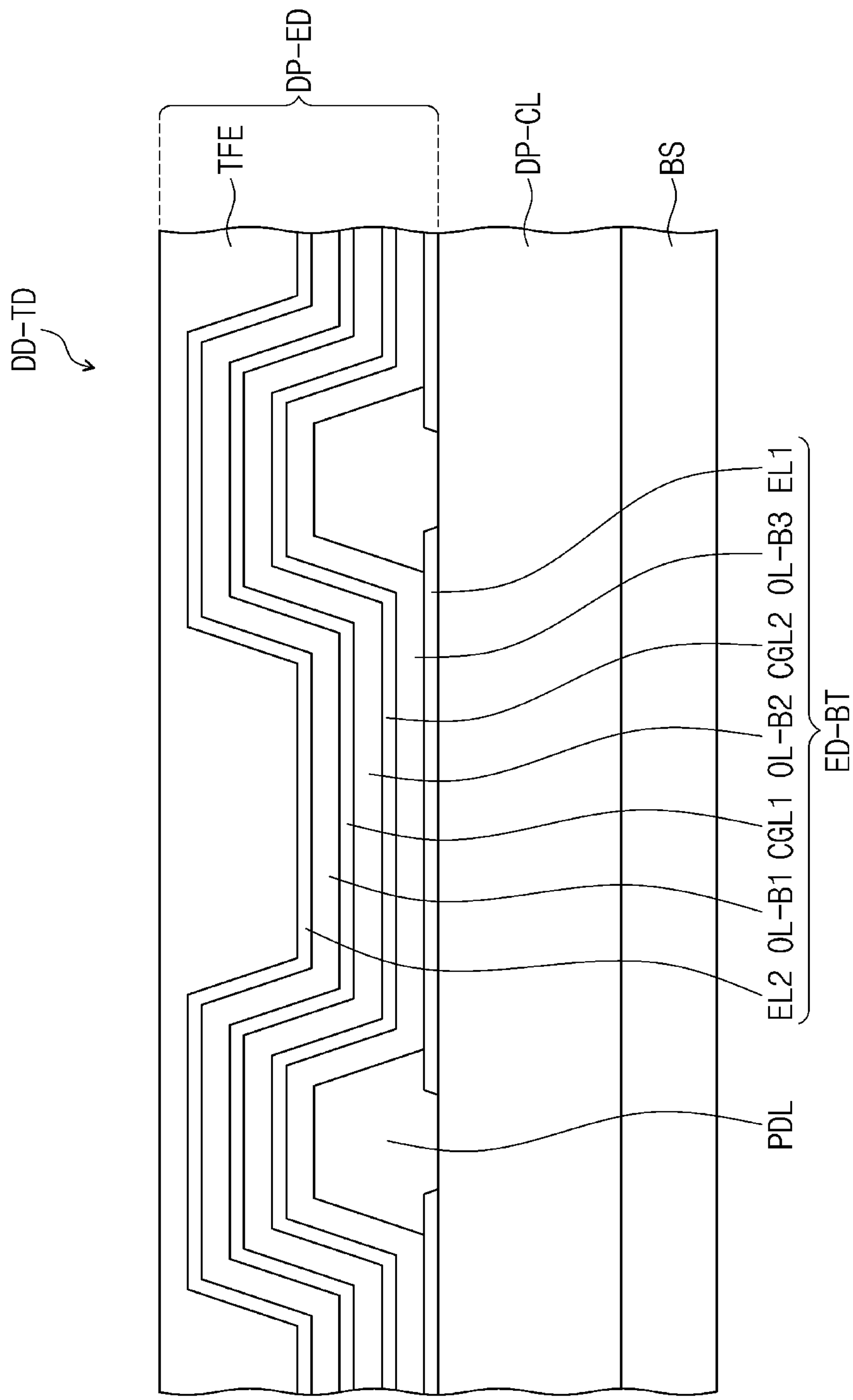
FIG. 8 is a schematic cross-sectional view illustrating a display device according to an embodiment.

FIG. 7 and FIG. 8 each are a schematic cross-sectional view of a display device according to an embodiment. Hereinafter, in the explanation on the display devices of embodiments with reference to FIG. 7 and FIG. 8, the duplicated features which have been described in FIG. 1 to FIG. 6 will not be explained again, and the differing features will be explained.

Referring to FIG. 7, the display device DD according to an embodiment may include a display panel DP including a display element layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display element layer DP-ED, and the display element layer DP-ED may include a light-emitting element ED.

The light-emitting element ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The light-emitting element ED illustrated in FIG. 7 may have a same structure as the light-emitting elements of FIG. 3 to FIG. 6 described above.

Referring to FIG. 7, the emission layer EML may be disposed in an opening OH defined in a pixel defining film PDL. For example, the emission layer EML which is divided by the pixel defining film PDL and provided corresponding to each of the light emitting regions PXA-R, PXA-G, and PXA-B may emit light in a same wavelength range. In the display device DD of an embodiment, the emission layer EML may emit blue light. Although not shown in the drawings, in an embodiment, the emission layer EML may be provided as a common layer for all light-emitting regions PXA-R, PXA-G, and PXA-B.

The light control layer CCL may be disposed on the display panel DP. The light control layer CCL may include a light conversion body. The light conversion body may include a quantum dot, a phosphor, or the like. The light conversion body may convert the wavelength of provided light and emit the converted light. For example, the light control layer CCL may be a layer including a quantum dot or a layer including a phosphor.

The light control layer CCL may include light control parts CCP1, CCP2, and CCP3. The light control parts CCP1, CCP2, and CCP3 may be spaced apart from each other.

Referring to FIG. 7, partition patterns CMP may be disposed between the light control parts CCP1, CCP2, and CCP3 which are spaced apart from each other, but embodiments are not limited thereto. FIG. 7 illustrates that the partition patterns CMP do not overlap the light control parts CCP1, CCP2, and CCP3, but in an embodiment, at least a portion of the edges of the light control parts CCP1, CCP2, and CCP3 may overlap the partition patterns BMP.

The light control layer CCL may include a first light control part CCP1 including a first quantum dot QD1 which converts first color light provided from the light-emitting element ED into second color light, a second light control part CCP2 including a second quantum dot QD2 which converts the first color light into third color light, and a third light control part CCP3 which transmits the first color light.

In an embodiment, the first light control part CCP1 may provide red light that is the second color light, and the second light control part CCP2 may provide green light that is the third color light. The third light control part CCP3 may provide blue light by transmitting the blue light that is the first color light provided from the light-emitting element ED. For example, the first quantum dot QD1 may be a red quantum dot, and the second quantum dot QD2 may be a green quantum dot. The same description as provided above with respect to quantum dots may be applied to quantum dots QD1 and QD2.

The light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include a quantum dot but may include the scatterer SP.

The scatterer SP may be inorganic particles. For example, the scatterer SP may include at least one of $TiO_2$, ZnO, $Al_2O_3$, $SiO_2$, or hollow silica. The scatterer SP may include any one of $TiO_2$, ZnO, $Al_2O_3$, $SiO_2$, or hollow silica, or may be a mixture of at least two materials selected from among $TiO_2$, ZnO, $Al_2O_3$, $SiO_2$, and hollow silica.

The first light control part CCP1, the second light control part CCP2, and the third light control part CCP3 may each include base resins BR1, BR2, and BR3 dispersing the quantum dots QD1 and QD2 and the scatterer SP. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 are media in which the quantum dots QD1 and QD2 and the scatterer SP are dispersed, and may be formed of various resin compositions, which may be referred to as a binder. For example, the base resins BR1, BR2, and BR3 may be acrylic resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light control layer CCL may include a barrier layer BFL1. The barrier layer BFL1 may prevent the penetration of moisture and/or oxygen (hereinafter, referred to as 'moisture/oxygen'). The barrier layer BFL1 may be disposed on the light control parts CCP1, CCP2, and CCP3 to block the light control parts CCP1, CCP2 and CCP3 from being exposed to moisture/oxygen. The barrier layer BFL1 may cover the light control parts CCP1, CCP2, and CCP3. A barrier layer BFL2 may be provided between the light control parts CCP1, CCP2, and CCP3 and the color filter layer CFL.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may further include an organic film. The barrier layers BFL1 and BFL2 may be composed of a single layer or of multiple layers.

In the display device DD of an embodiment, the color filter layer CFL may be disposed on the light control layer CCL. For example, the color filter layer CFL may be directly disposed on the light control layer CCL. In an embodiment, the barrier layer BFL2 may be omitted.

The color filter layer CFL may include a light-shielding part BM and filters CF1, CF2, and CF3. The color filter layer CFL may include a first filter CF1 that transmits second color light, a second filter CF2 that transmits third color light, and a third filter CF3 that transmits first color light. For example, the first filter CF1 may be a red filter, the second filter CF2 may be a green filter, and the third filter CF3 may be a blue filter. The filters CF1, CF2, and CF3 may each include a polymeric photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may be a yellow filter. The first filter CF1 and the second filter CF2 may not be separated from each other and may be provided integrally as one filter.

The light-shielding part BM may be a black matrix. The light-shielding part BM may include an organic light shielding material or an inorganic light-shielding material containing a black pigment or dye. The light-shielding part BM may prevent light leakage, and may separate boundaries between the adjacent filters CF1, CF2, and CF3. In an embodiment, the light-shielding part BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may provide a base surface on which the color filter layer CFL, the light control layer CCL, and the like are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view illustrating a portion of a display device according to an embodiment. FIG. 8 illustrates a schematic cross-sectional view of a part corresponding to the display panel DP of FIG. 7. In the display device DD-TD of an embodiment, the light-emitting element ED-BT may include light-emitting structures OL-B1, OL-B2, and OL-B3. The light-emitting element ED-BT may include a first electrode EL1 and a second electrode EL2 which face each other, and the light emitting structures OL-B1, OL-B2, and OL-B3 which may be sequentially stacked in a thickness direction between the first electrode EL1 and the second electrode EL2. The light-emitting structures OL-B1, OL-B2, and OL-B3 may each include an emission layer EML (FIG. 7) and a hole transport region HTR and an electron transport region ETR disposed with the emission layer EML (FIG. 7) therebetween.

For example, the light-emitting element ED-BT included in the display device DD-TD of an embodiment may be a light-emitting element having a tandem structure and including multiple emission layers.

In an embodiment illustrated in FIG. 8, light emitted from each of the light-emitting structures OL-B1, OL-B2, and OL-B3 may be blue light. However, embodiments are not limited thereto, and the wavelength ranges of light emitted from each of the light-emitting structures OL-B1, OL-B2, and OL-B3 may be different from each other. For example, the light-emitting element ED-BT including the light-emitting structures OL-B1, OL-B2, and OL-B3 that emit light of different wavelength ranges may emit white light.

Charge generation layers CGL1 and CGL2 may be disposed between neighboring light-emitting structures OL-B1, OL-B2, and OL-B3. The charge generation layers CGL1 and CGL2 may each independently include a p-type charge generation layer and/or an n-type charge generation layer.

Hereinafter, a compound according to an embodiment and a light-emitting element of an embodiment will be described in detail with reference to the Examples and to the Comparative Examples. The Examples shown below are illustrated only for the understanding of the disclosure, and the scope thereof is not limited thereto.

EXAMPLES

1. Synthesis of Amine Compound of Example

A synthesis method of an amine compound according to the embodiment will be described in detail by illustrating synthesis methods of Compounds 1, 2, 13, 26, 59, 74, and 85. In the following descriptions, a synthesis method of the amine compound is provided as an example, but the synthesis method according to an embodiment is not limited to Examples below.

(1) Synthesis of Compound 1

Amine compound 1 according to an example may be synthesized, for example, through the steps of Reaction Formula 1 below.

[Reaction Formula 1]

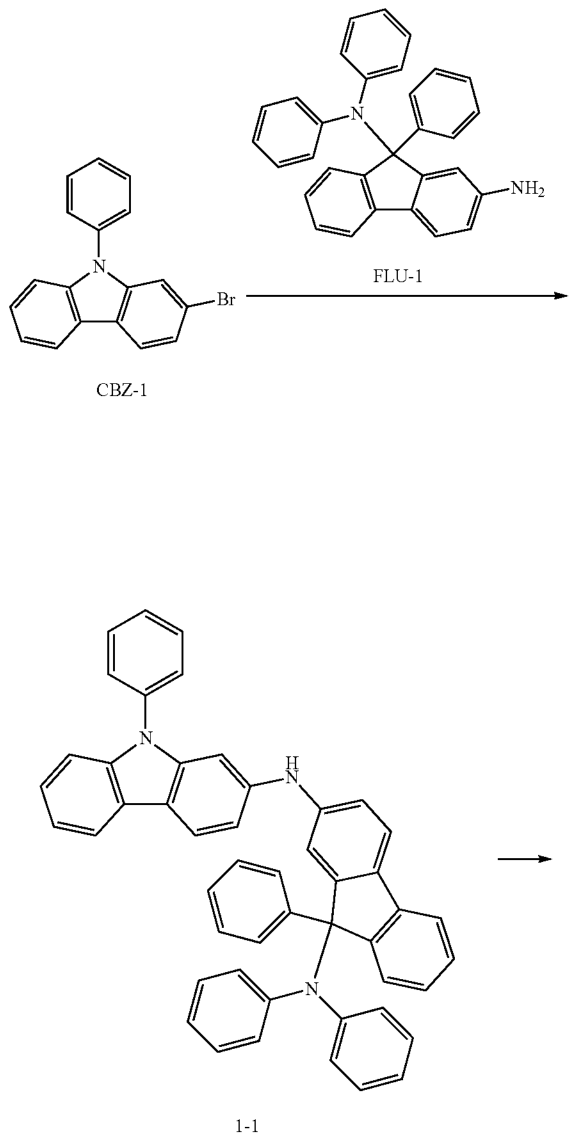

-continued

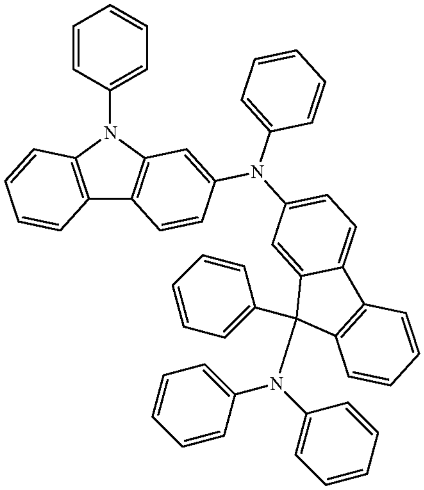

1

[Reaction Formula 2]

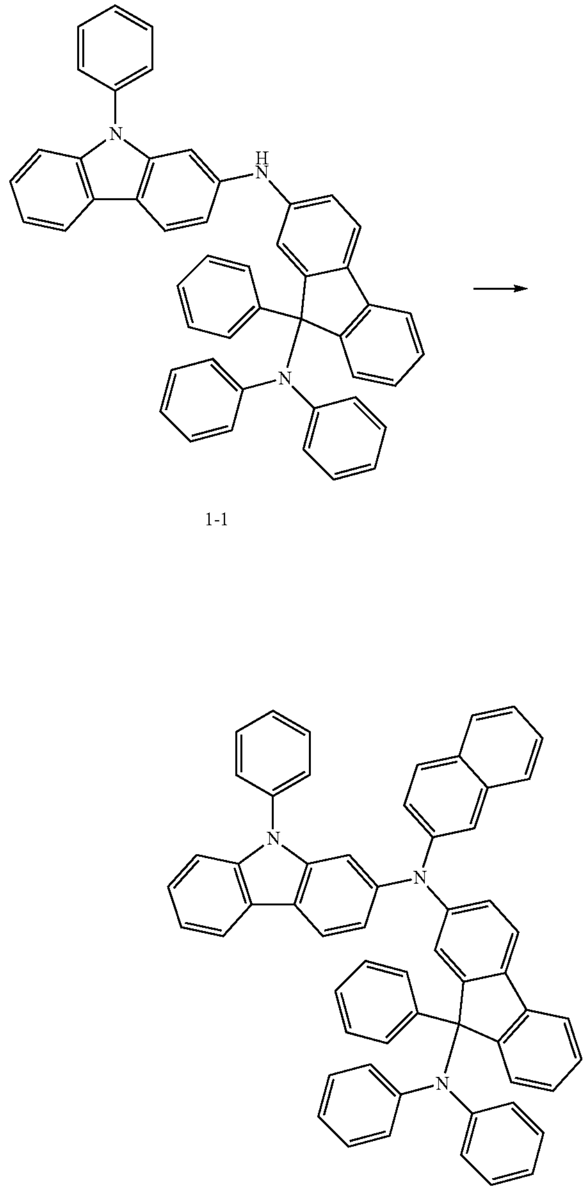

1-1

2

[Synthesis of Intermediate Compound 1-1]

6.44 g (20 mmol) of 2-bromo-9-phenyl-9H-carbazole (CBZ-1), 8.28 g (20 mmol) of N9,N9,9-triphenyl-9H-fluorene-2,9-diamine (Flu-1), 0.915 g (a mol) of tris(dibenzylideneacetone)dipalladium(0), 0.096 g (1 mol) of tri-tert-butylphosphine ((t-Bu)$_3$P, and 3.6 g (40 mmol) of NaOtBu were dissolved in toluene, and stirred at about 90° C. for about 2 hours. The resultant mixture was extracted three times with a solution including diethyl ether and water ($Et_2O/H_2O$). The obtained crude product was dried with anhydrous magnesium sulfate and separated and purified through column chromatography, thereby obtaining 11.9 g (18 mmol) of Intermediate 1-1 at a yield of 90%.

[Synthesis of Compound 1]

6.67 g (9 mmol) of Compound 1 was obtained at a yield of 90% by using the same method as the synthesis of Intermediate 1-1, except that Intermediate 1-1 was used instead of CBZ-1, and bromobenzene was used instead of Flu-1.

(2) Synthesis of Compound 2

Amine compound 2 according to an example may be synthesized, for example, through the steps of Reaction Formula 2 below.

7.12 g (9 mmol) of Compound 2 was obtained at a yield of 90% by using the same method as the synthesis of Compound 1, except that 2-bromonaphthalene was used instead of bromobenzene.

(3) Synthesis of Compound 13

Amine compound 13 according to an example may be synthesized, for example, through the steps of Reaction Formula 3 below.

[Reaction Formula 3]

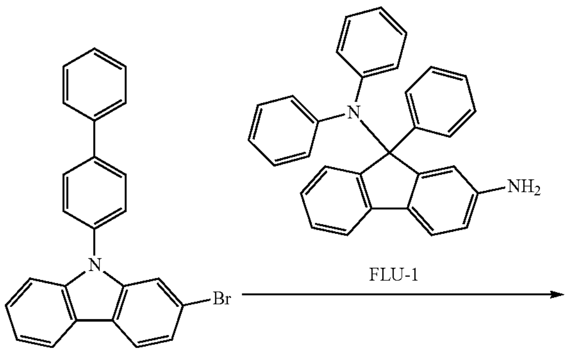

FLU-1

CBZ-2

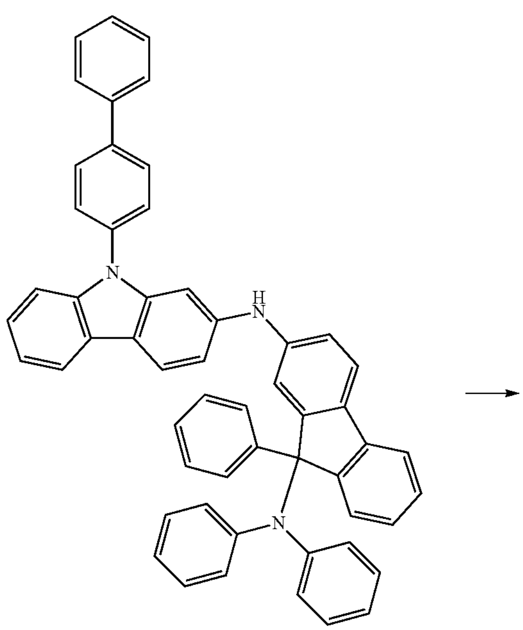

13-1

-continued

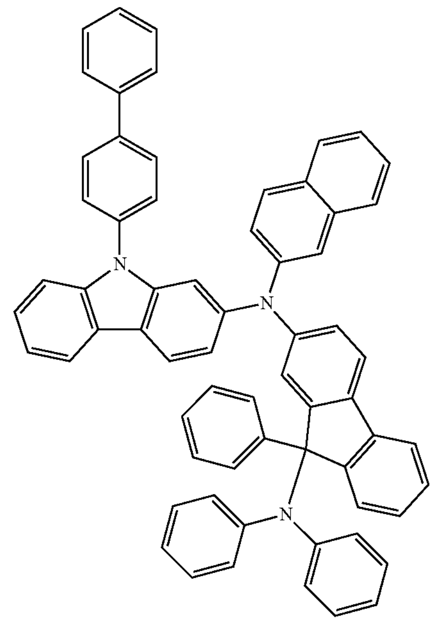

13

[Synthesis of Intermediate Compound 13-1]

13.3 g (18 mmol) of Intermediate Compound 13-1 was obtained at a yield of 90% by using the same method as the synthesis of Intermediate Compound 1-1, except that 9-([1, 1'-biphenyl]-4-yl)-2-bromo-9H-carbazole (CBZ-2) was used instead of CBZ-1.

[Synthesis of Compound 13]

7.80 g (9 mmol) of Compound 13 was obtained at a yield of 90% by using the same method as the synthesis of Compound 2, except that Intermediate Compound 13-1 was used instead of Intermediate Compound 1-1.

(4) Synthesis of Compound 26

Amine compound 26 according to an example may be synthesized, for example, through the steps of Reaction Formula 4 below.

[Reaction Formula 4]

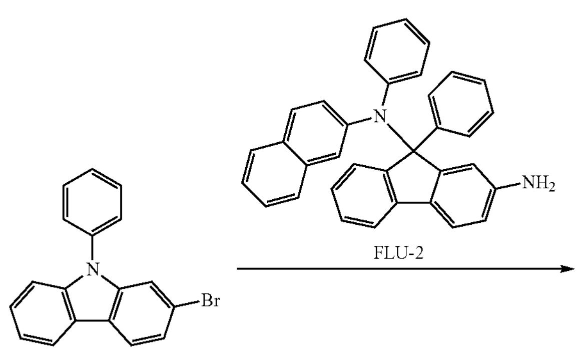

FLU-2

CBZ-1

-continued

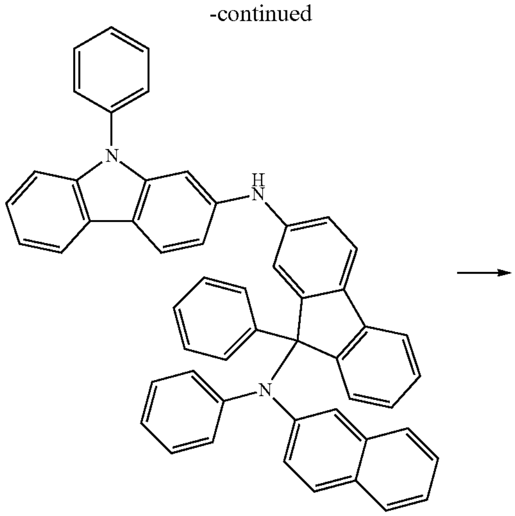

26-1

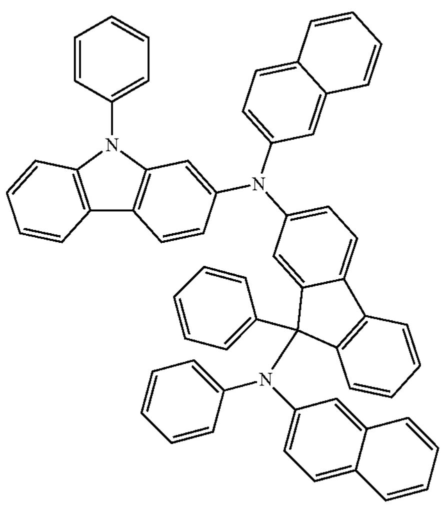

26

[Synthesis of Intermediate Compound 26-1]

12.8 g (18 mmol) of Intermediate Compound 26—was obtained at a yield of 90% by using the same method as the synthesis of Intermediate Compound 1-1, except that N9-(naphthalen-2-yl)-N9,9-diphenyl-9H-fluorene-2,9-diamine (FLU-2) was used instead of FLU-1.

[Synthesis of Compound 26]

7.80 g (9 mmol) of Compound 26 was obtained at a yield of 90% by using the same method as the synthesis of Compound 2, except that Intermediate Compound 26-1 was used instead of Intermediate Compound 1-1.

(5) Synthesis of Compound 59

Amine compound 59 according to an example may be synthesized, for example, through the steps of Reaction Formula 5 below.

[Reaction Formula 5]

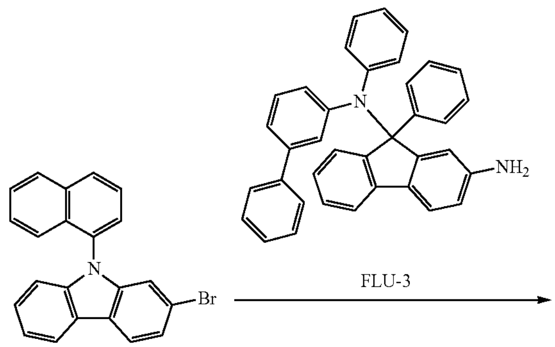

CBZ-3

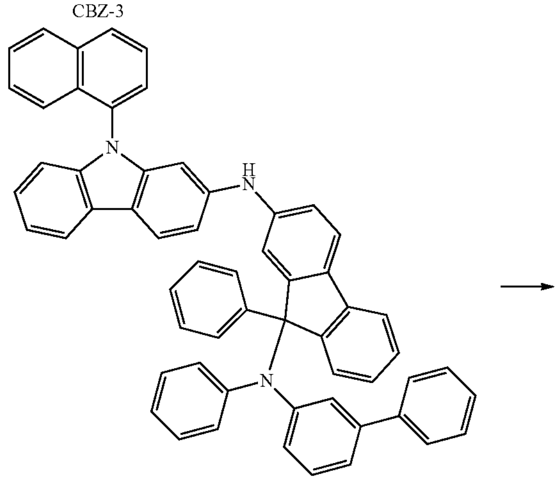

59-1

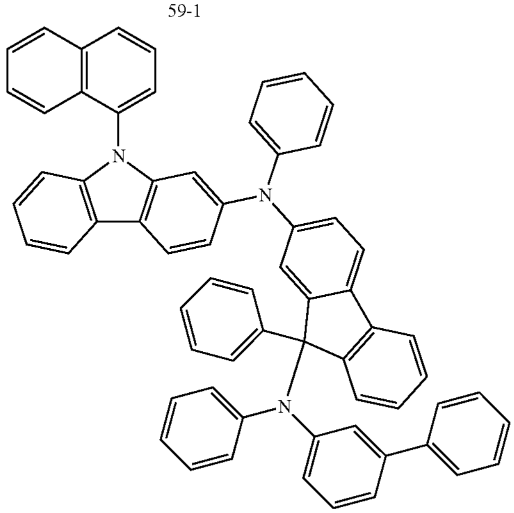

59

[Synthesis of Intermediate Compound 59-1]

14.2 g (18 mmol) of Intermediate Compound 59-1 was obtained at a yield of 90% by using the same method as the synthesis of Intermediate Compound 1-1, except that 2-bromo-9-(naphthalen-1-yl)-9H-carbazole (CBZ-3) was used instead of CBZ-1, and N9-([1,1'-biphenyl]-3-yl)-N9,9-diphenyl-9H-fluorene-2,9-diamine (FLU-3) was used instead of FLU-1.

[Synthesis of Compound 59]

7.80 g (9 mmol) of Compound 59 was obtained at a yield of 90% by using the same method as the synthesis of Compound 1, except that Intermediate Compound 59-1 was used instead of Intermediate Compound 1-1.

(6) Synthesis of Compound 74

Amine compound 74 according to an example may be synthesized, for example, through the steps of Reaction Formula 6 below.

[Reaction Formula 6]

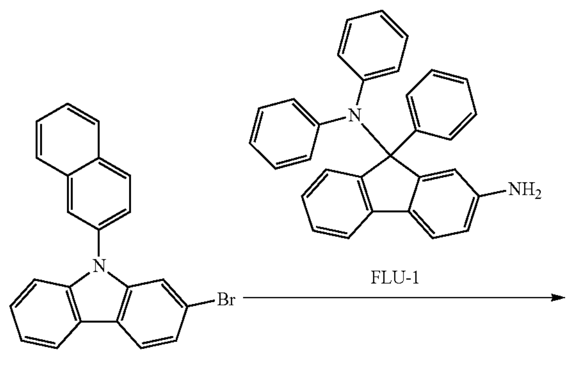

FLU-1

CBZ-4

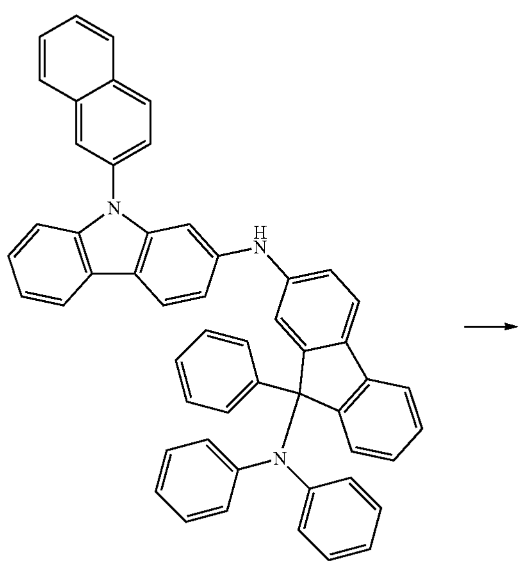

74-1

-continued

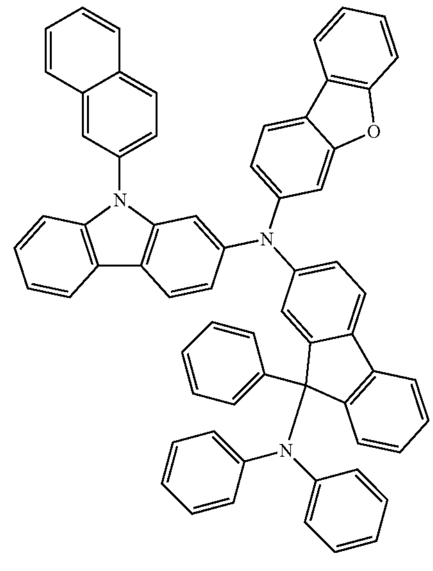

74

[Synthesis of Intermediate Compound 74-1]

12.8 g (18 mmol) of Intermediate Compound 74-1 was obtained at a yield of 90% by using the same method as the synthesis of Intermediate Compound 1-1, except that 2-bromo-9-(naphthalen-2-yl)-9H-carbazole (CBZ-4) was used instead of CBZ-1.

[Synthesis of Compound 74]

7.93 g (9 mmol) of Compound 74 was obtained at a yield of 90% by using the same method as the synthesis of Compound 1, except that Intermediate Compound 74-1 was used instead of Intermediate Compound 1-1, and 3-bromodibenzofurane was used instead of bromobenzene.

(7) Synthesis of Compound 85

Amine compound 85 according to an example may be synthesized, for example, through the steps of Reaction Formula 7 below.

[Reaction Formula 7]

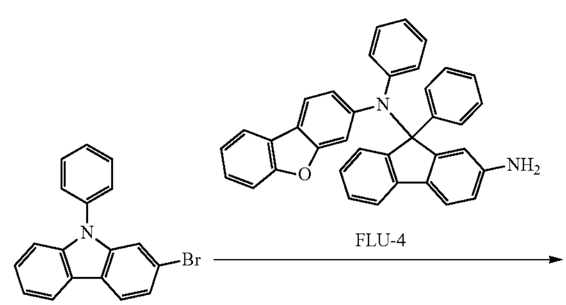

FLU-4

CBZ-1

-continued

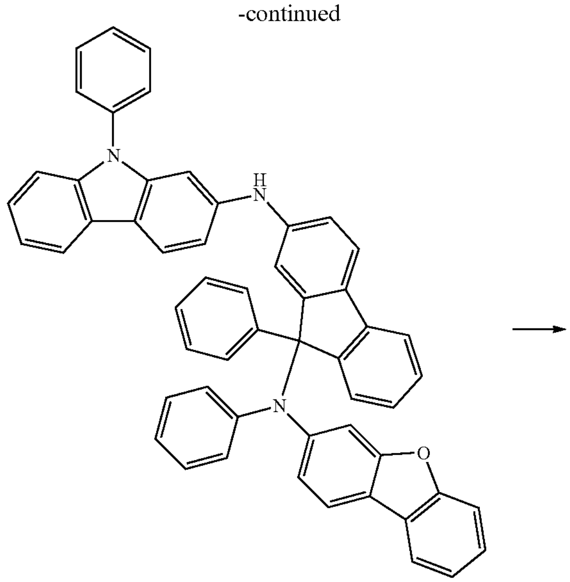

85-1

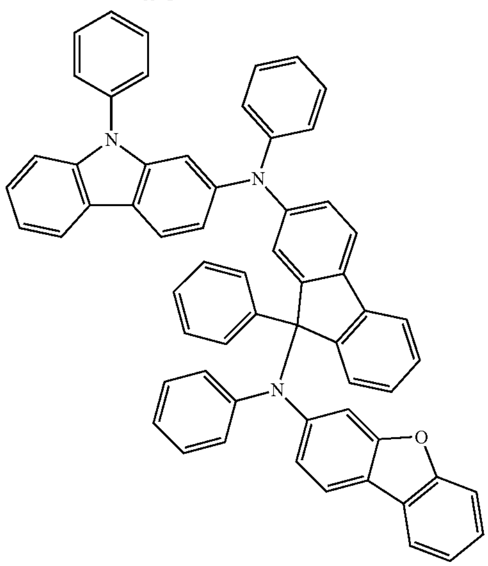

85

[Synthesis of Intermediate Compound 85-1]

13.5 g (18 mmol) of Intermediate Compound 85-1 was obtained at a yield of 90% by using the same method as the synthesis of Intermediate Compound 1-1, except that N9-(dibenzo[b,d]furan-3-yl)-N9,9-diphenyl-9H-fluorene-2,9-diamine (FLU-4) was used instead of FLU-1.

[Synthesis of Compound 85]

7.48 g (9 mmol) of Compound 85 was obtained at a yield of 90% by using the same method as the synthesis of Compound 1, except that intermediate Compound 85-1 was used instead of Intermediate Compound 1-1.

Structures of the synthesized compounds were confirmed by measuring 41 NMR values of compounds 1, 2, 13, 26, 59, 74, and 85. Table 1 shows the measured values for 1H NMR values of compounds 1, 2, 13, 26, 59, 74 and 85.

TABLE 1

| | | MS/FAB | |
|---|---|---|---|
| Compound | $^1$H NMR ($CDCl_3$, 500 MHz) | Found | Calc. |
| 1 | δ = 7.80 (m, 2 H), 7.60 (d, 1 H), 7.55-7.10 (m, 22 H), 2.5-1.5 (m, 26 H) | 741.31 | 741.92 |
| 2 | δ = 7.80 (m, 2 H), 7.60 (d, 1 H), 7.55-7.10 (m, 22 H), 2.5-1.5 (m, 26 H) | 793.33 | 791.98 |
| 13 | δ = 7.80 (m, 2 H), 7.60 (d, 1 H), 7.55-7.10 (m, 22 H), 2.5-1.5 (m, 26 H) | 867.36 | 868.07 |
| 26 | δ = 7.80 (m, 2 H), 7.60 (d, 1 H), 7.55-7.10 (m, 22 H), 2.5-1.5 (m, 26 H) | 841.30 | 842.04 |
| 59 | δ = 7.80 (m, 2 H), 7.60 (d, 1 H), 7.55-7.10 (m, 22 H), 2.5-1.5 (m, 26 H) | 867.36 | 868.07 |
| 74 | δ = 7.80 (m, 2 H), 7.60 (d, 1 H), 7.55-7.10 (m, 22 H), 2.5-1.5 (m, 26 H) | 881.34 | 882.06 |
| 85 | δ = 7.80 (m, 2 H), 7.60 (d, 1 H), 7.55-7.10 (m, 22 H), 2.5-1.5 (m, 26 H) | 831.32 | 832.00 |

2. Manufacture and Evaluation of Light-Emitting Element (1) Manufacture and Evaluation of Light-Emitting Element in Comparative Example 1, Comparative Example 2, and Examples 1 to 7

The light-emitting elements including an amine compound of an Example, Comparative Example Compound C1, or Comparative Example Compound C2 in a hole transport layer were manufactured by the following method. The light-emitting elements of Examples 1 to 7 were manufactured by using Compound 1, Compound 2, Compound 13, Compound 26, Compound 59, Compound 74, and Compound 85 which are amine compounds of Examples, as a hole transport layer material. The light-emitting element of Comparative Example 1 uses Comparative Example Compound C1 as a hole transport layer material. 4,4'-bis(N-(1-naphthyl)-N-phenylamino)biphenyl (NPB) was used as Comparative Example Compound C1. In the light-emitting element of Comparative Example 2, Comparative Example Compound C2 was used as a hole transport layer material.

As a first electrode on a glass substrate, ITO having a thickness of 1,200 Å (about 15 Ω/cm$^2$, available by Corning Inc.) was cut to a size of 50 mm×50 mm×0.7 mm, cleansed by ultrasonic waves using isopropyl alcohol and ultrapure water for about 5 minutes, and irradiated with ultraviolet rays for about 30 minutes and exposed to ozone and cleansed. The glass substrate was installed on a vacuum deposition apparatus.

As a hole injection layer, 2-TNATA was vacuum-deposited to form an about 600 Å-thick, and Example Compounds or Comparative Example Compounds were vacuum-deposited to a thickness of about 300 Å to form a hole transport layer.

9,10-di(naphthalen-2-yl)anthracene (DNA) as a blue fluorescent host, and 4,4'-bis[2-(4-(N,N-diphenylamino)phenyl) vinyl]biphenyl (DPAVBi), which is a compound in the related art, as a blue fluorescent dopant, were co-deposited in a weight ratio of about 98:2 to form an about 300 Å-thick emission layer on the upper portion of the hole transport layer.

$Alq_3$ was deposited to about 300 Å-thick to form an electron transport layer, and LiF was deposited to about 10 Å-thick on the upper portion of the electron transport layer to form an electron injection layer. Al was vacuum-deposited to about 3,000 Å-thick to form a second electrode.

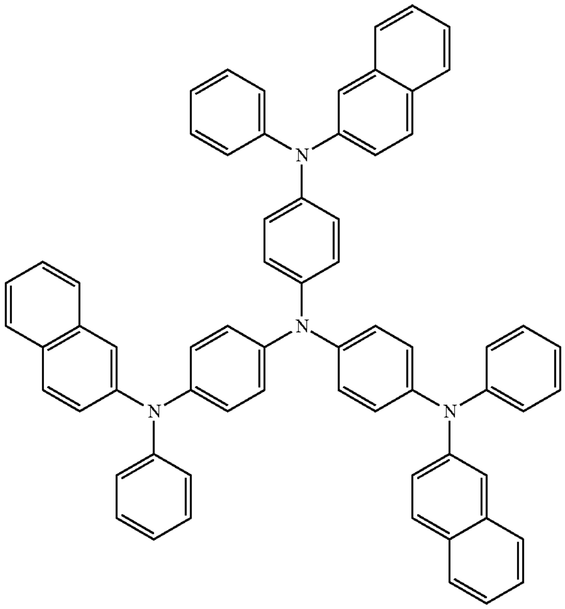
2-TNATA
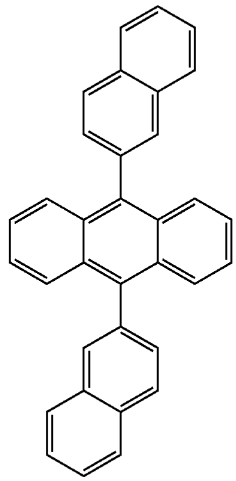
DNA
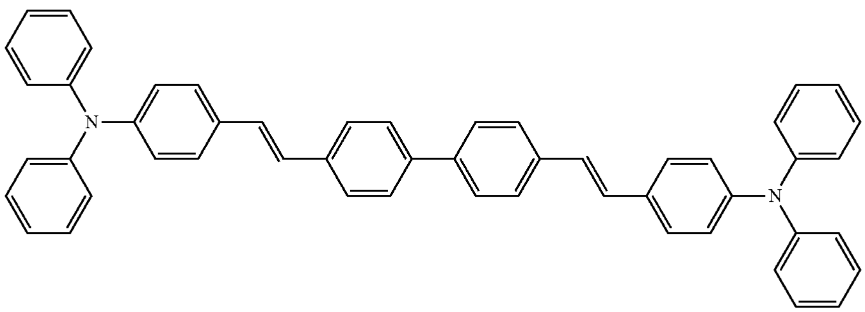
DPAVBi
(Example Compounds)
1
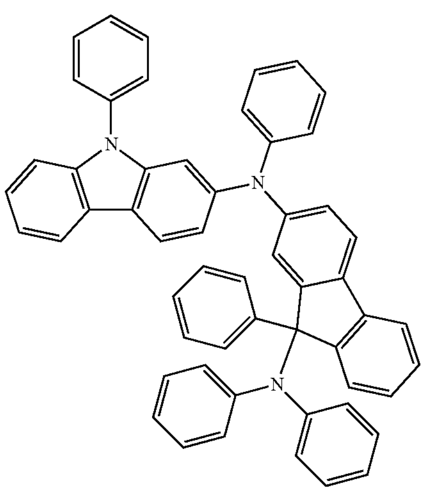
2
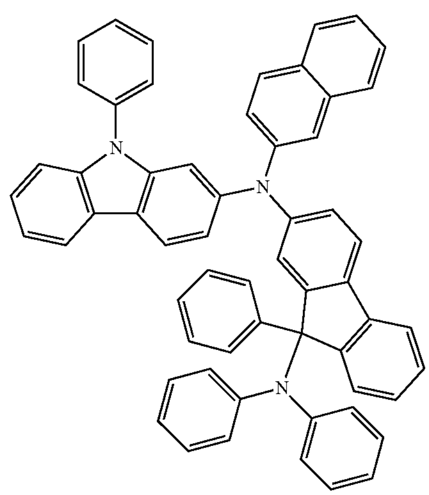

-continued
13
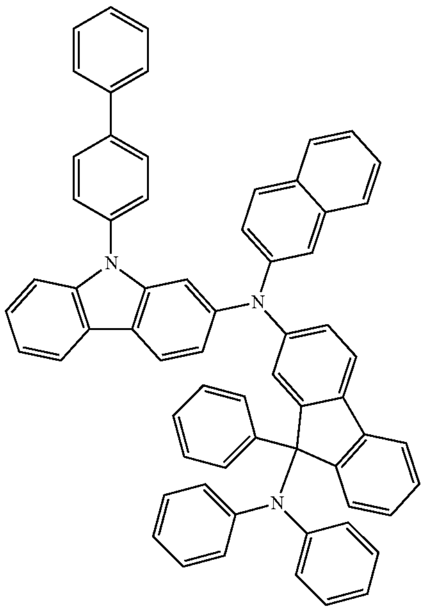
26
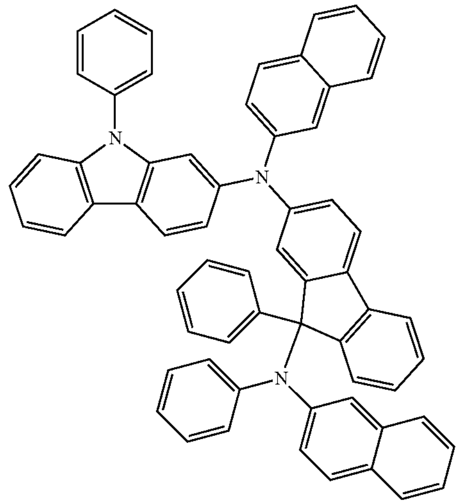
59
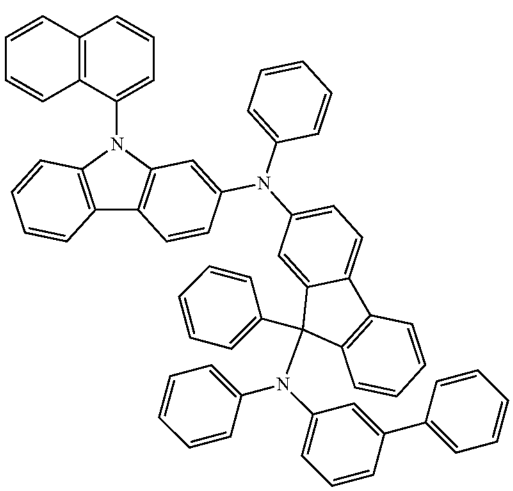
74
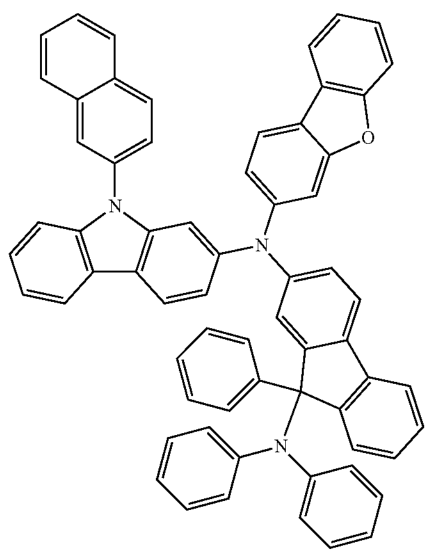

-continued

85

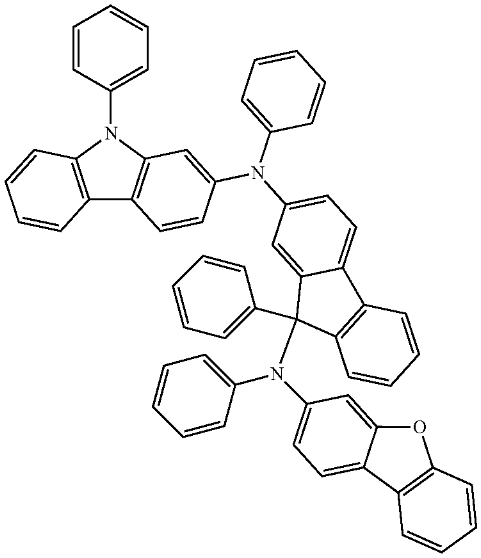

(Comparative Example Compounds)

C1

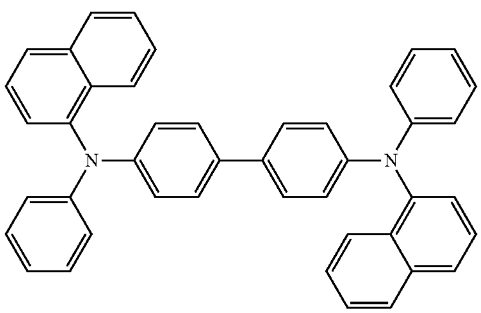

(NPB)

C2

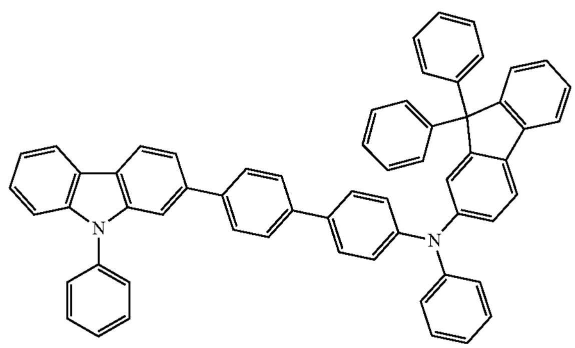

Evaluation results of the organic light-emitting elements of Example 1 to Example 7, Comparative Example 1, and Comparative Example 2 are shown in Table 2 below. Driving voltage, brightness, light-emitting efficiency, and a service life of the light-emitting elements are compared and shown in Table 2. The light-emitting efficiency shows efficiency values with respect to a current density of about 50 mA/cm$^2$. The service life shows the half-service life with respect to a current density of about 100 mA/cm$^2$.

TABLE 2

| Division | Hole transport material | Driving voltage (V) | Current density (mA/cm$^2$) | Brightness (cd/m$^2$) | Light-emitting efficiency (cd/A) | Luminous color | Half-service life (hr) |
|---|---|---|---|---|---|---|---|
| Example 1 | Compound 1 | 4.32 | 50 | 3670 | 7.34 | Blue | 362 |
| Example 2 | Compound 2 | 4.21 | 50 | 3715 | 7.43 | Blue | 353 |
| Example 3 | Compound 13 | 4.22 | 50 | 3665 | 7.33 | Blue | 372 |
| Example 4 | Compound 26 | 4.26 | 50 | 3730 | 7.46 | Blue | 374 |
| Example 5 | Compound 59 | 4.26 | 50 | 3730 | 7.46 | Blue | 374 |
| Example 6 | Compound 74 | 4.25 | 50 | 3630 | 7.26 | Blue | 384 |
| Example 7 | Compound 85 | 4.41 | 50 | 3725 | 7.45 | Blue | 343 |

TABLE 2-continued

| Division | Hole transport material | Driving voltage (V) | Current density ($mA/cm^2$) | Brightness ($cd/m^2$) | Light-emitting efficiency (cd/A) | Luminous color | Half-service life (hr) |
|---|---|---|---|---|---|---|---|
| Comparative Example 1 | Comparative Example Compound C1 | 7.01 | 50 | 2645 | 5.29 | Blue | 258 |
| Comparative Example 2 | Comparative Example Compound C2 | 4.90 | 50 | 3150 | 6.30 | Blue | 240 |

In Table 2, it can be seen that the organic light-emitting elements of Example 1 to Example 7 have low driving voltage, and high brightness compared to the organic light-emitting elements of Comparative Example 1 and Comparative Example 2.

It can be seen that the organic light-emitting elements of Example 1 to Example 7 have increased light-emitting efficiency and improved service life compared to the organic light-emitting elements. It can be seen that the light-emitting elements of Example 1 to Example 7 has a light-emitting efficiency of about 7.20 cd/A or more, and a half-service life of 300 hours or longer.

The organic light-emitting element of Comparative Example 1 uses NPB as a hole transport material, and the light-emitting element of Comparative Example 2 uses the aforementioned Comparative Example Compound C2 as a hole transport material. The organic light-emitting elements of Example 1 to Example 7 use Compounds 1, 2, 13, 26, 59, 74, and 85, which are the amine compound of Examples, as a hole transport layer material. Accordingly, it can be determined that the organic light-emitting elements of Examples 1 to 7 exhibit an improved efficiency and improved service life.

In amine compound of an Example, a substituted fluorenyl group and a substituted carbazole group may be bonded to a nitrogen atom. In the substituted fluorenyl group, a nitrogen atom of an amine group may be bonded to the pentagonal ring, and the amine group may be substituted with an aryl group or a heteroaryl group. Accordingly, the amine compound of an example may exhibit improved charge-transport properties.

In the organic light-emitting element of an Example, the amine compound of an Example may be included in a hole transport region. Accordingly, the organic light-emitting element may exhibit excellent light-emitting efficiency and long service life characteristics.

A light-emitting element of an embodiment may exhibit improved device characteristics with a low driving voltage, high efficiency, and a long service life.

A light-emitting element of an embodiment may include an amine compound of an embodiment, in a hole transport region, thereby exhibiting high efficiency and long service life characteristics.

An amine compound of an embodiment may improve light-emitting efficiency and element service life of a light-emitting element.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An amine compound represented by Formula 1:

[Formula 1]

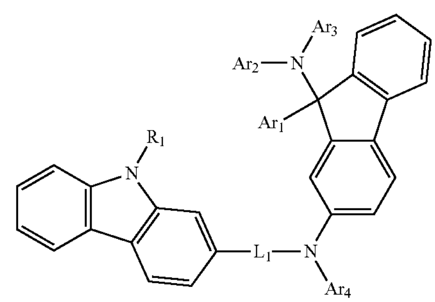

wherein in Formula 1, $L_1$ is a direct linkage, a substituted or unsubstituted arylene group having 6 to 30 ring-forming carbon atoms, or a substituted or unsubstituted heteroarylene group having 2 to 30 ring-forming carbon atoms, $R_1$ is a substituted or unsubstituted aryl group having 6 to 30 ring-forming carbon atoms, and $Ar_1$ to $Ar_4$ are each independently a substituted or unsubstituted aryl group having 6 to 30 ring-forming carbon atoms, or a substituted or unsubstituted heteroaryl group having 2 to 30 ring-forming carbon atoms.

2. The amine compound of claim 1, wherein $Ar_2$ and $Ar_3$ are each independently an unsubstituted phenyl group, an unsubstituted naphthyl group, an unsubstituted biphenyl group, an unsubstituted dibenzofuran group, or an unsubstituted dibenzothiophene group.

3. The amine compound of claim 1, wherein the amine compound represented by Formula 1 is represented by one of Formula 1-1 to Formula 1-4:

[Formula 1-1]
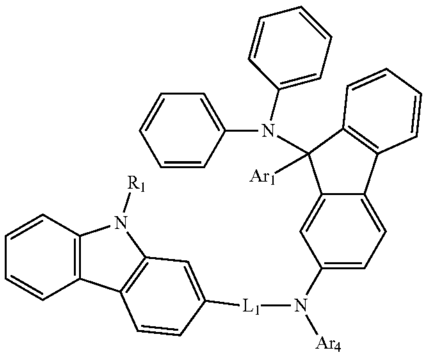
[Formula 1-2]
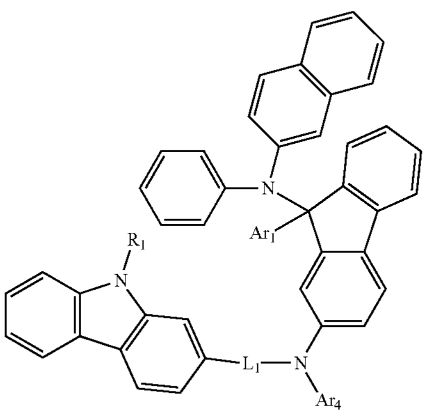
[Formula 1-3]
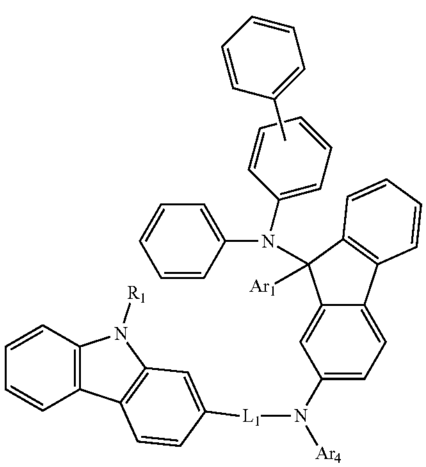
-continued
[Formula 1-4]
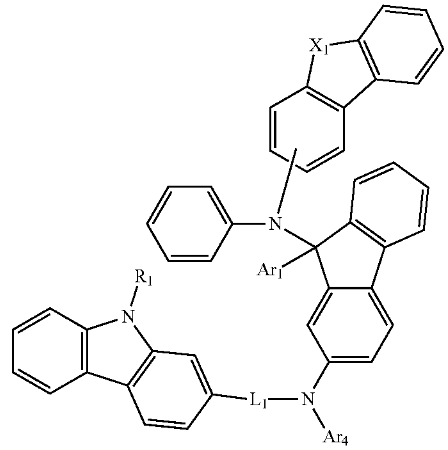
wherein in Formula 1-4,
$X_1$ is O or S, and
wherein in Formula 1-1 to Formula 1-4,
$L_1$, $R_1$, $Ar_1$, and $Ar_4$ are each the same as defined in Formula 1.
4. The amine compound of claim 3, wherein the amine compound represented by Formula 1-4 is represented by Formula 1-4A or Formula 1-4B:
[Formula 1-4A]
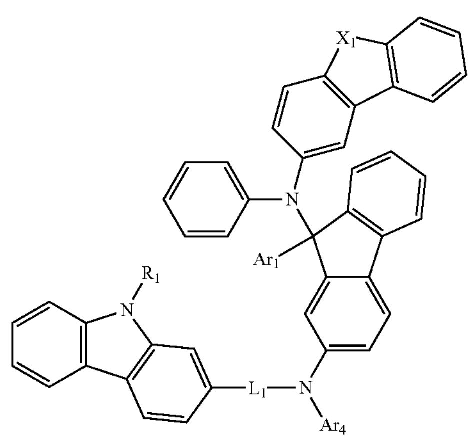

-continued

[Formula 1-4B]

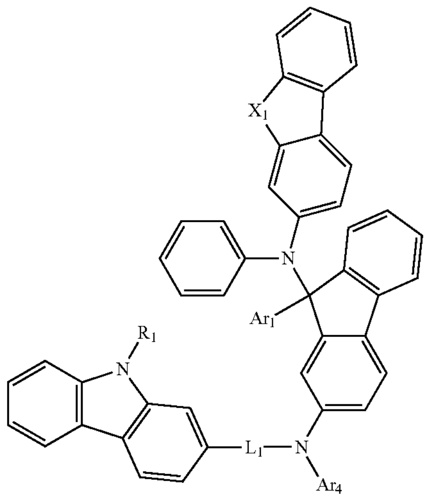

wherein in Formula 1-4A and Formula 1-4B, $L_1$, $R_1$, $Ar_1$, $Ar_4$, and $X_1$ are each the same as defined in Formula 1-4.

5. The amine compound of claim 1, wherein one of $Ar_2$ to $Ar_4$ is a carbazole group substituted with a phenyl group, an unsubstituted dibenzofuran group, or an unsubstituted dibenzothiophene group, and the remainder of $Ar_2$ to $Ar_4$ are each a substituted or unsubstituted aryl group having 6 to 30 ring-forming carbon atoms.

6. The amine compound of claim 1, wherein $Ar_4$ is a group represented by one of Ar4-1 to Ar4-6:

Ar4-1

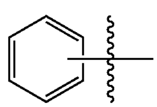

Ar4-2

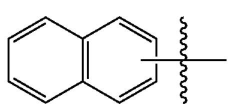

Ar4-3

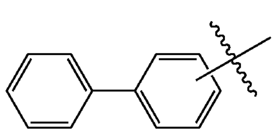

Ar4-4

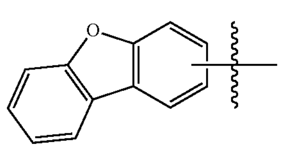

Ar4-5

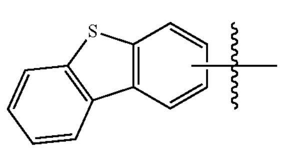

-continued

Ar4-6

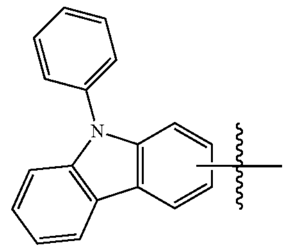

wherein in Ar4-1 to Ar4-6,

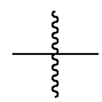

represents a binding site to a neighboring atom.

7. The amine compound of claim 1, wherein $R_1$ is a group represented by one of R1-1 to R1-4:

R1-1

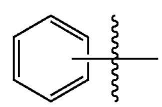

R1-2

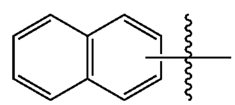

R1-3

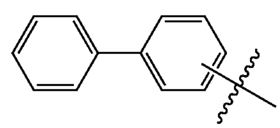

R1-4

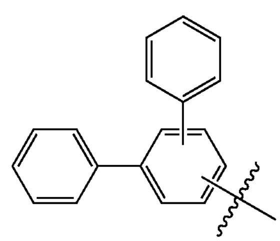

wherein in R1-1 to R1-4,

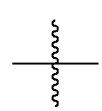

represents a binding site to a neighboring atom.

8. The amine compound of claim 1, wherein $L_1$ is a direct linkage, and $Ar_1$ is an unsubstituted phenyl group.

9. The amine compound of claim 1, wherein the amine compound represented by Formula 1 is one selected from Compound Group 1:

[Compound Group 1]
1
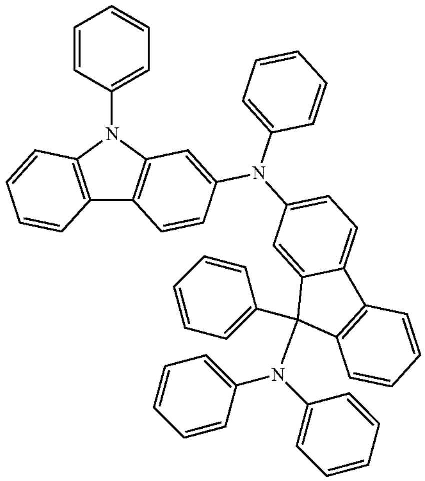
2
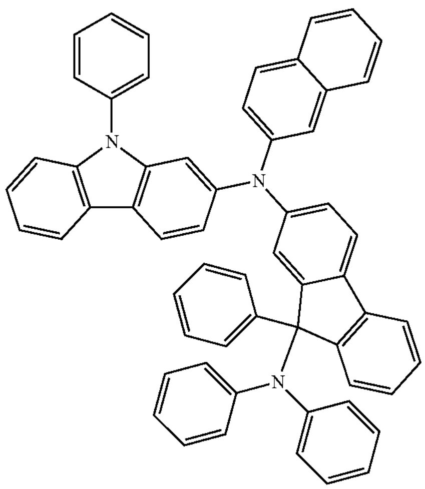
3
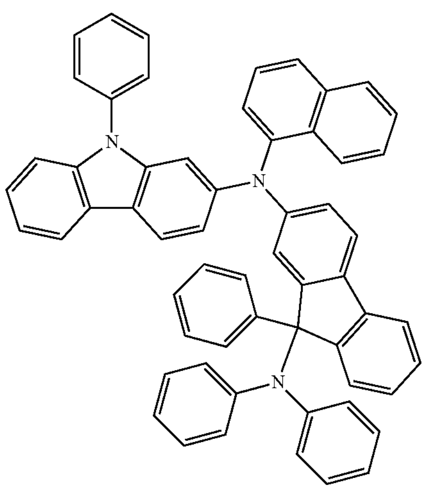
-continued
4
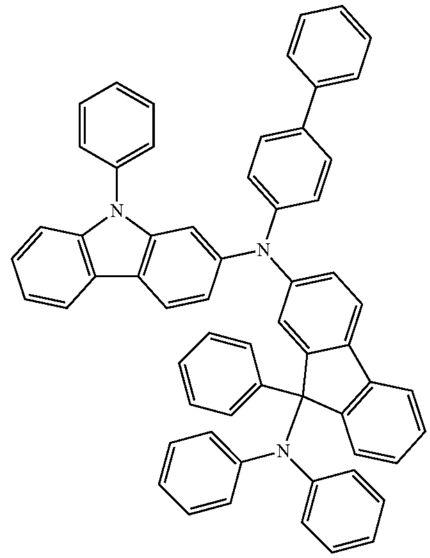
5
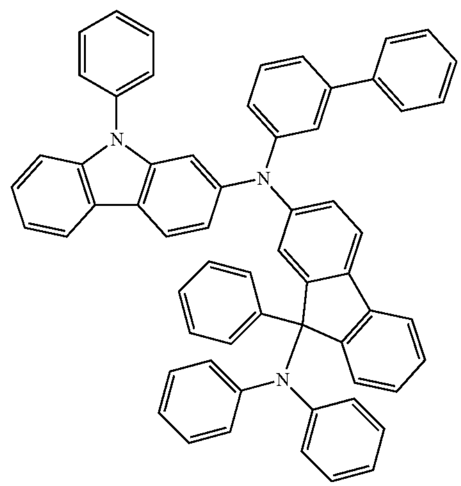
6
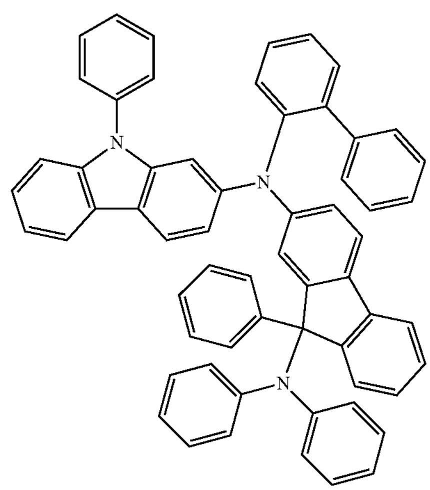

-continued
7
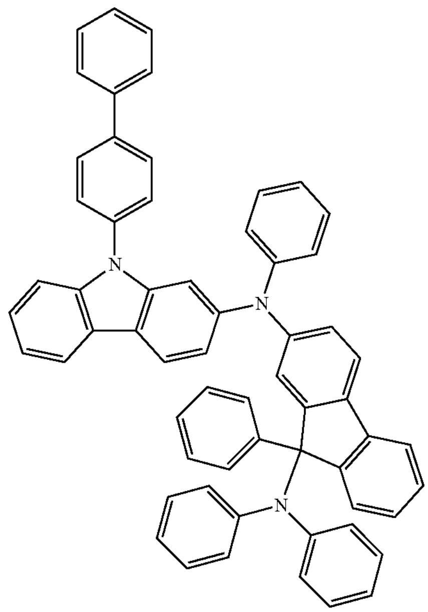
8
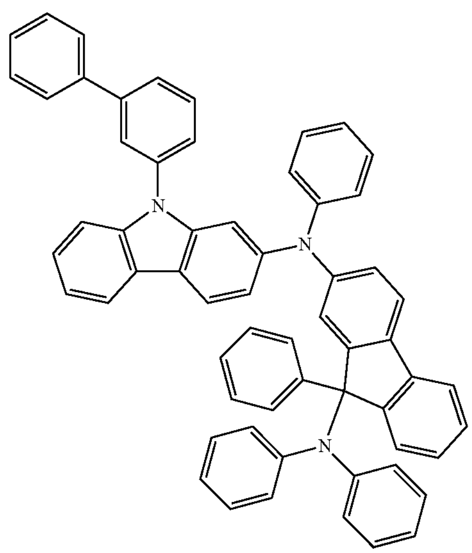
9
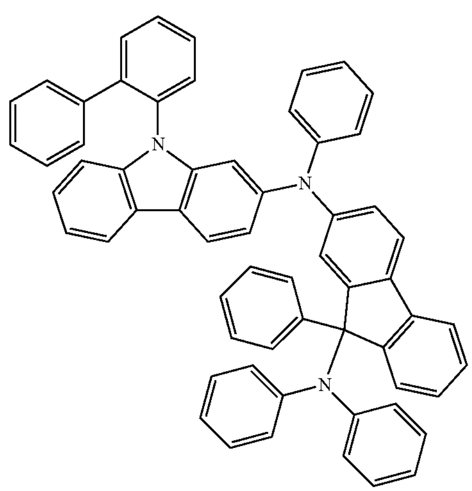
-continued
10
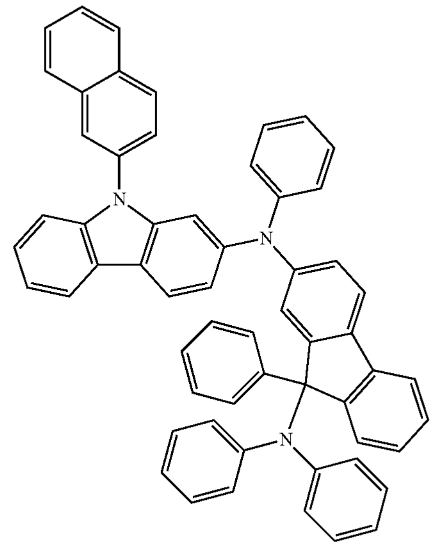
11
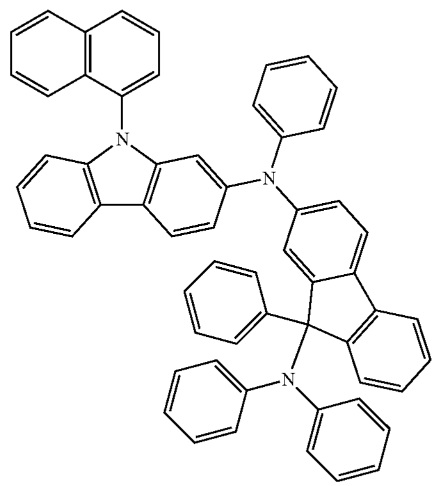
12
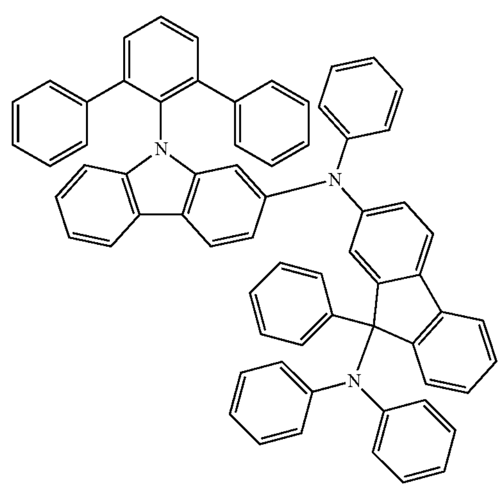

-continued
13
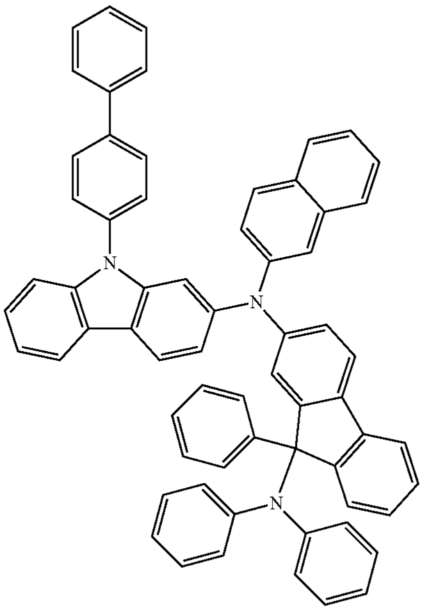
14
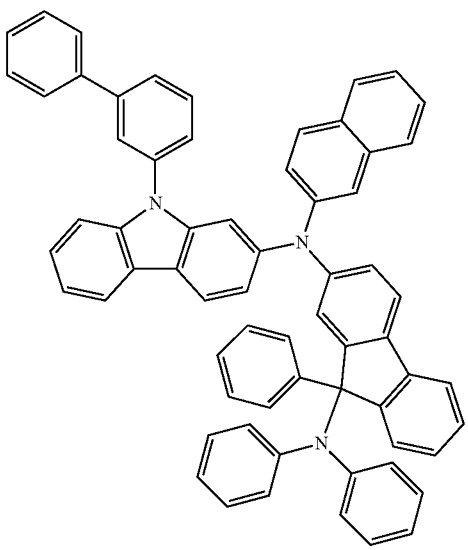
15
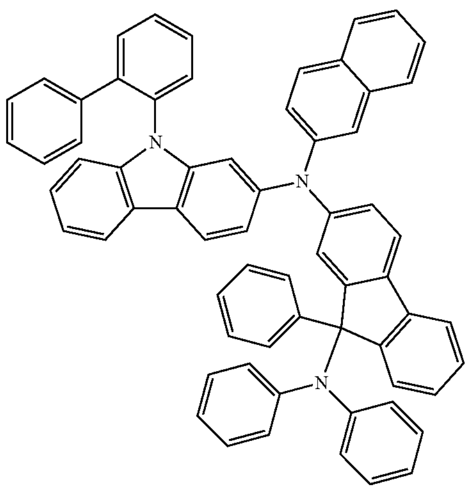
-continued
16
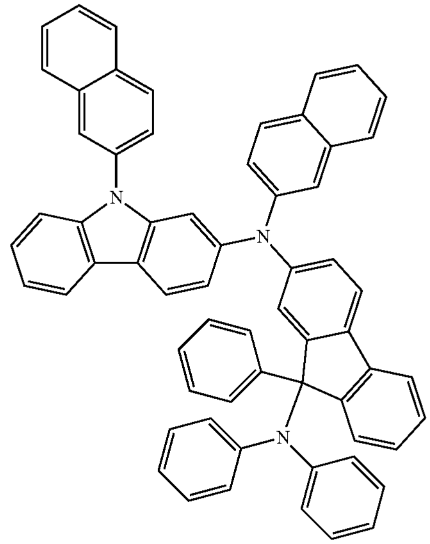
17
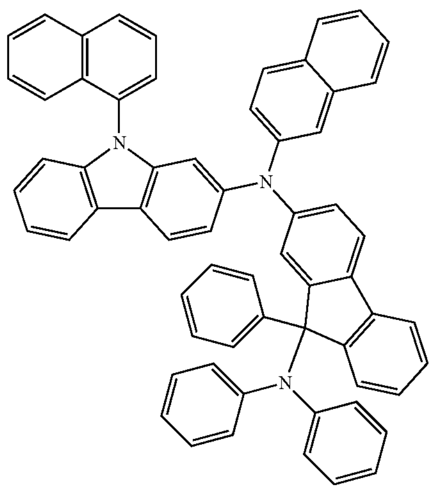
18
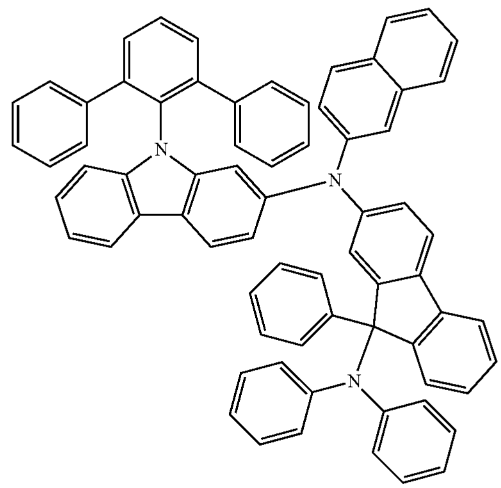

19
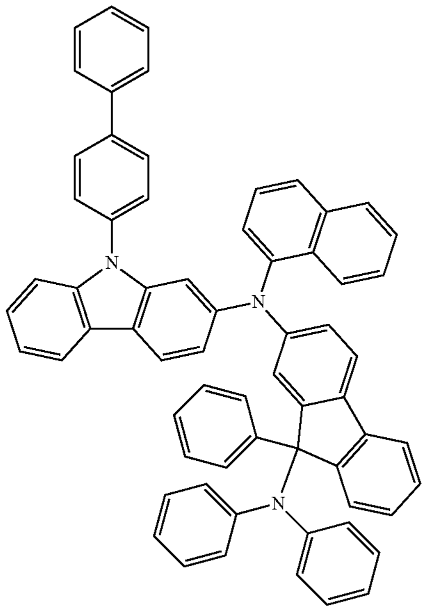
20
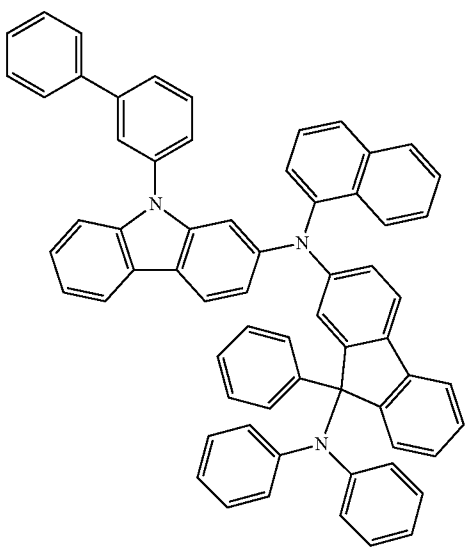
21
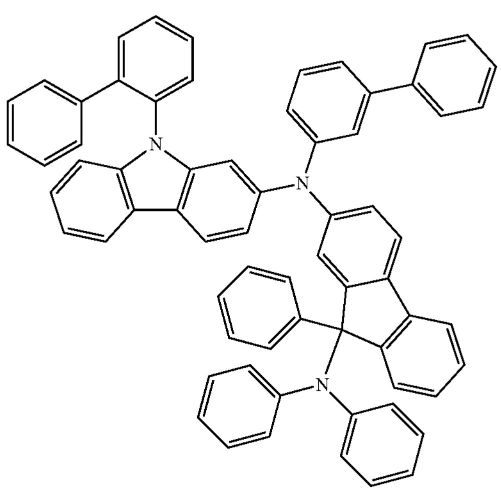
22
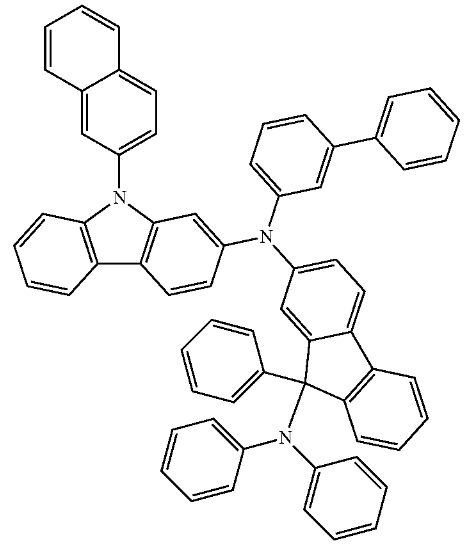
23
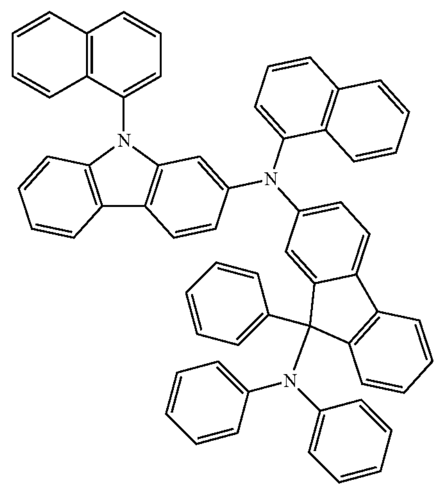
24
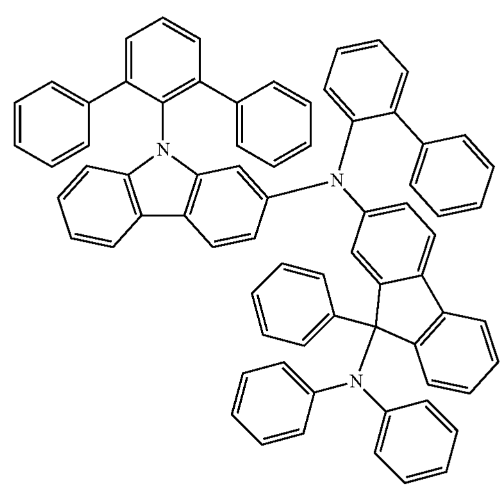

-continued
25
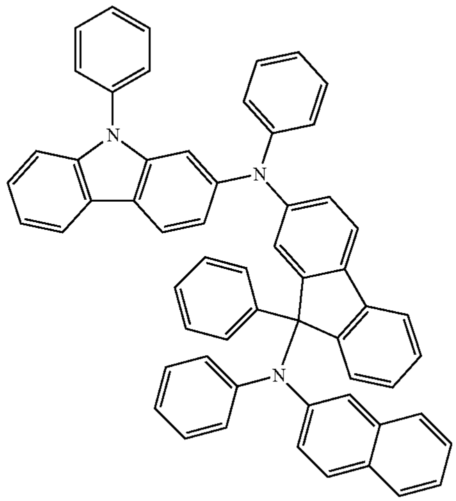
26
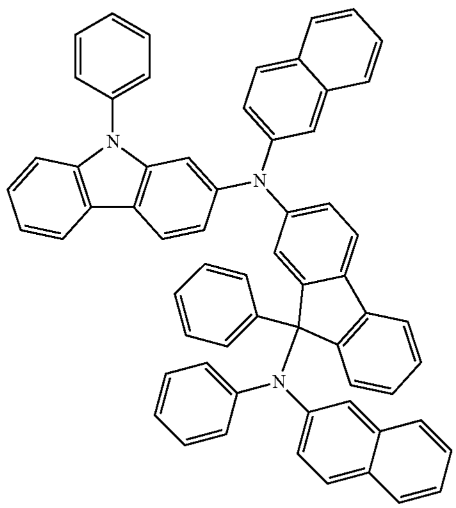
27
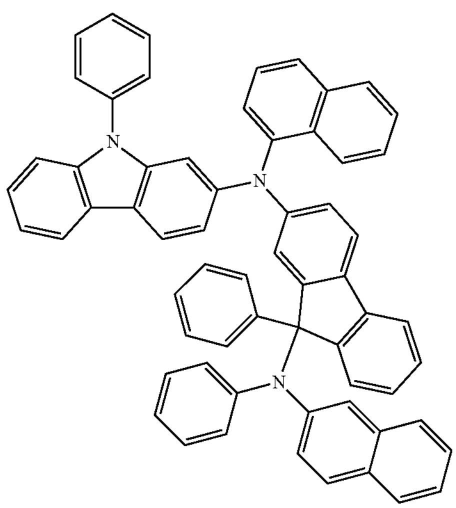
-continued
28
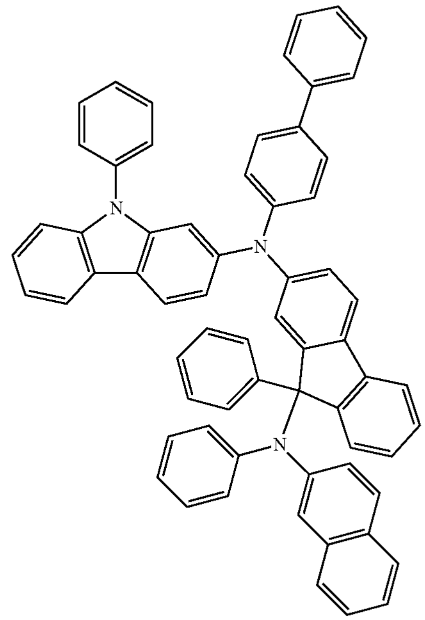
29
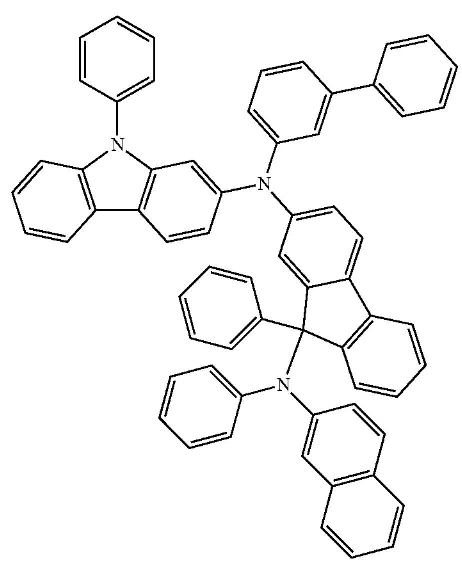

-continued
30
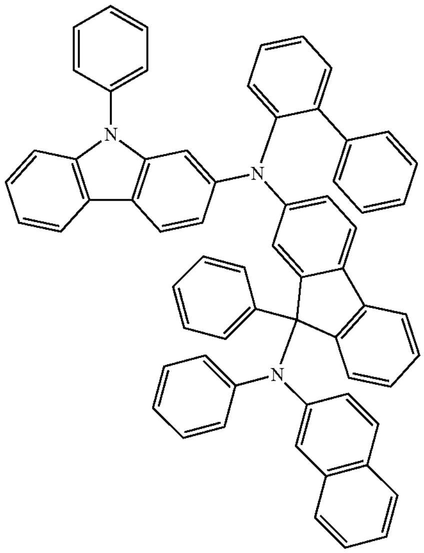
31
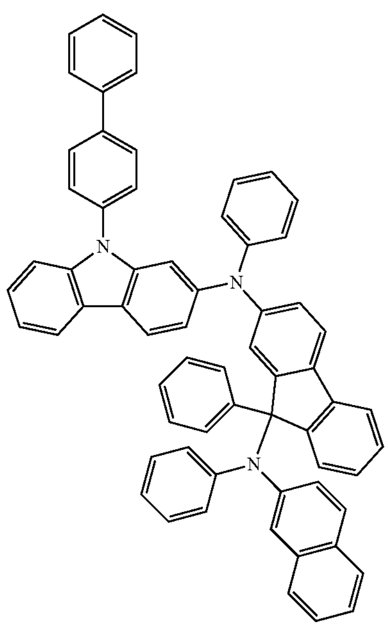
-continued
32
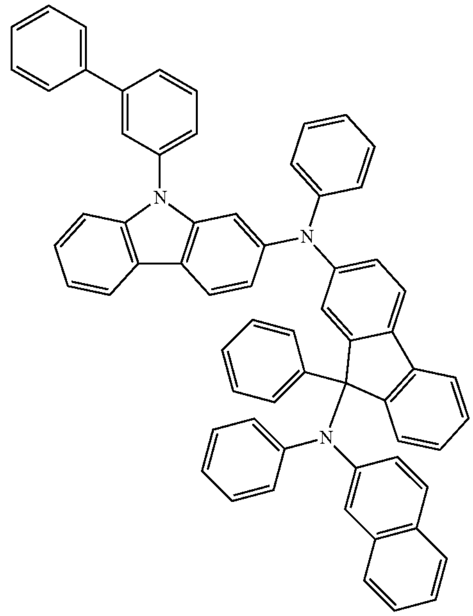
33
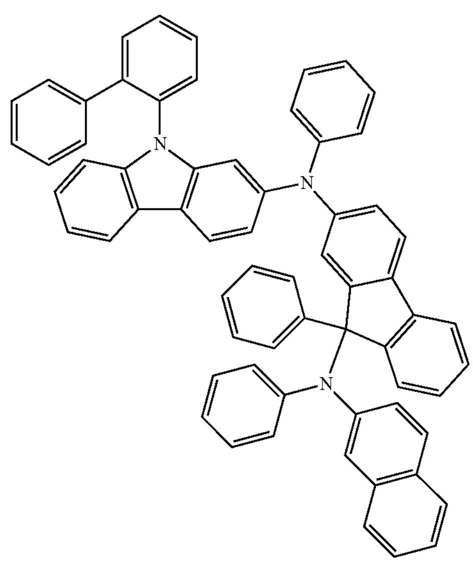

-continued
34
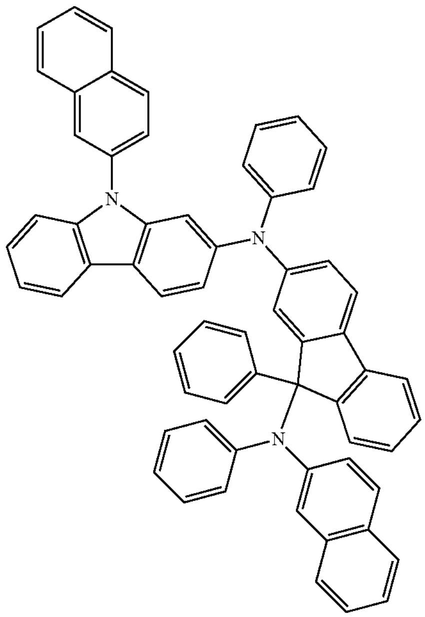
35
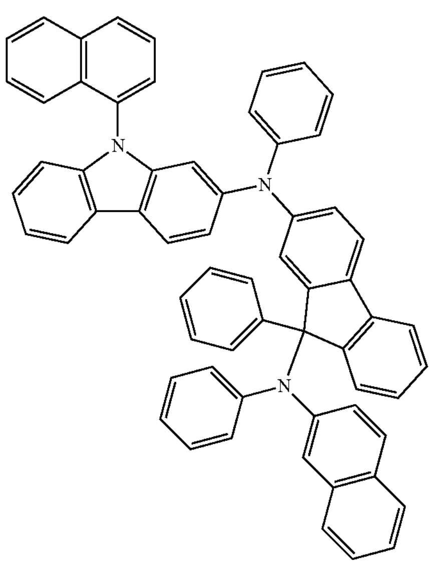
-continued
36
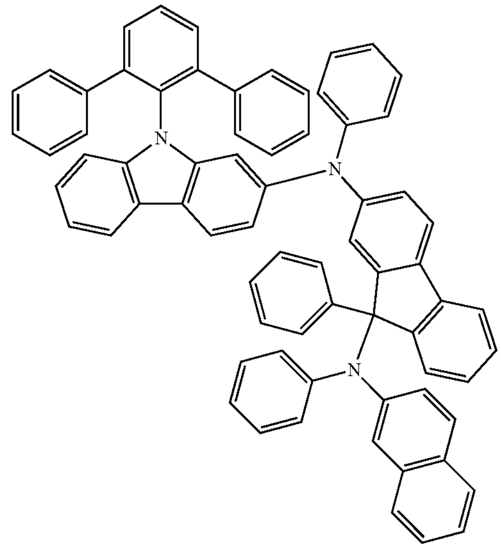
37
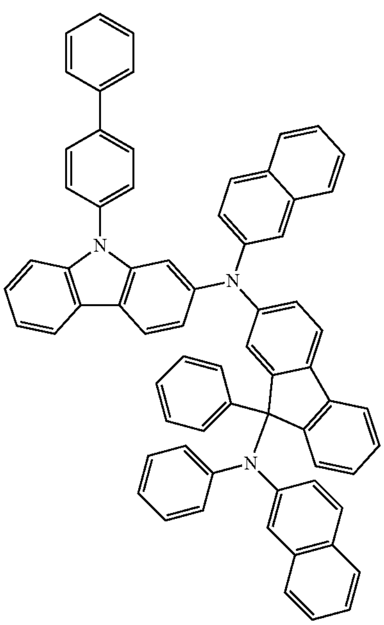

-continued
38
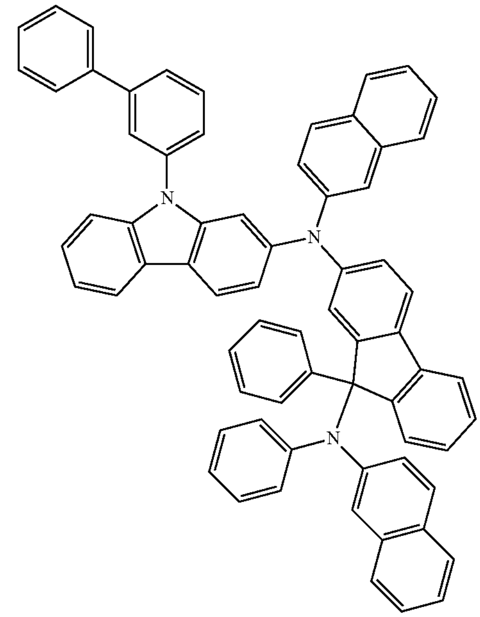
-continued
40
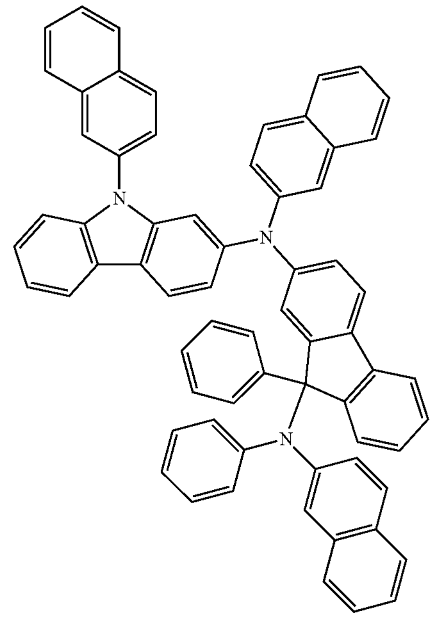
39
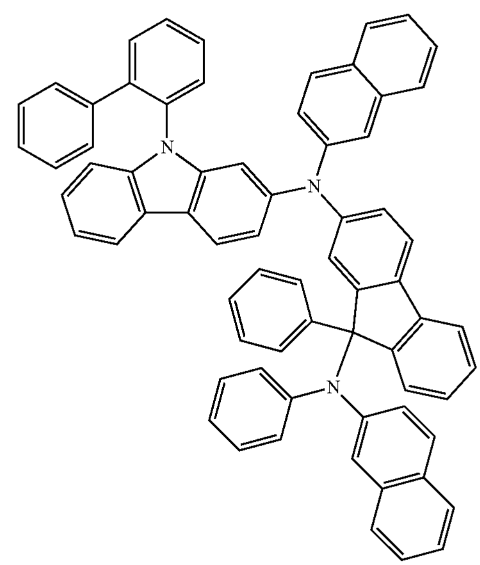
41
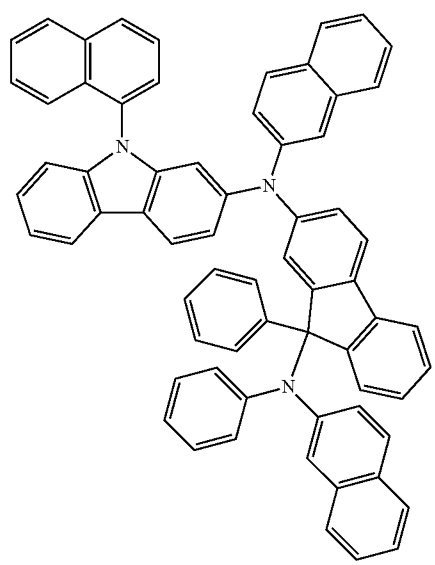

-continued
42
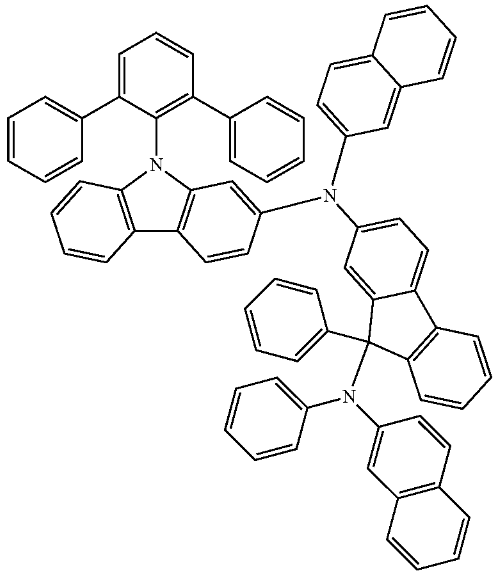
-continued
44
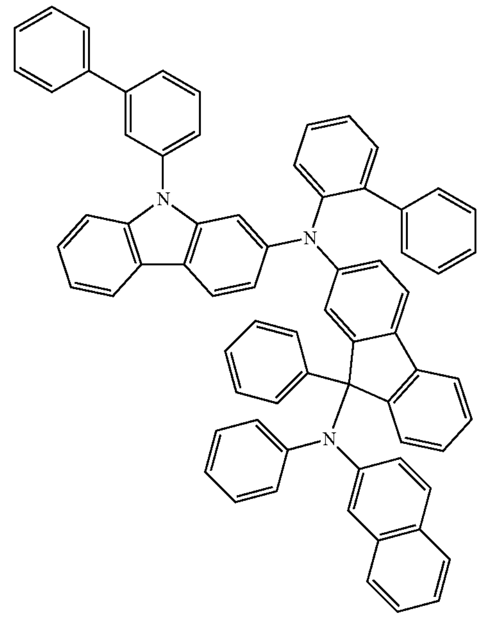
43
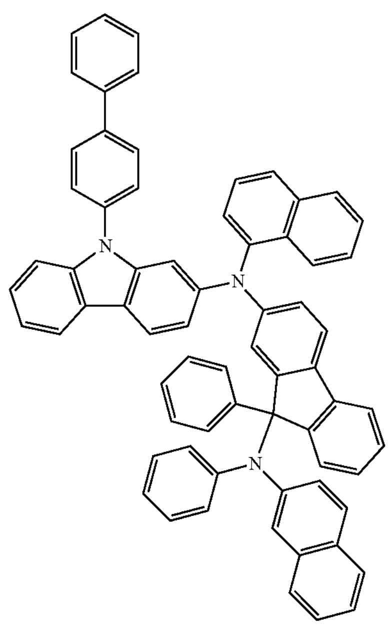
45
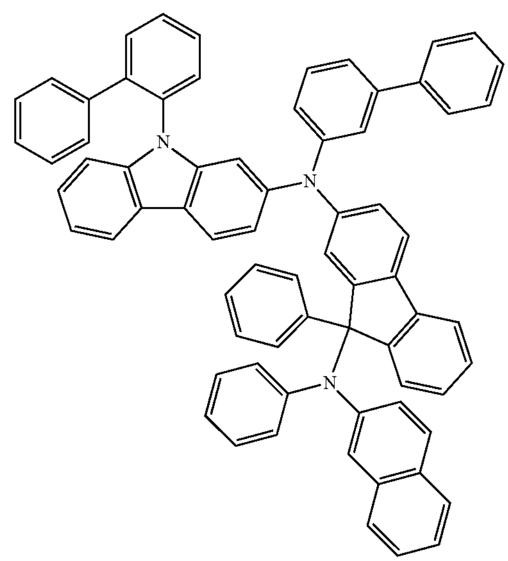

-continued
46
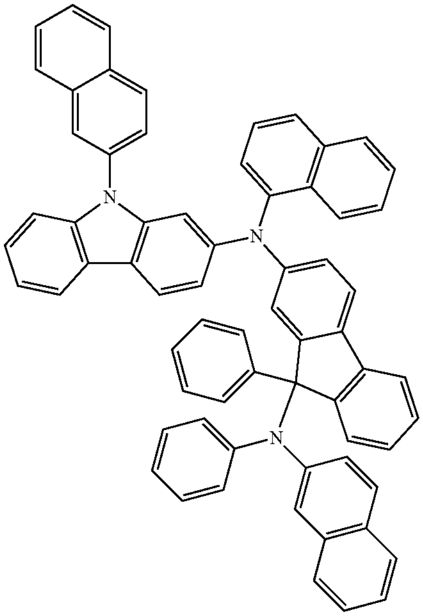
47
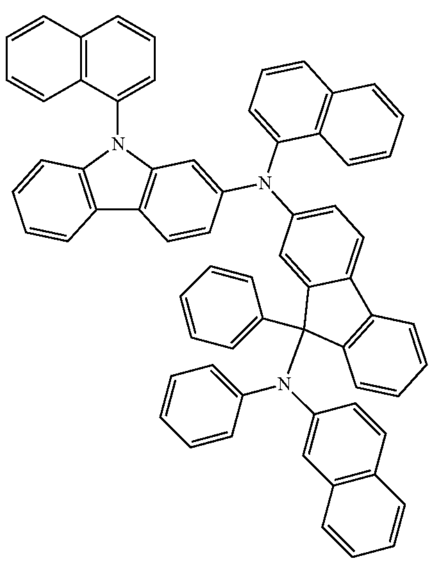
-continued
48
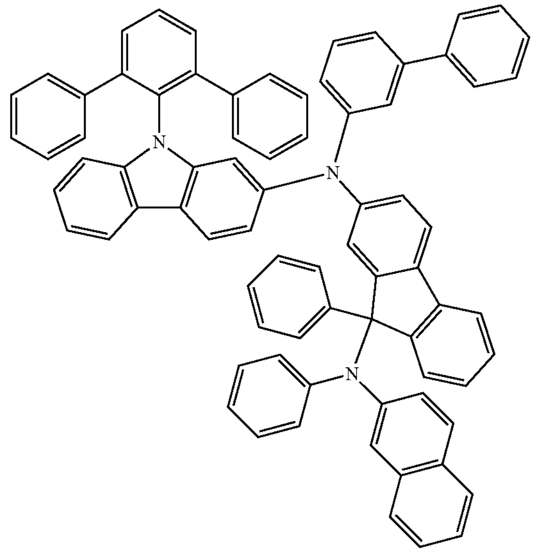
49
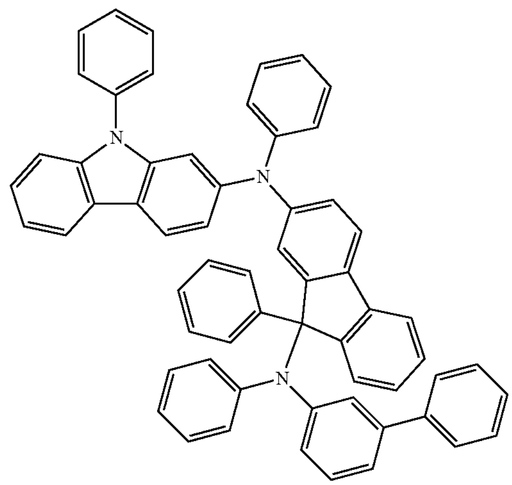
50
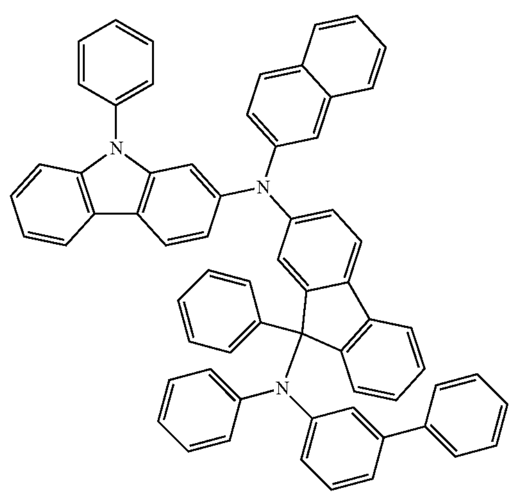

-continued
51
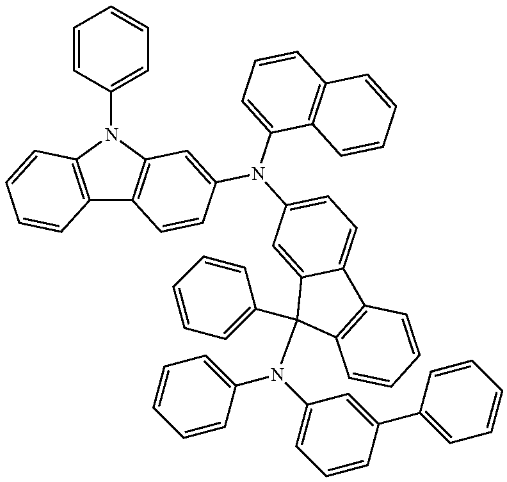
52
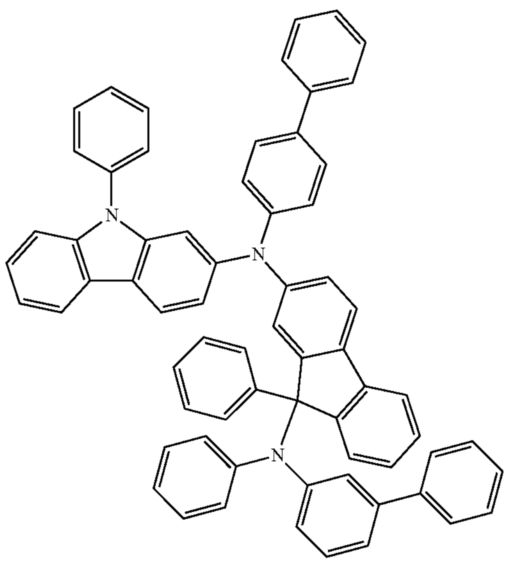
53
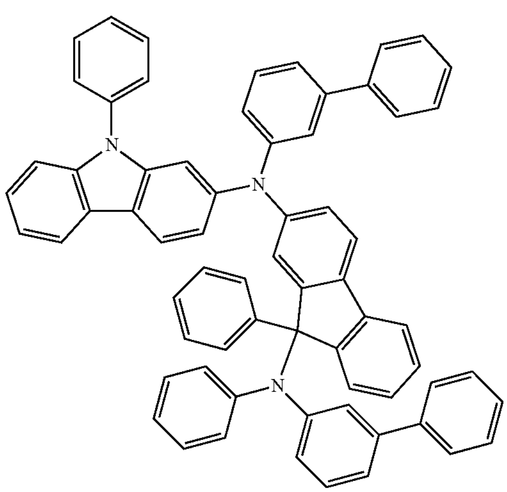
-continued
54
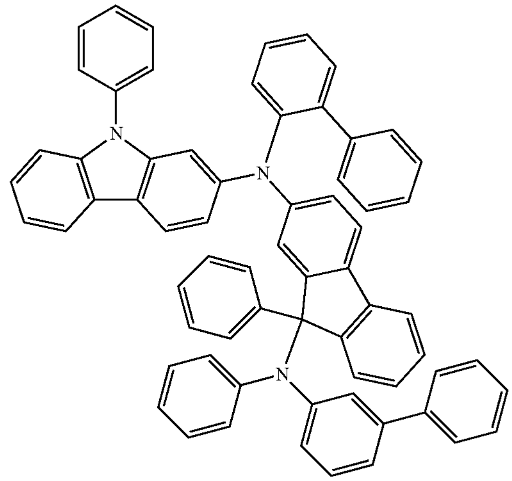
55
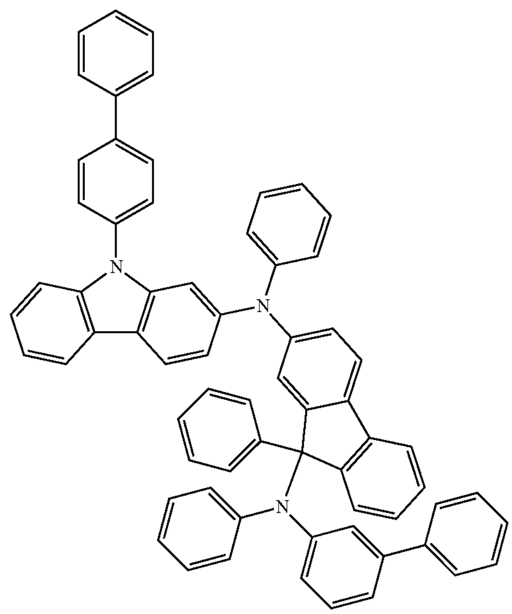
56
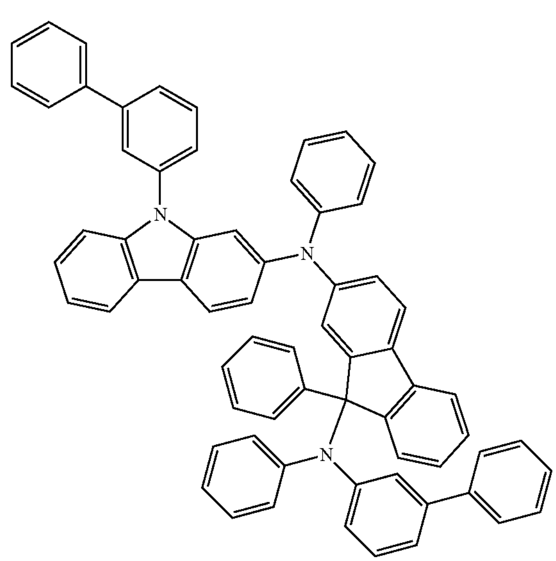

-continued
57
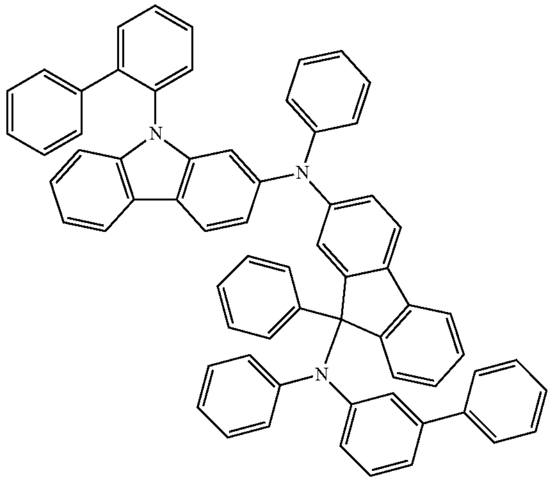
58
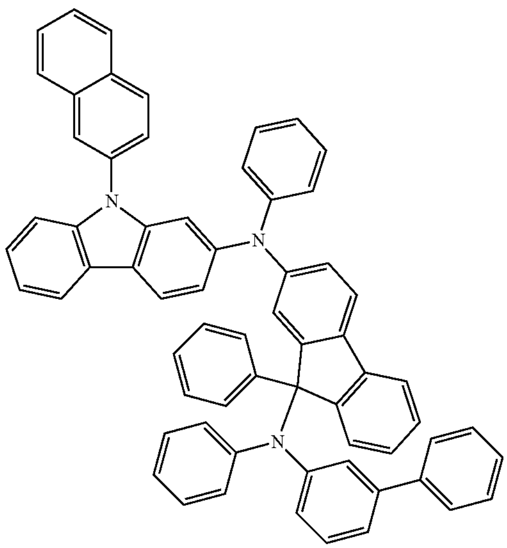
59
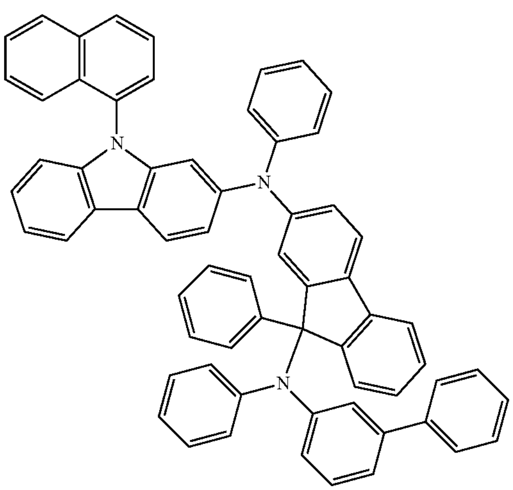
-continued
60
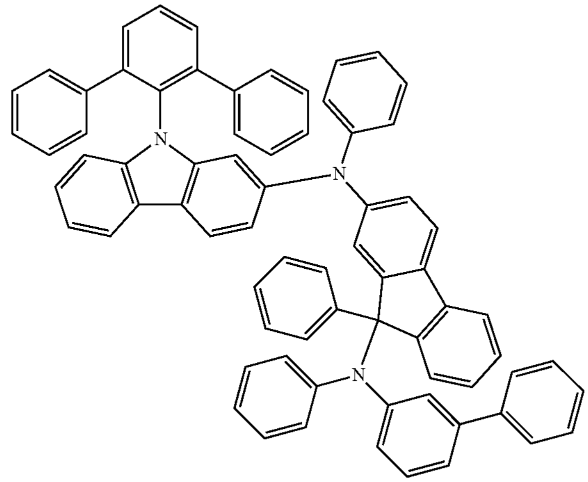
61
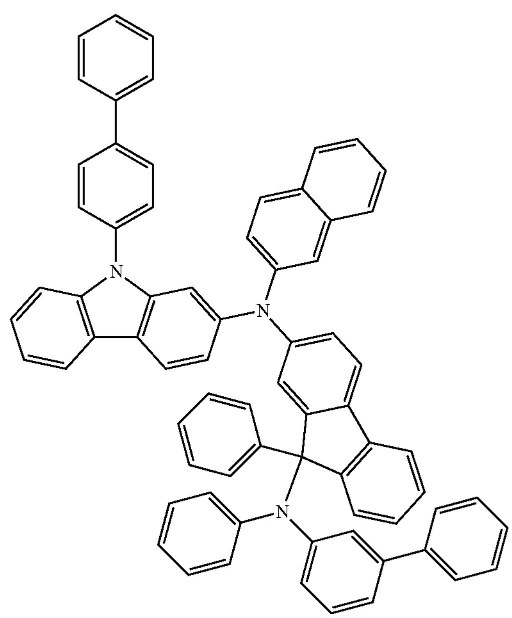

-continued
62
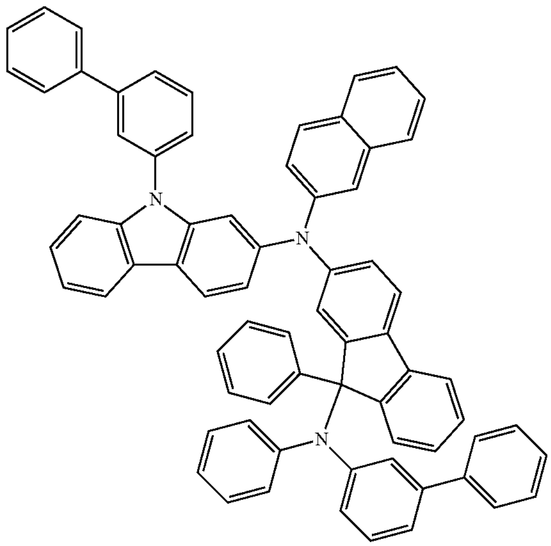
63
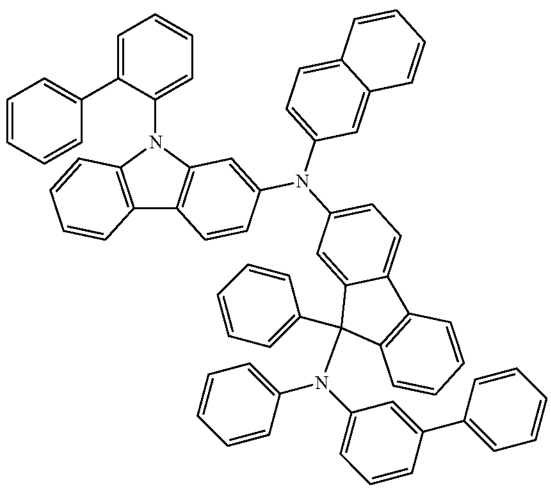
64
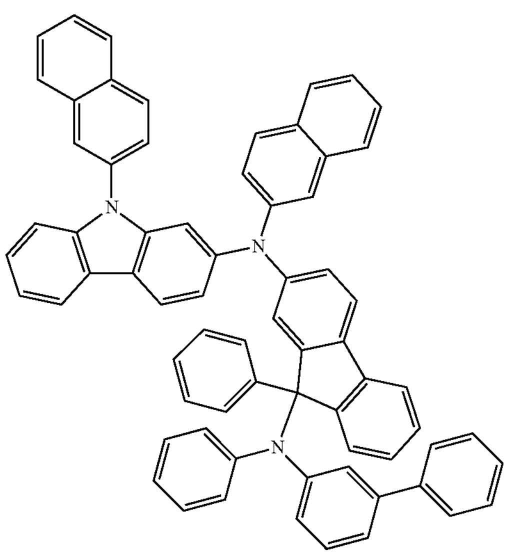
-continued
65
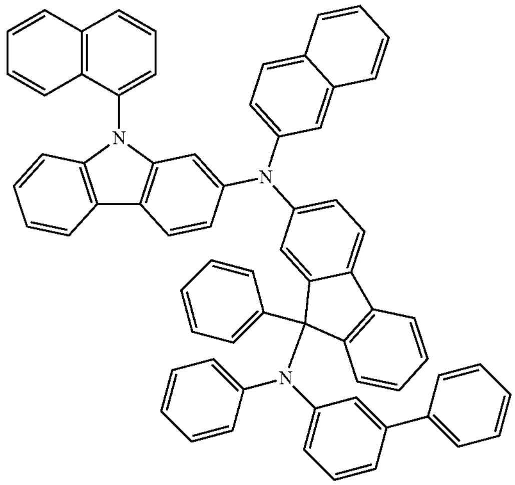
66
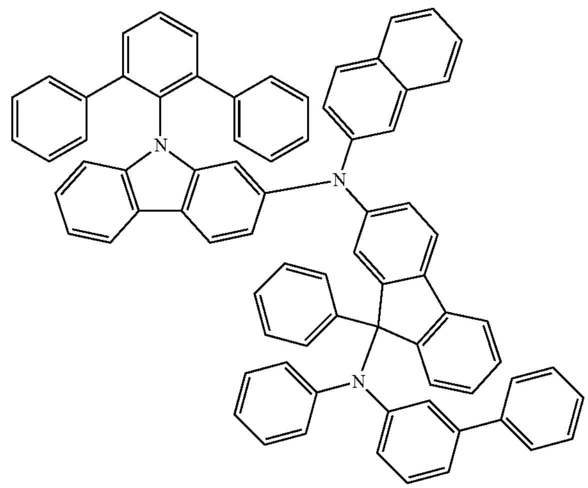
67
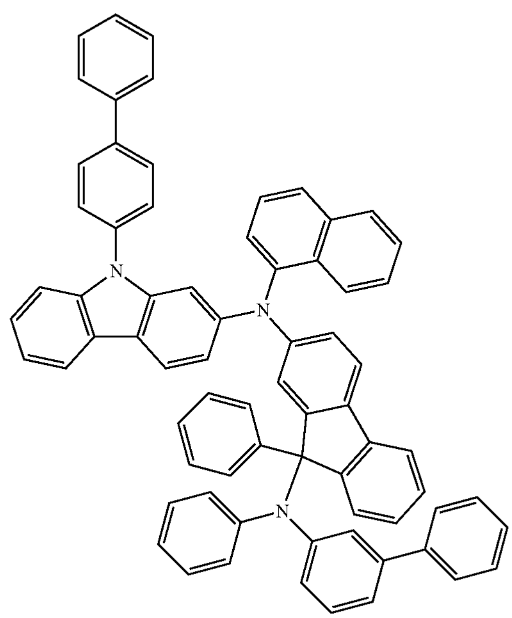

-continued
68
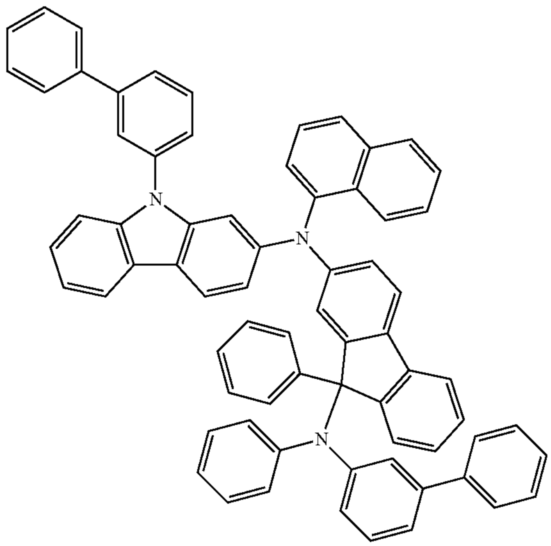
69
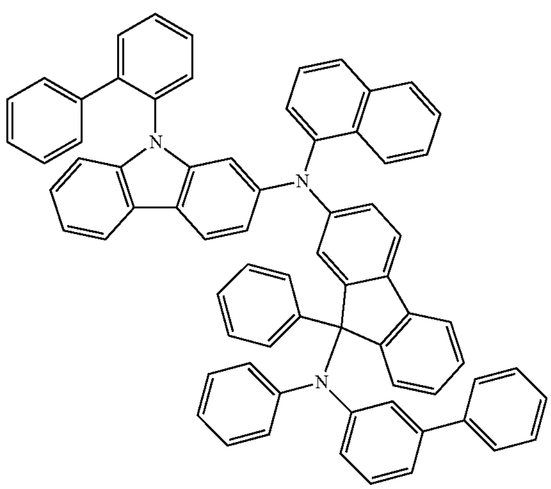
70
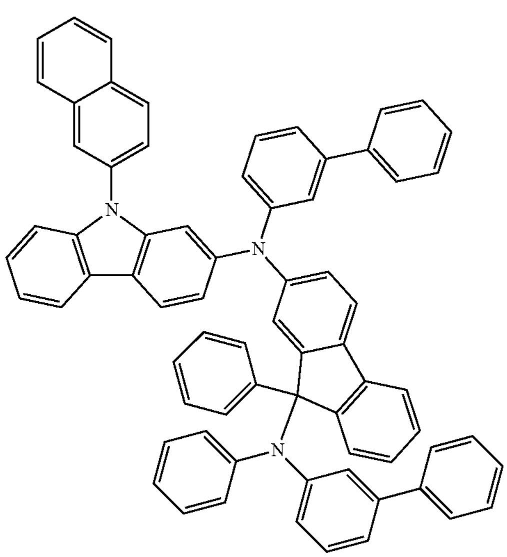
-continued
71
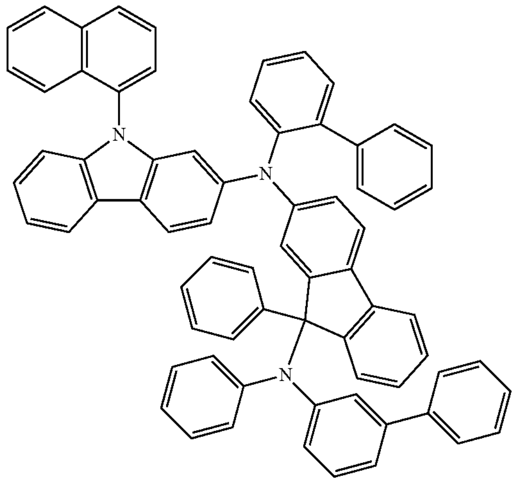
72
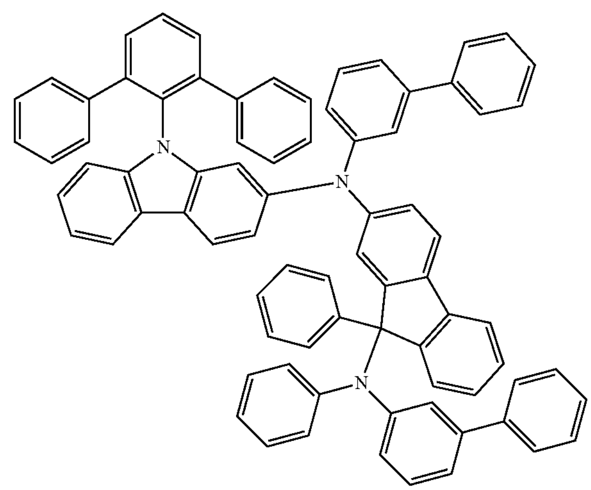
73
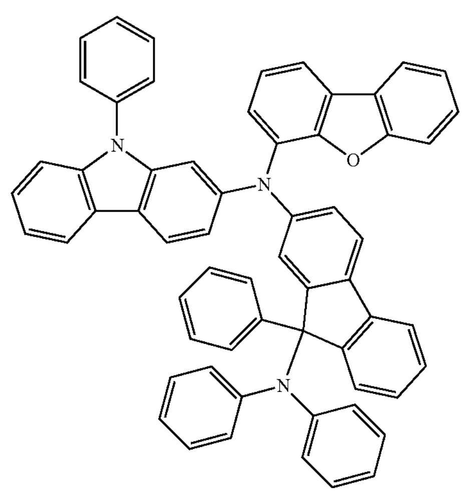

74
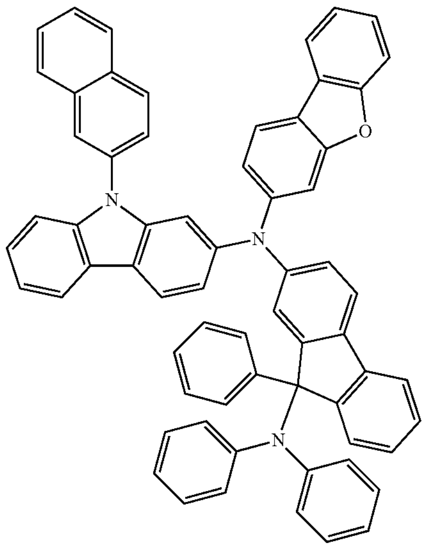
75
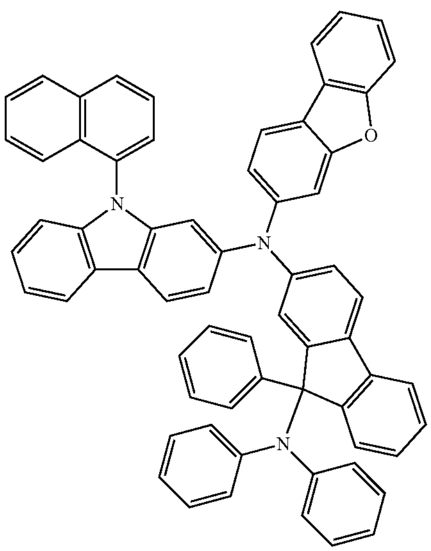
76
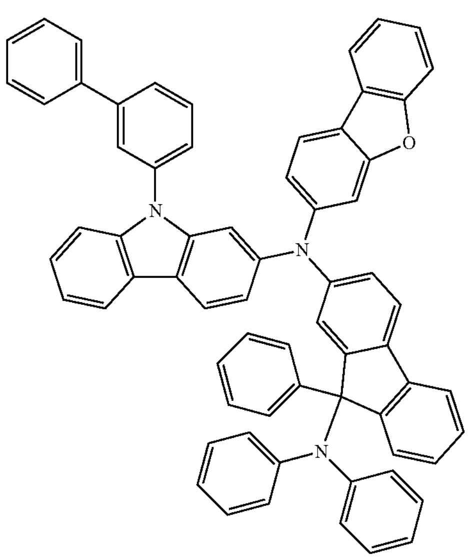
77
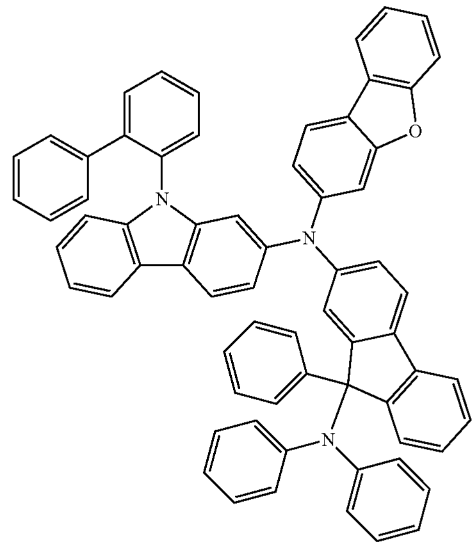
78
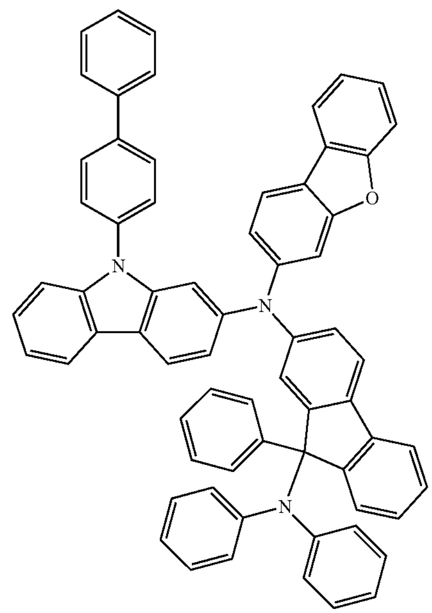
79
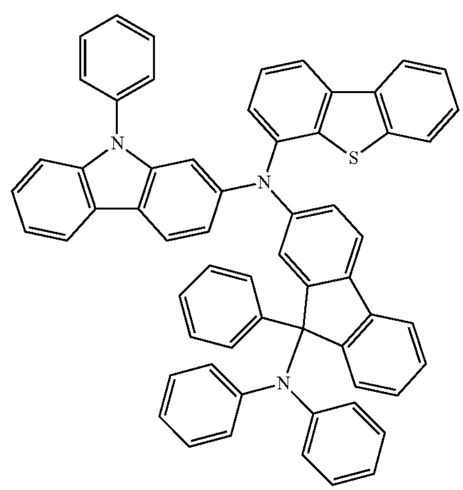

80
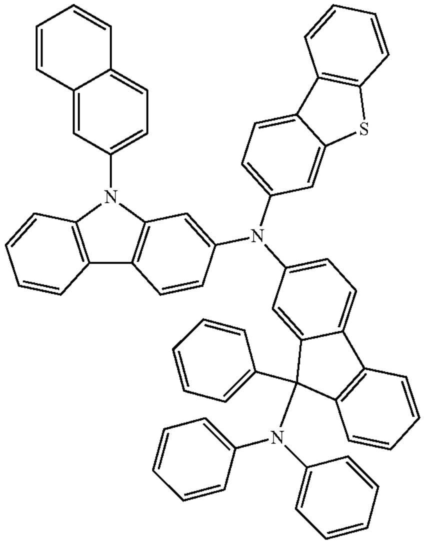
81
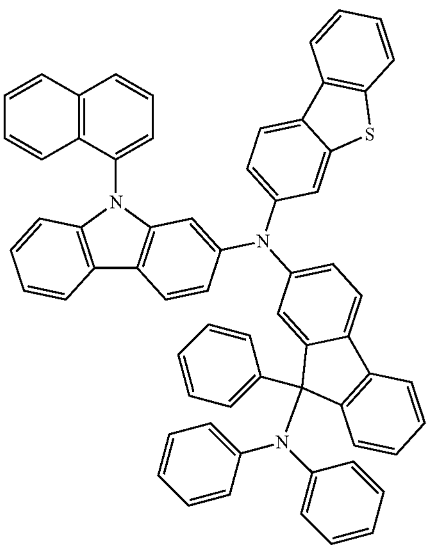
82
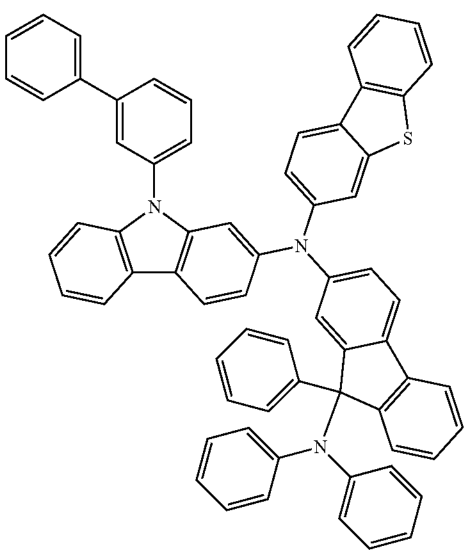
83
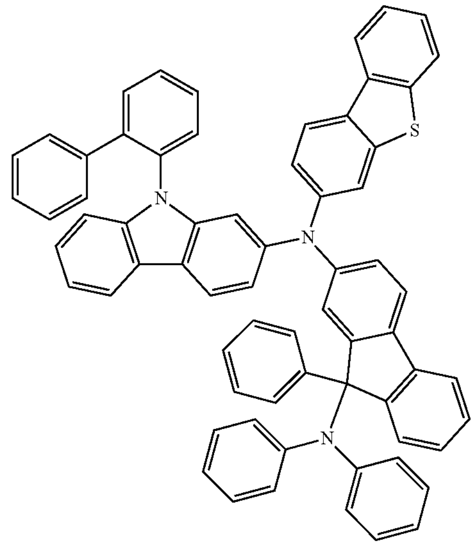
84
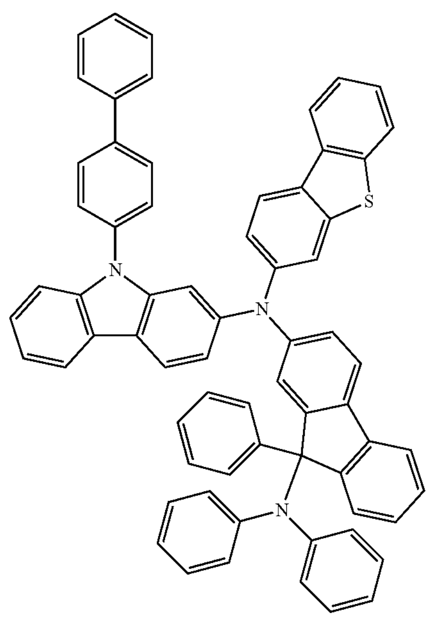

-continued
85
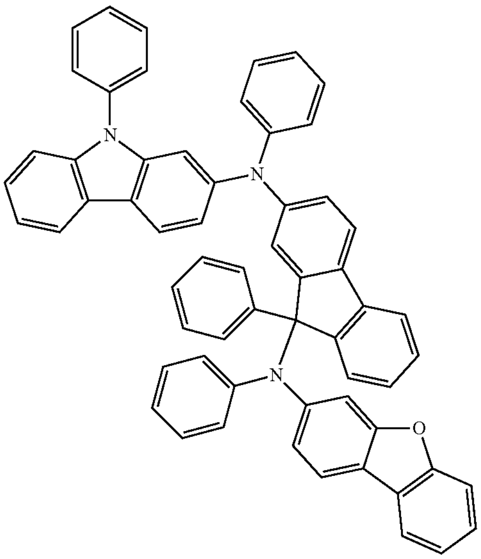
86
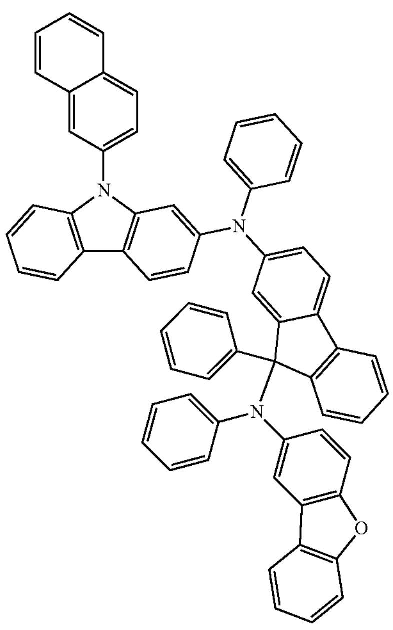
-continued
87
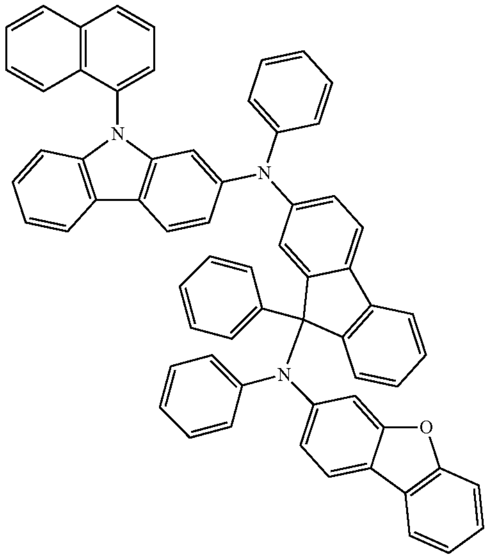
88
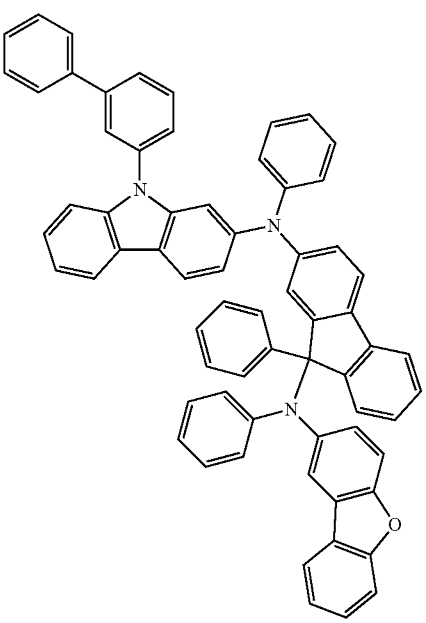

-continued
89
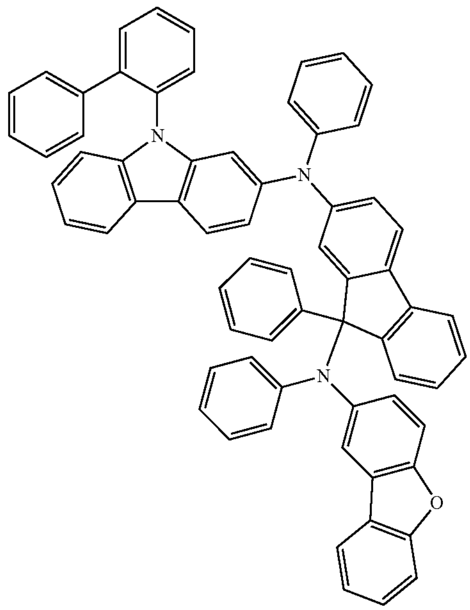
90
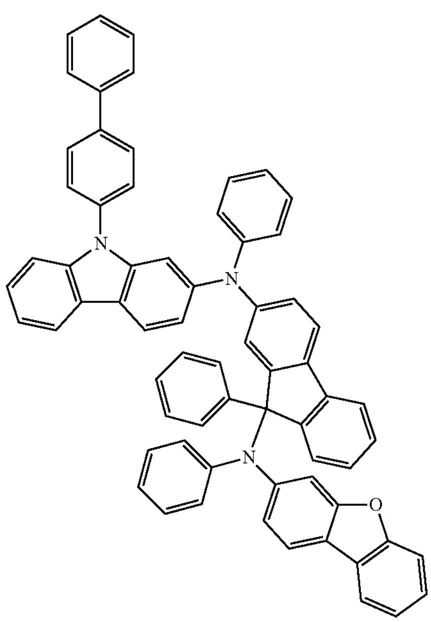
-continued
91
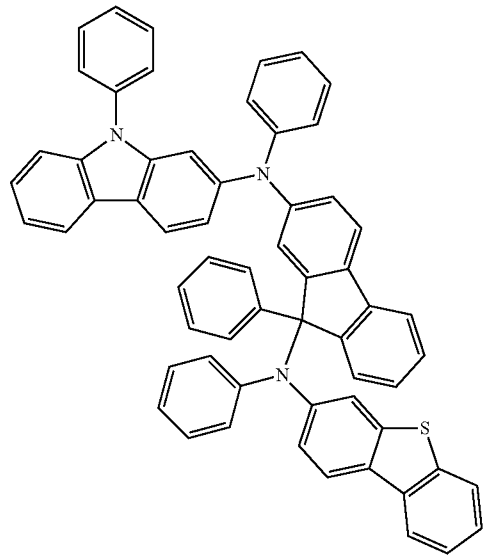
92
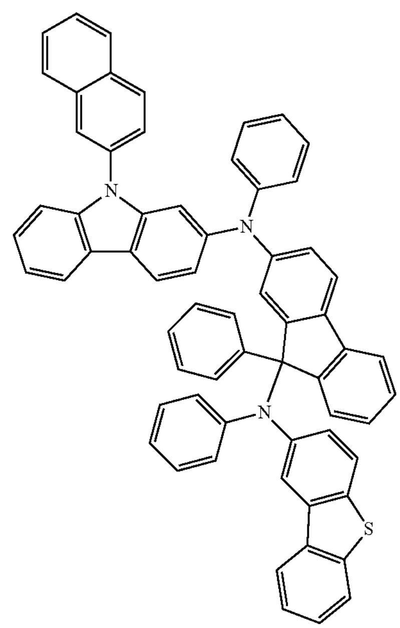

-continued
93
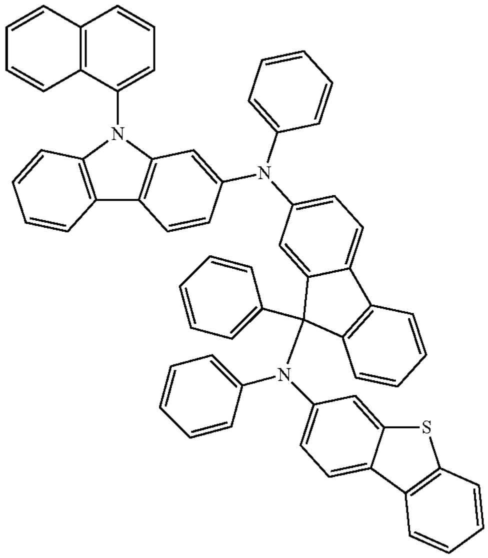
94
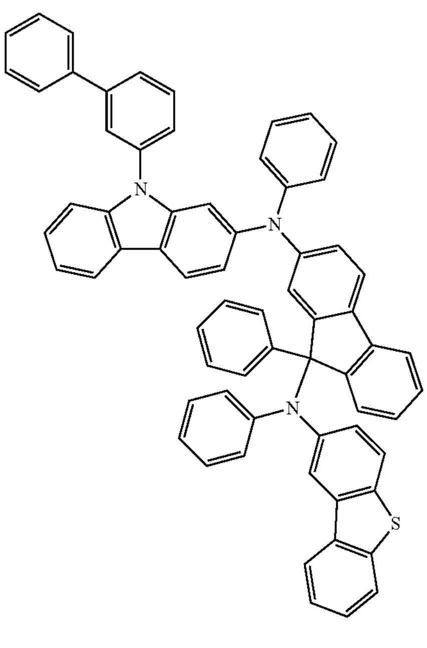
-continued
95
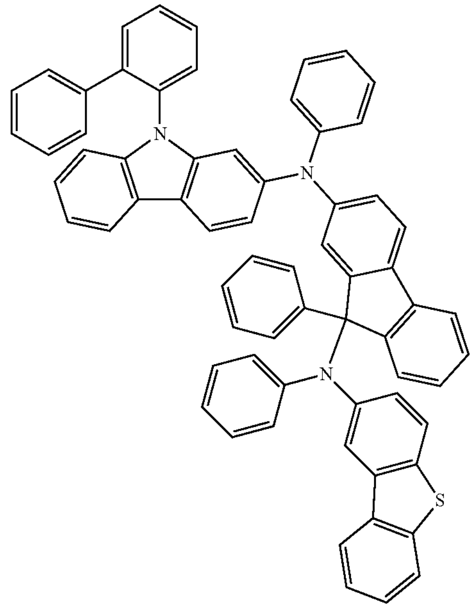
96
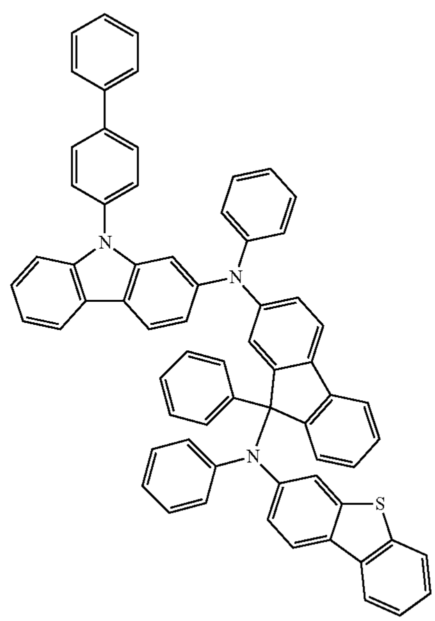

-continued
97
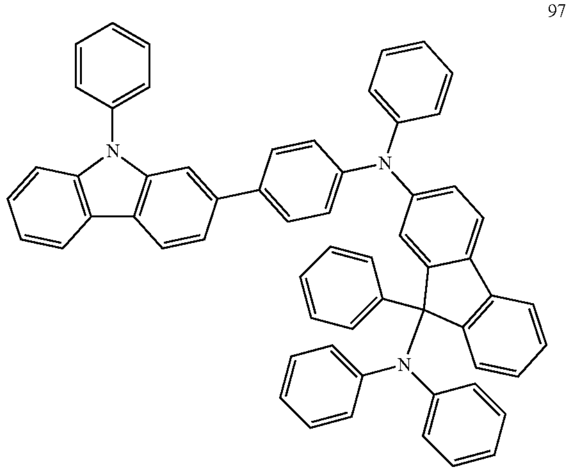
98
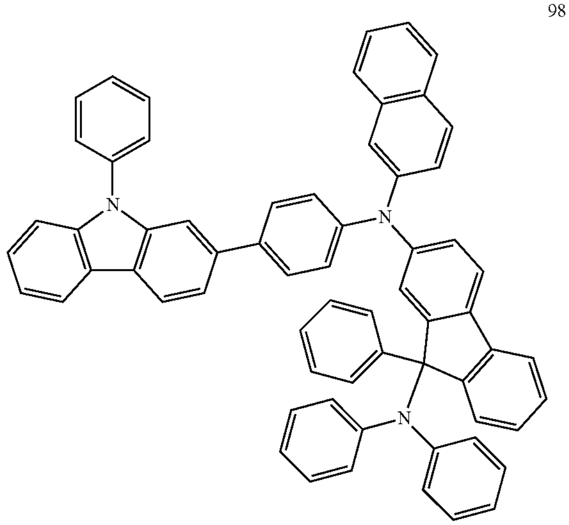
99
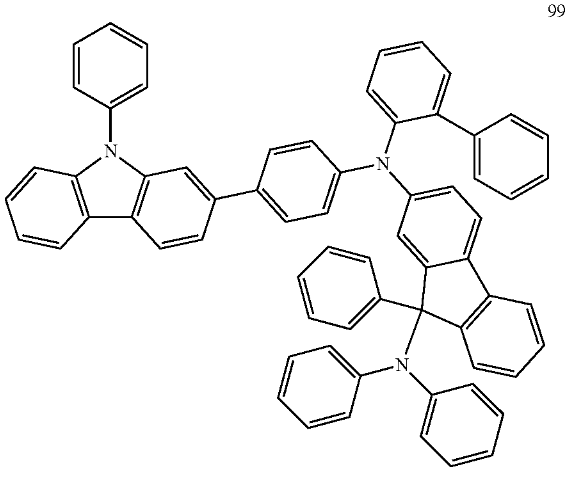
-continued
100
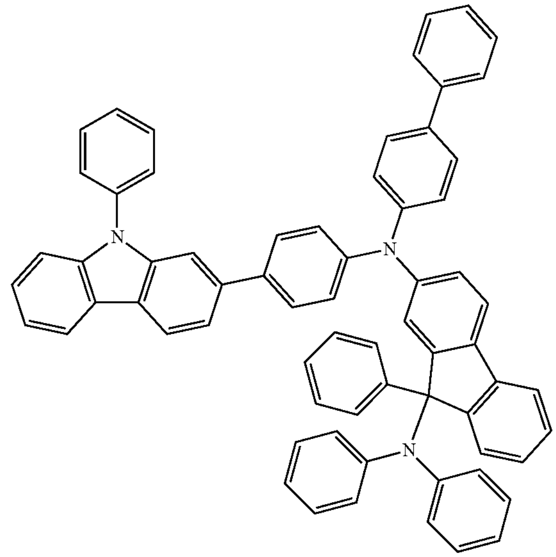
101
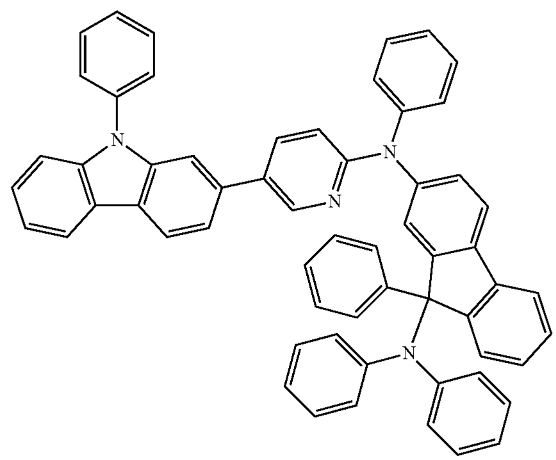
102
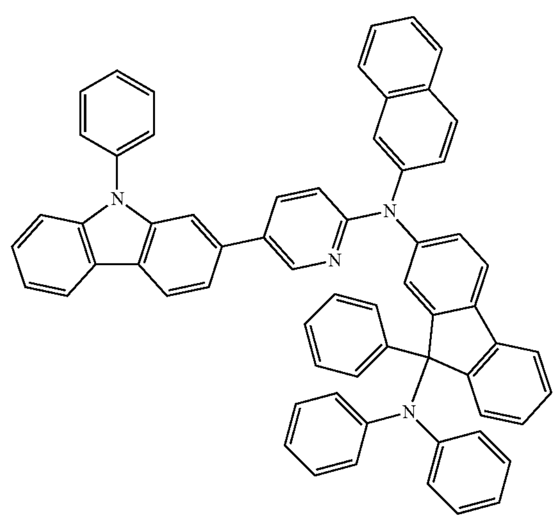

-continued

103

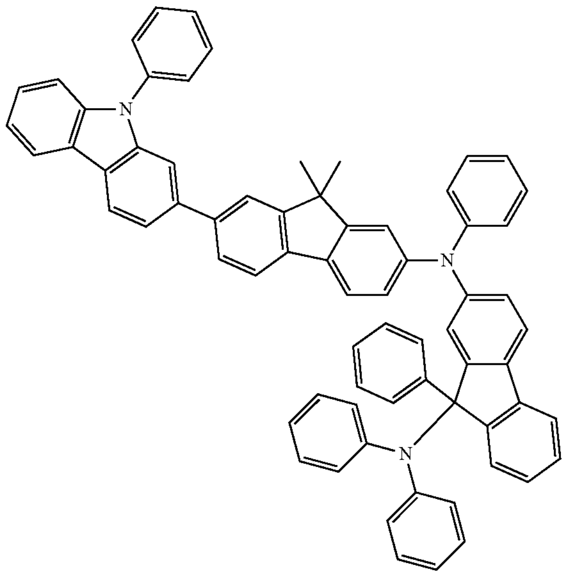

104

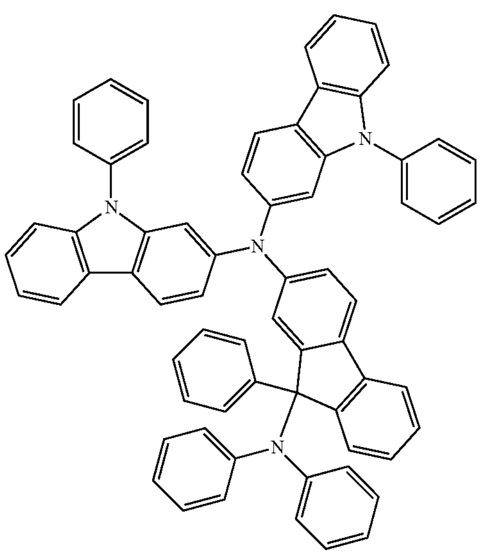

-continued

105

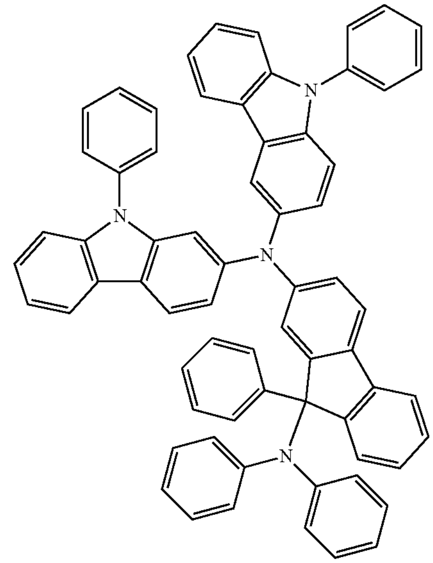

10. A display device comprising:

a base layer;

a circuit layer disposed on the base layer; and a display element layer disposed on the circuit layer, and including a light-emitting element, wherein the light emitting element includes:

a first electrode;

a second electrode facing the first electrode; and at least one functional layer disposed between the first electrode and the second electrode, and the at least one functional layer includes an amine compound represented by Formula 1:

[Formula 1]

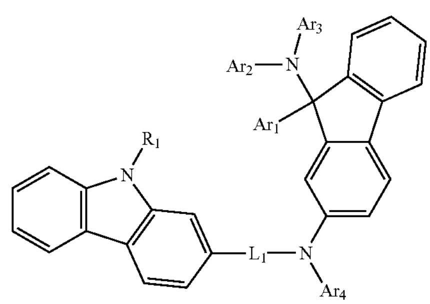

wherein in Formula 1, $L_1$ is a direct linkage, a substituted or unsubstituted arylene group having 6 to 30 ring-forming carbon atoms, or a substituted or unsubstituted heteroarylene group having 2 to 30 ring-forming carbon atoms, $R_1$ is a substituted or unsubstituted aryl group having 6 to 30 ring-forming carbon atoms, and $Ar_1$ to $Ar_4$ are each independently a substituted or unsubstituted aryl group having 6 to 30 ring-forming carbon atoms, or a substituted or unsubstituted heteroaryl group having 2 to 30 ring-forming carbon atoms.

11. The display device of claim 10, further comprising a light control layer disposed on the display element layer, and including a quantum dot.

* * * * *